(12) United States Patent
Gu et al.

(10) Patent No.: US 9,980,397 B2
(45) Date of Patent: May 22, 2018

(54) DISPLAY DEVICE

(71) Applicant: LG ELECTRONICS INC., Seoul (KR)

(72) Inventors: Youhoe Gu, Seoul (KR); Mansuk Lee, Seoul (KR); Namhun Kim, Seoul (KR); Jaehong Park, Seoul (KR); Jihoon Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days. days.

(21) Appl. No.: 15/237,757

(22) Filed: Aug. 16, 2016

(65) Prior Publication Data

US 2017/0181295 A1    Jun. 22, 2017

(30) Foreign Application Priority Data

Dec. 17, 2015  (KR) .......................... 10-2015-0181144
Dec. 17, 2015  (KR) .......................... 10-2015-0181151
Feb. 25, 2016  (KR) .......................... 10-2016-0022416

(51) Int. Cl.
*H05K 5/00* (2006.01)
*F16M 11/08* (2006.01)
(Continued)

(52) U.S. Cl.
CPC ............ *H05K 5/0017* (2013.01); *F16C 11/00* (2013.01); *F16M 11/08* (2013.01); *F16M 11/18* (2013.01); *F16M 13/027* (2013.01); *G02F 1/13452* (2013.01); *G02F 1/133308* (2013.01); *H05K 5/0026* (2013.01); *F16M 2200/065* (2013.01); *G02F 2001/133314* (2013.01); *G02F 2001/133342* (2013.01); *G06F 3/147* (2013.01); *G06F 3/1438* (2013.01); *G09G 5/003* (2013.01); *G09G 5/10* (2013.01); *G09G 2310/08* (2013.01); *G09G 2320/0626* (2013.01); *G09G 2320/0666* (2013.01)

(58) Field of Classification Search
CPC .......................... H05K 5/0017–5/0026; H05K 5/0039–5/0043; H05K 5/006; G02F 1/133308; G02F 2001/133314–2001/133322
See application file for complete search history.

(56) References Cited

U.S. PATENT DOCUMENTS

2007/0126654 A1  6/2007  Choi et al.
2013/0170115 A1  7/2013  Jung et al.
(Continued)

OTHER PUBLICATIONS

European Search Report dated May 10, 2017 issued in Application No. 16178019.2.

*Primary Examiner* — Hoa C Nguyen
(74) *Attorney, Agent, or Firm* — KED & Associates, LLP

(57) ABSTRACT

A display device includes a first display panel, a second display panel opposite the first display panel, a frame positioned between the first display panel and the second display panel, a first opening formed on the frame and positioned on a lower back side of the first display panel, a second opening formed on the frame and positioned on an upper back side of the second display panel, a first printed circuit board (PCB) electrically connected to the first display panel and positioned in the first opening, and a second PCB electrically connected to the second display panel and positioned in the second opening.

18 Claims, 60 Drawing Sheets

(51) Int. Cl.
*F16M 11/18* (2006.01)
*F16M 13/02* (2006.01)
*F16C 11/00* (2006.01)
*G02F 1/1333* (2006.01)
*G02F 1/1345* (2006.01)
*G06F 3/14* (2006.01)
*G06F 3/147* (2006.01)
*G09G 5/00* (2006.01)
*G09G 5/10* (2006.01)

(56) References Cited

U.S. PATENT DOCUMENTS

| | | | |
|---|---|---|---|
| 2013/0258246 A1* | 10/2013 | Kim | G02F 1/133308 349/62 |
| 2014/0313424 A1* | 10/2014 | Imajo | G02B 6/0011 348/790 |
| 2015/0253611 A1 | 9/2015 | Yang et al. | |
| 2016/0381813 A1 | 12/2016 | Jeon et al. | |

* cited by examiner

DISPLAY DEVICE

CROSS-REFERENCE TO RELATED APPLICATION

This application claims priority under 35 U.S.C. § 119 and 35 U.S.C. § 365 to Korean Patent Application Nos. 10-2015-0181151 filed in Korea on Dec. 17, 2015, 10-2015-0181144 filed in Korea on Dec. 17, 2015, and 10-2016-0022416 filed in Korea on Feb. 25, 2016, whose entire disclosures are hereby incorporated by reference in their entireties.

BACKGROUND

1. Field

The present disclosure relates to a display device having a slim profile and rigidity.

2. Background

With the development of the information society, various demands for display devices have been increasing. Various display devices, such as liquid crystal displays (LCDs), plasma display panels (PDPs), electroluminescent displays (ELDs), vacuum fluorescent displays (VFDs), and organic light emitting diode (OLED) displays, have been recently studied and used to meet various demands for the display devices.

An OLED display panel may display an image by depositing an organic material layer capable of emitting light on a substrate, at which transparent electrodes may be formed. The OLED display panel may be thin and flexible. Many studies on structural characteristics of display devices including the OLED display panel have been carried out.

BRIEF DESCRIPTION OF THE DRAWINGS

Embodiments will be described in detail with reference to the following drawings in which like reference numerals refer to like elements and wherein.

DETAILED DESCRIPTION

Figure 1:
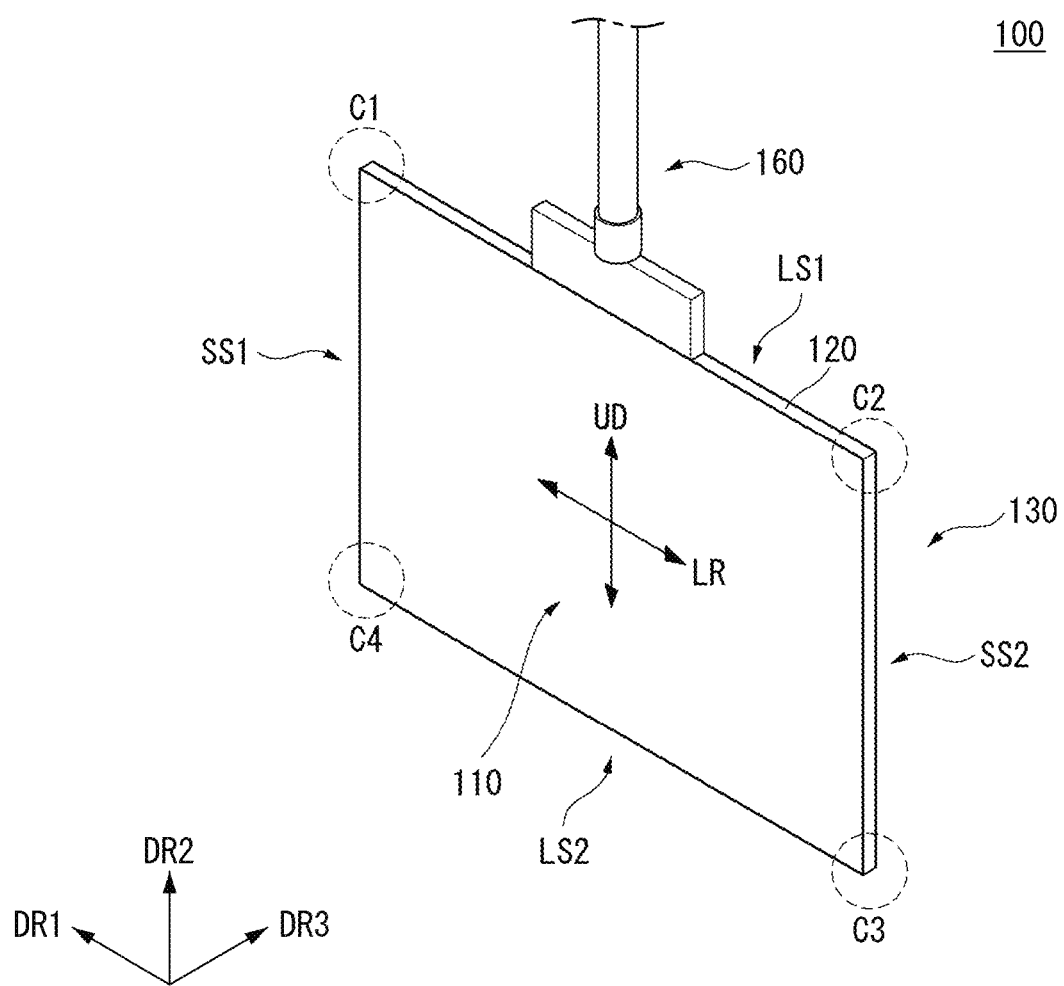
FIG. 1 illustrates an example of a double-sided display device according to an embodiment.

Referring to FIG. 1, one display panel 110 may be observed at the front of a display device 100. Another display panel 130 may be observed in the rear of the display device 100. Namely, a plurality of display panels may be provided at a front surface and a back surface of the display device 100. The display device 100 may simultaneously display the same image on its both surfaces. The display device 100 may also display different images on the front surface and the back surface. In the embodiment disclosed herein, the display panel 110 may be referred to as a first display panel 110, and the display panel 130 may be referred to as a second display panel 130.

The display device 100 may be mounted on a ceiling or a wall. When the display device 100 is mounted on the ceiling, the display device 100 may hang from the ceiling. Namely, the display device 100 may hang from the ceiling using a connector 160.

Figure 2:
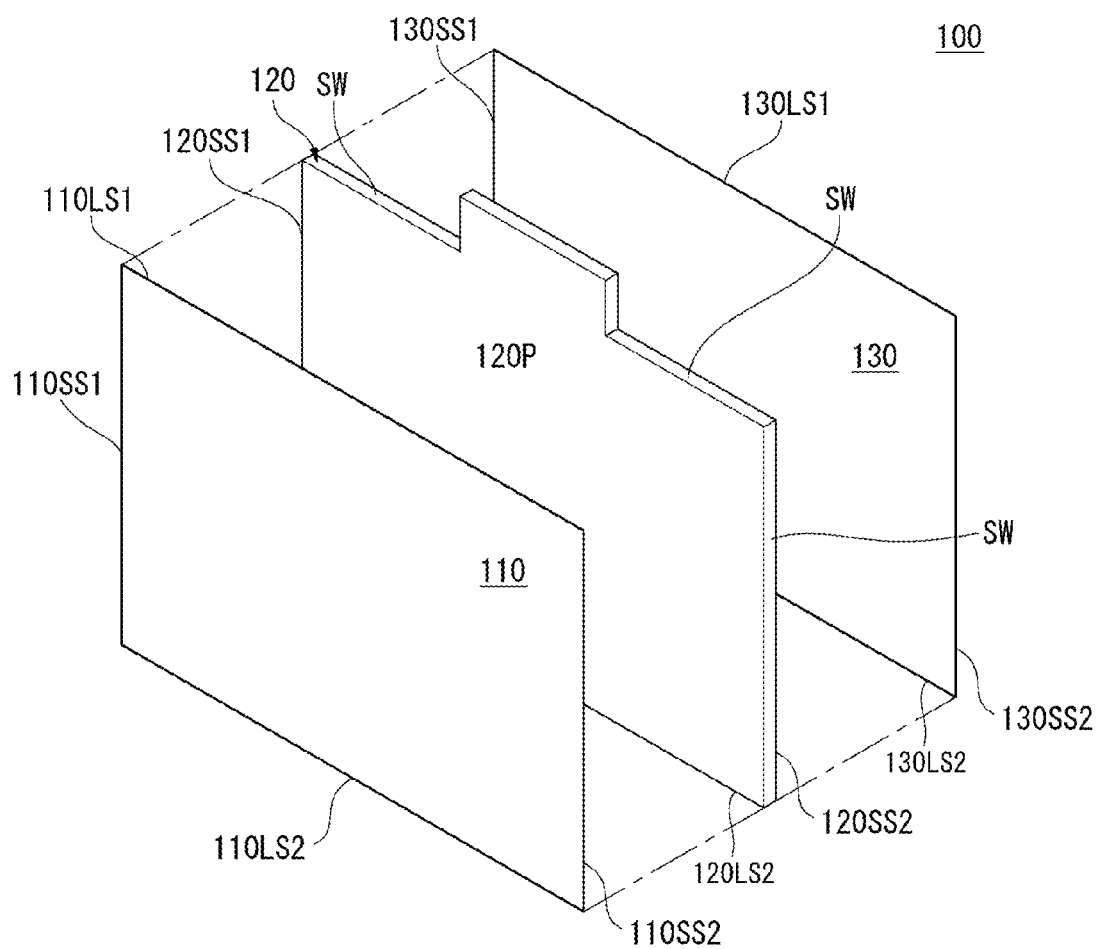
FIG. 2 illustrates an example of a configuration of a double-sided display device according to an embodiment.

Referring to FIG. 2, one surface of the first display panel 110 may be observed at the front of the display device 100. The one surface of the first display panel 110 may display an image. The first display panel 110 may be divided into an active area, on which the image is displayed, and an inactive area, on which the image is not displayed. A bezel may be positioned at an edge of the first display panel 110 and may include the inactive area.

One surface of the second display panel 130 may be observed in the rear of the display device 100. The one surface of the second display panel 130 may display an image. The second display panel 130 may be divided into an active area, on which the image is displayed, and an inactive area, on which the image is not displayed. A bezel may be positioned at an edge of the second display panel 130 and may include the inactive area.

A frame 120 may be positioned between the first display panel 110 and the second display panel 130. The first display panel 110 may be positioned at a front surface of the frame 120, and the second display panel 130 may be positioned at a back surface of the frame 120. The frame 120 may support the first display panel 110 and the second display panel 130. The frame 120 may be formed of a metal material. The frame 120 may be a slim metal or an ultra slim metal. The frame 120 may be referred to as a module cover. Alternatively, the frame 120 may be referred to as a center frame. Alternatively, the frame 120 may be referred to as a supporter.

The frame 120 may include a plate portion 120P and a side wall SW. The plate portion 120P may be formed of a metal material and may be a slim metal or an ultra slim metal. The side wall SW may be positioned at an edge of the plate portion 120P. The plate portion 120P and the side wall SW may be one body. The side wall SW may be formed separately from the plate portion 120P and may be coupled with the plate portion 120P. The side wall SW may have a thickness greater than the plate portion 120P, or the same thickness as the plate portion 120P. The frame 120 may include the plate portion 120P and the side wall SW through pressing. An area of the plate portion 120P may correspond to an area of the first display panel 110 or an area of the second display panel 130. The side wall SW may be positioned on a first long side 120LS1, a second long side 120LS2, a first short side 120SS1, or a second short side 120SS2 of the frame 120.

The side wall SW may be a side cover. The side cover may be positioned on the side of the frame 120. The side cover may be coupled with the side of the frame 120. The side cover may protect the display panels 110 and 130. The side cover may be referred to as a middle cabinet.

The first display panel 110 may be positioned on a front surface of the plate portion 120P and may be flexible. As the first display panel 110 is positioned on the front surface of the plate portion 120P, the frame 120 may provide a predetermined rigidity for the first display panel 110.

The second display panel 130 may be positioned on a back surface of the plate portion 120P and may be flexible. As the second display panel 130 is positioned on the back surface of the plate portion 120P, the frame 120 may provide a predetermined rigidity for the second display panel 130.

A length of a first long side 110LS1 of the first display panel 110 may be slightly shorter than a length of the first long side 120LS1 of the frame 120. A length of a first short side 110SS1 of the first display panel 110 may be slightly shorter than a length of the first short side 120SS1 of the frame 120. The first display panel 110 may be attached to the plate portion 120P or inserted into the frame 120. The first display panel 110 may be coupled with the plate portion 120P through a magnetic force.

A length of a first long side 130LS1 of the second display panel 130 may be slightly shorter than the length of the first long side 120LS1 of the frame 120. A length of a first short side 130SS1 of the second display panel 130 may be slightly shorter than the length of the first short side 120SS1 of the frame 120. The second display panel 130 may be attached to the plate portion 120P or inserted into the frame 120. The second display panel 130 may be coupled with the plate portion 120P through a magnetic force.

The first display panel 110 may be provided at a front surface of the display device 100 and may display an image. The first display panel 110 may divide the image into a plurality of pixels and may output the image while controlling color, brightness, and chroma of each pixel. The first display panel 110 may be divided into the active area, on which the image is displayed, and the inactive area, on which the image is not displayed. The first display panel 110 may generate light corresponding to red, green, or blue color in response to a control signal.

The second display panel 130 may be provided at a back surface of the display device 100 and may display an image. The second display panel 130 may divide the image into a plurality of pixels and may output the image while controlling color, brightness, and chroma of each pixel. The second display panel 130 may be divided into the active area, on which the image is displayed, and the inactive area, on which the image is not displayed. The second display panel 130 may generate light corresponding to red, green, or blue color in response to a control signal.

Figure 3:
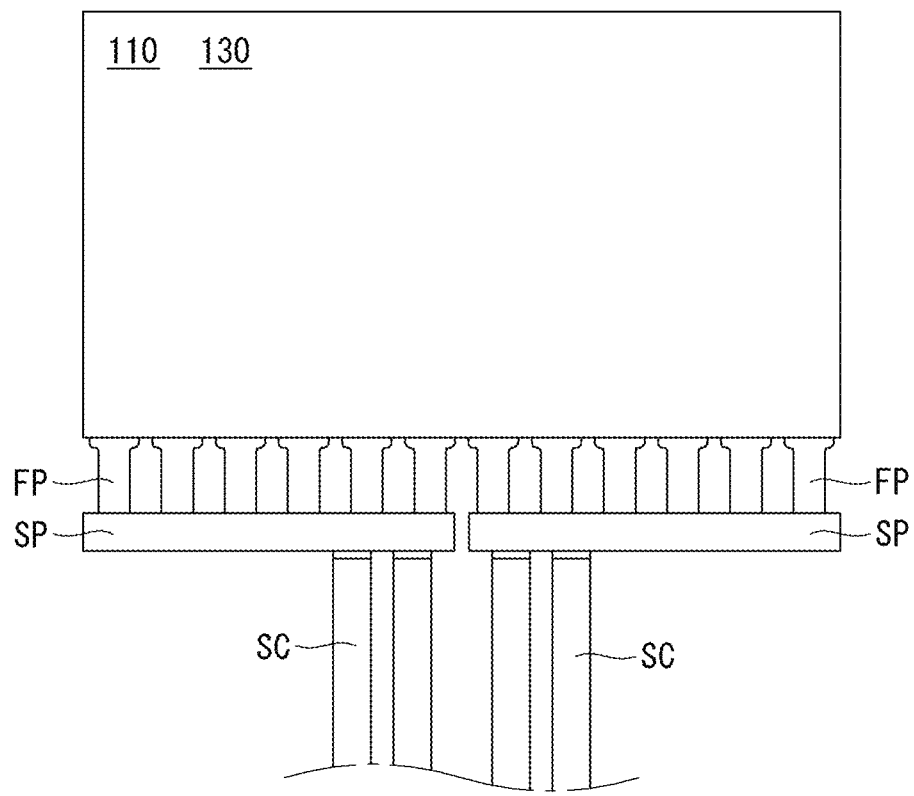
FIG. 3 illustrates an example of a display panel according to an embodiment.

FIG. 3 illustrates an example of a display panel according to an embodiment of the invention. More specifically, FIG. 3 illustrates the first display panel 110 as an example of the display panel. However, a description of FIG. 3 may be equally applied to the second display panel 130.

Referring to FIG. 3, the first display panel 110 may include a flexible printed circuit board (FPCB) FP. The FPCB FP may be provided on one side of the first display panel 110. The FPCB FP may be electrically connected to the first display panel 110. The FPCB FP may supply an electric current to the first display panel 110. The pixels of the first display panel 110 may be controlled by the electric current supplied by the FPCB FP. The FPCB FP may include a plurality of FPCBs FP. The plurality of FPCBs FP may be positioned on one side of the first display panel 110. The FPCB FP may be a wire.

The first display panel 110 may include a cable SC. The cable SC may be electrically connected to the first display panel 110. The cable SC may supply the electric current to the first display panel 110. The cable SC may supply an electric signal controlling the pixels of the first display panel 110 to the first display panel 110. The cable SC may be electrically connected to the FPCB FP.

The first display panel 110 may include a printed circuit board (PCB) SP. The PCB SP may be electrically connected to the plurality of FPCBs FP, and at the same time may be electrically connected to the cable SC. A size of the PCB SP may be relatively larger than a size of the FPCB FP and/or a size of the cable SC. Namely, the PCB SP may occupy a predetermined volume at one side of the first display panel 110. The PCB SP may be a source PCB.

Figure 4:
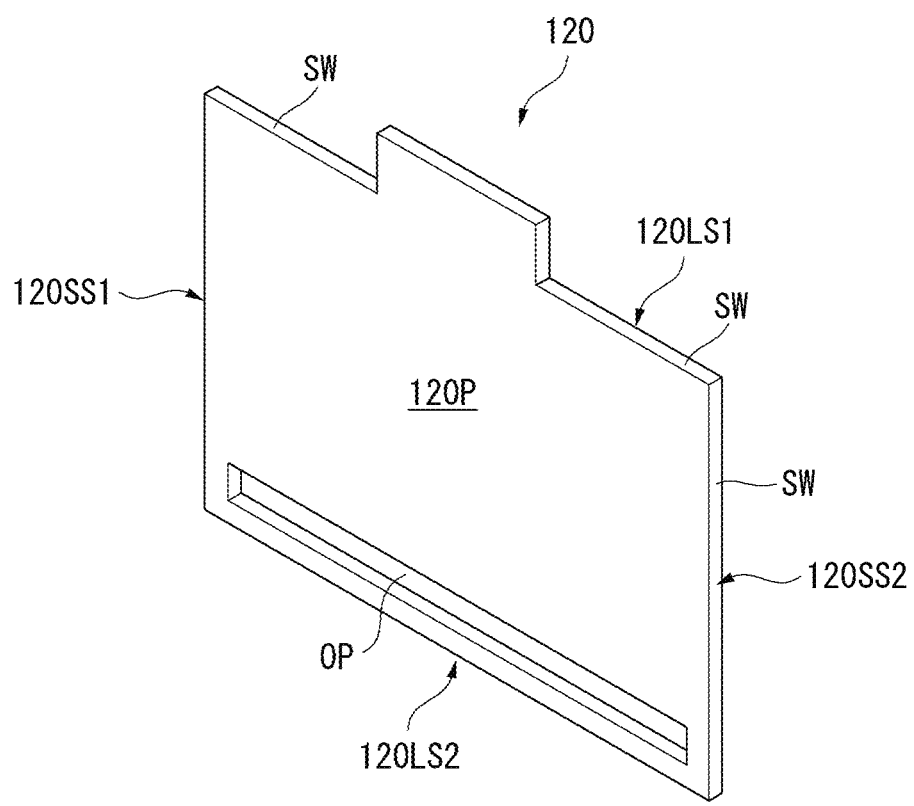
FIGS. 4 to 7 illustrate examples of a frame according to an embodiment.

Referring to FIG. 4, the frame 120 may include an opening OP. The opening OP may be formed on a portion of the frame 120. The opening OP may be formed on a lower part of the frame 120. The opening OP may be formed to elongate along the second long side 120LS2 of the frame 120 at the lower part of the frame 120. The opening OP may be adjacent to the second long side 120LS2. The opening OP may be separated from the second long side 120LS2 by a predetermined distance. Namely, the opening OP may be formed to elongate along the second long side 120LS2 while being adjacent to the second long side 120LS2 at the lower part of the frame 120. The opening OP may be formed by penetrating the frame 120 and may be formed as a groove of the frame 120.

Figure 5:
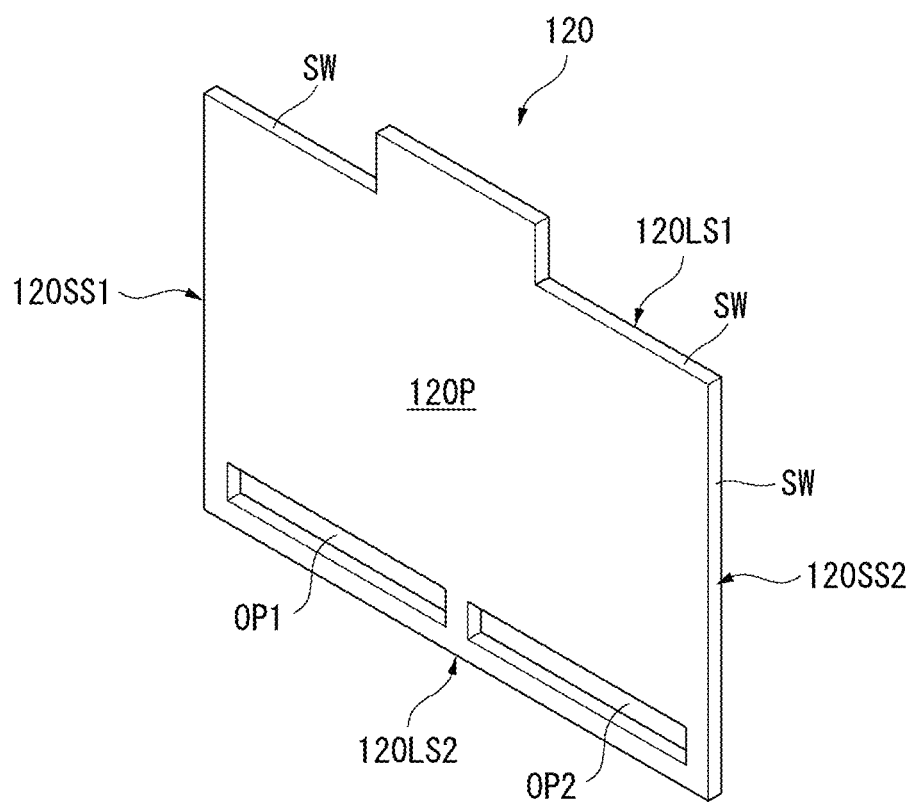

Referring to FIG. 5, the opening OP may include a plurality of openings OP. The plurality of openings OP may include a first opening OP1 and a second opening OP2. The first opening OP1 may be formed on the lower part of the frame 120. The first opening OP1 may be positioned adjacent to the second long side 120LS2 of the frame 120. The first opening OP1 may be separated from the second long side 120LS2 by a predetermined distance. The first opening OP1 may elongate along the second long side 120LS2.

The second opening OP2 may be formed in series to the first opening OP1. In other words, the second opening OP2 may be formed adjacent to the first opening OP1 and subsequent to the first opening OP1 while being adjacent to the second long side 120LS2 at the lower part of the frame 120. The second opening OP2 may be formed adjacent to the second long side 120LS2 and the first opening OP1. In other words, the first opening OP1 and the second opening OP2 may be sequentially formed while elongating along the second long side 120LS2 adjacent to the second long side 120LS2.

Figure 6:
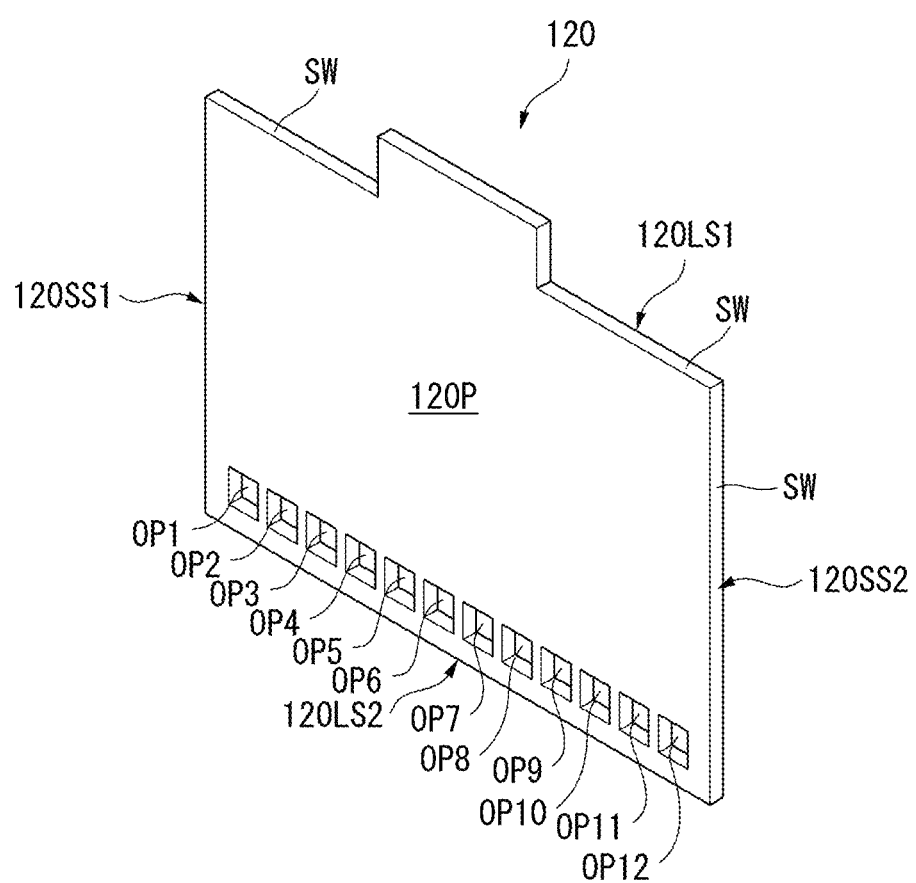

Referring to FIG. 6, the opening OP may be a plurality of openings OP. For example, the plurality of openings OP may include first to twelfth openings OP1 to OP12. The number of openings OP may correspond to the number of FPCBs FP described above. When the plurality of PCBs SP is electrically connected to the plurality of FPCBs FP, respectively, the number of openings OP may correspond to the number of PCBs SP.

Figure 7:
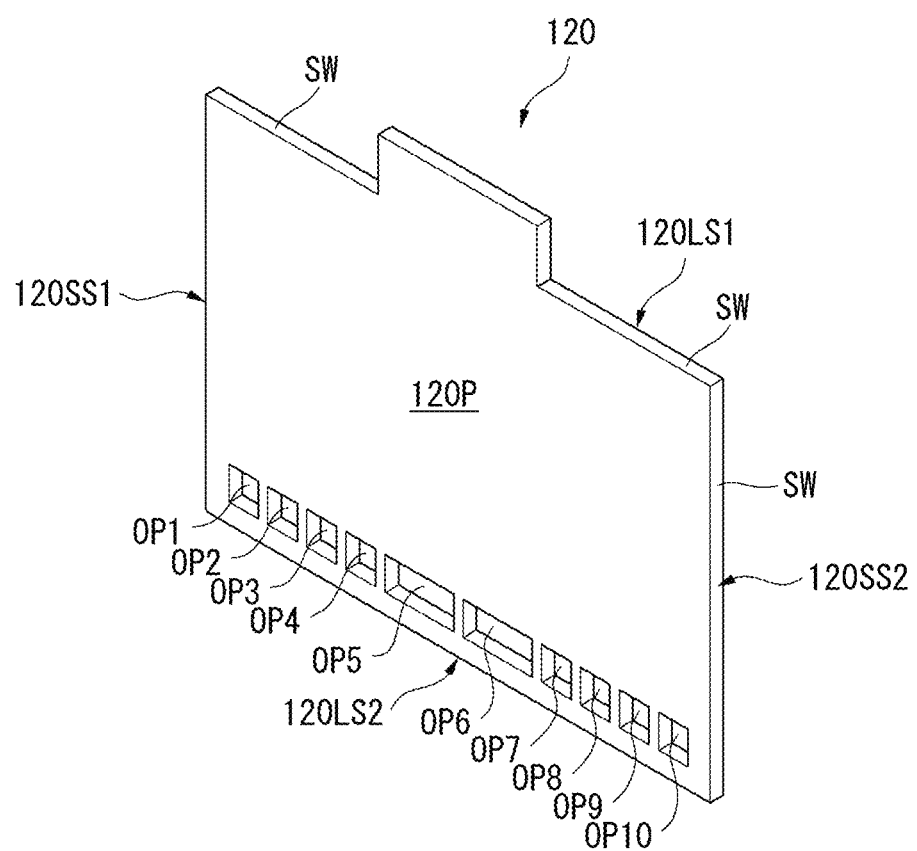

Referring to FIG. 7, an opening OP may be a plurality of openings OP. For example, the plurality of openings OP may include first to tenth openings OP1 to OP10. The number of openings OP may correspond to the number of FPCBs FP described above. When the plurality of PCBs SP is electrically connected to the plurality of FPCBs FP, respectively, the number of openings OP may correspond to the number of PCBs SP.

Some of the plurality of openings OP may be formed as extended openings OP5 and OP6. The extension of the openings OP5 and OP6 may depend on the number or a connecting method of the FPCBs FP and the number or a connecting method of the PCBs SP disclosed above. For example, the extended openings OP5 and OP6 may have a combined size of two openings OP1 and OP2.

Figure 8:
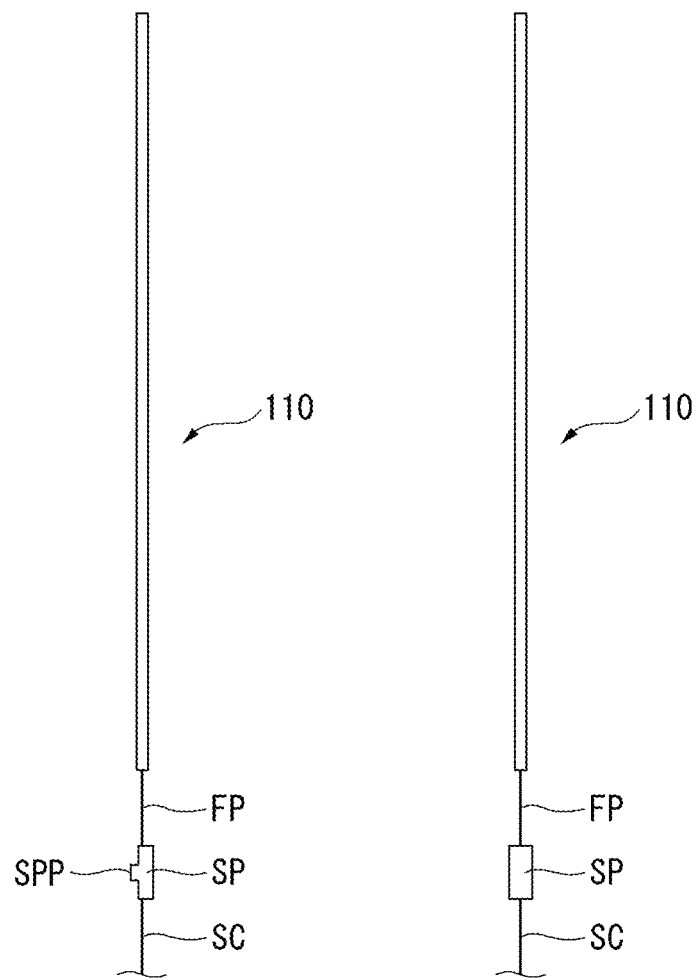
FIGS. 8 to 10 illustrate examples of a cross section of a display panel and a frame according to an embodiment.

Referring to FIG. 8, the first display panel 110 may be connected to the FPCB FP. One side of the FPCB FP may be connected to the first display panel 110, and the other side may be connected to the PCB SP. One side of the PCB SP may be connected to the FPCB FP, and the other side may be connected to the cable SC. The PCB SP may be thicker than the first display panel 110. The PCB SP may have the largest thickness among the components described above. The PCB SP may include a protrusion SPP depending on a configuration of an electronic element. The thickness of the PCB SP may vary depending on a type, an arrangement, or a shape of the electronic element mounted on the PCB SP.

When the PCB SP, which can be connected to the first display panel 110, is positioned on one side or one side surface of the first display panel 110, the size of the bezel of the display device 100 may increase due to the thickness of the PCB SP. When the PCB SP, which can be connected to the first display panel 110, is positioned on the back surface or in the rear of the first display panel 110, the entire thickness of the display device 100 may increase due to the thickness of the PCB SP.

Figure 9:
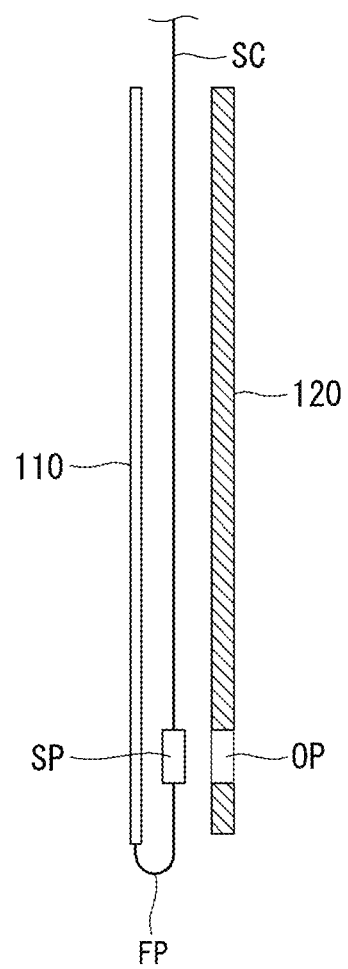

Referring to FIG. 9, the first display panel 110 may be positioned at the front or the front surface of the frame 120. The FPCB FP may bend from one side of the first display panel 110 to the back surface or the rear of the first display panel 110. The FPCB FP may bend from one side of the first display panel 110 and enter between the first display panel 110 and the frame 120.

The PCB SP may be positioned between the first display panel 110 and the frame 120. The PCB SP may be connected to the FPCB FP and positioned on the back surface or in the rear of the first display panel 110. The PCB SP may be positioned on the front surface or in front of the frame 120. The PCB SP may be positioned in the opening OP of the frame 120. The PCB SP may be inserted into the opening OP of the frame 120. As the PCB SP is positioned in the opening OP, the entire thickness of the first display panel 110 and the frame 120 may not be changed or may be very slightly changed.

The cable SC may be positioned between the first display panel 110 and the frame 120. The cable SC may extend from the PCB SP toward an upper part or an upper side of the frame 120. The cable SC may be inserted between the first display panel 110 and the frame 120. The cable SC may be a flat cable or a low voltage differential signaling (LVDS) cable.

Figure 10:
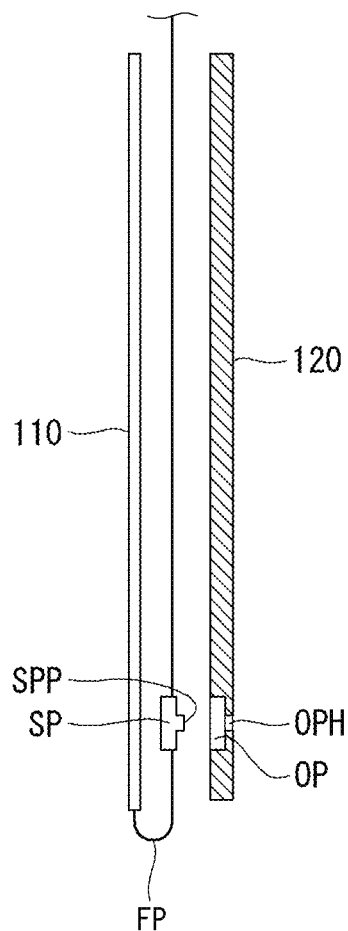

Referring to FIG. 10, the PCB SP may include the protrusion SPP. The opening OP of the frame 120 may include a groove OPH, into which the protrusion SPP may be inserted. The opening OP may have various shapes based on a shape of the PCB SP without exceeding the thickness of the frame 120. The opening OP may be formed by penetrating the frame 120. Further, the opening OP may be formed as a groove by depressing the frame 120. When the opening OP is formed as the groove, the opening OP of the frame 120 may be formed in an intaglio shape of the PCB SP.

Figure 11:
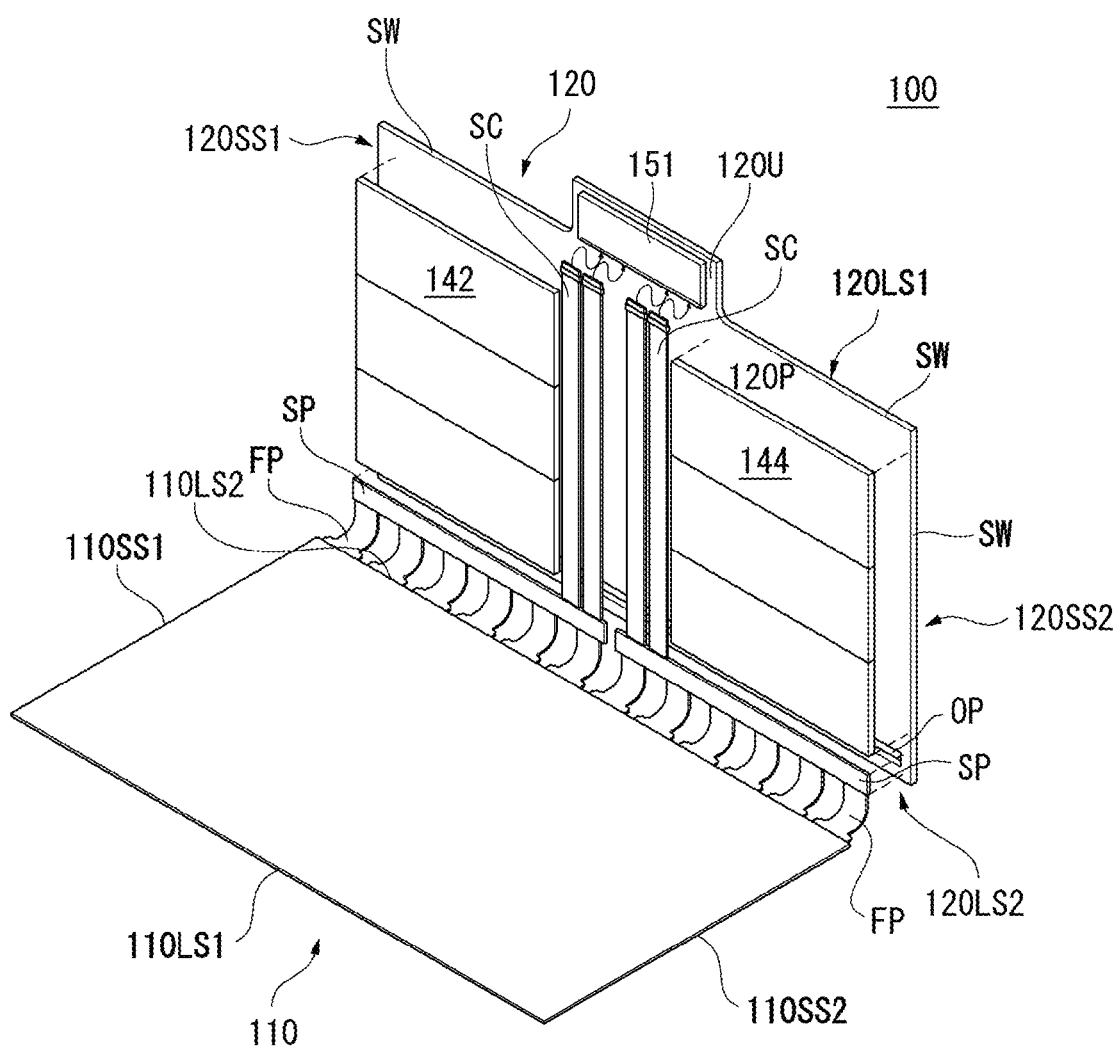
FIG. 11 illustrates an example of configuration of one surface of a display device according to an embodiment.

Referring to FIG. 11, coupling members (or "adhesive members") 142 and 144 may be positioned on the front surface of the frame 120. For example, the coupling members 142 and 144 may be adhesive tapes or magnetic bodies. The coupling member 142 may be provided on the left side of the front surface of the frame 120, and the coupling member 144 may be provided on the right side of the front surface of the frame 120. An empty space may be formed between the coupling members 142 and 144. The empty space may be thin.

The first display panel 110 may be positioned on front surfaces of the coupling members 142 and 144. The front surfaces of the coupling members 142 and 144 may contact the first display panel 110, and back surfaces of the coupling members 142 and 144 may contact the frame 120. The first display panel 110 may be fixed to the frame 120 by the coupling members 142 and 144. The FPCB FP may be positioned on the lower part of the first display panel 110. The PCB SP may be connected to the FPCB FP and positioned in the opening OP of the frame 120. The PCB SP may be inserted into the inside of the opening OP of the frame 120.

The cable SC may be positioned on the front surface of the frame 120. The cable SC may be positioned between the coupling members 142 and 144. The cable SC may be positioned between the frame 120 and the first display panel 110. The cable SC may be positioned in an empty space or a gap between the first display panel 110 and the frame 120 and between the coupling members 142 and 144. Hence, a thickness of the display device 100 may be partially determined by thicknesses of the first display panel 110, the coupling members 142 and 144, and the frame 120. When the side of the first display panel 110 and the sides of the coupling members 142 and 144 are covered by the side wall SW of the frame 120, the thickness of the display device 100 may be partially determined by a thickness of the side wall SW. The thickness of the display device 100 may not be affected by the FPCB FP, the PCB SP, or the cable SC, or may be only slightly affected by them.

The frame 120 may include an upper frame 120U. The upper frame 120U may protrude from the upper side of the frame 120 to the outside. A first controller 151 may be installed on the upper frame 120U. For example, the first controller 151 may be a timing control unit (or a timing control board) or a bridge unit (or a bridge board). The cable SC may be electrically connected to the first controller 151. The first controller 151 may control the first display panel 110.

Figure 12:
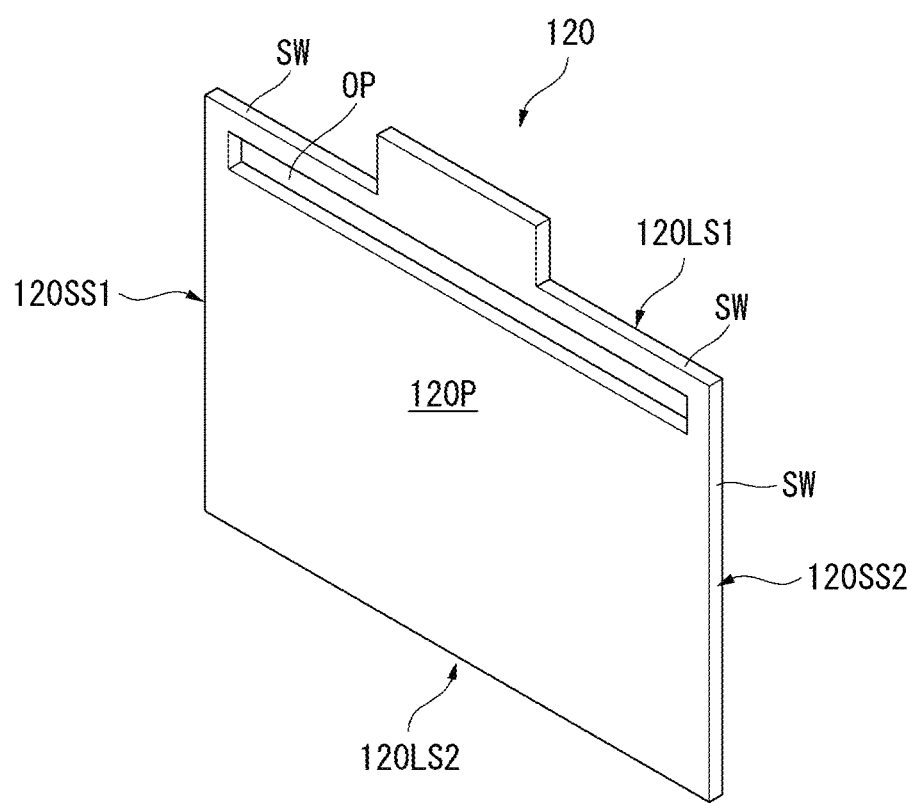
FIGS. 12 to 15 illustrate other examples of a frame according to an embodiment.

Referring to FIG. 12, the frame 120 may include an opening OP. The opening OP may be formed on a portion of the frame 120. The opening OP may be formed on an upper part of the frame 120. The opening OP may be formed to elongate along the first long side 120LS1 of the frame 120 at the upper part of the frame 120. The opening OP may be adjacent to the first long side 120LS1. The opening OP may be separated from the first long side 120LS1 by a predetermined distance. The opening OP may be formed to elongate along the first long side 120LS1 while being adjacent to the first long side 120LS1 at the upper part of the frame 120. The opening OP may be formed by penetrating the frame 120, and may be formed as a groove of the frame 120.

Figure 13:
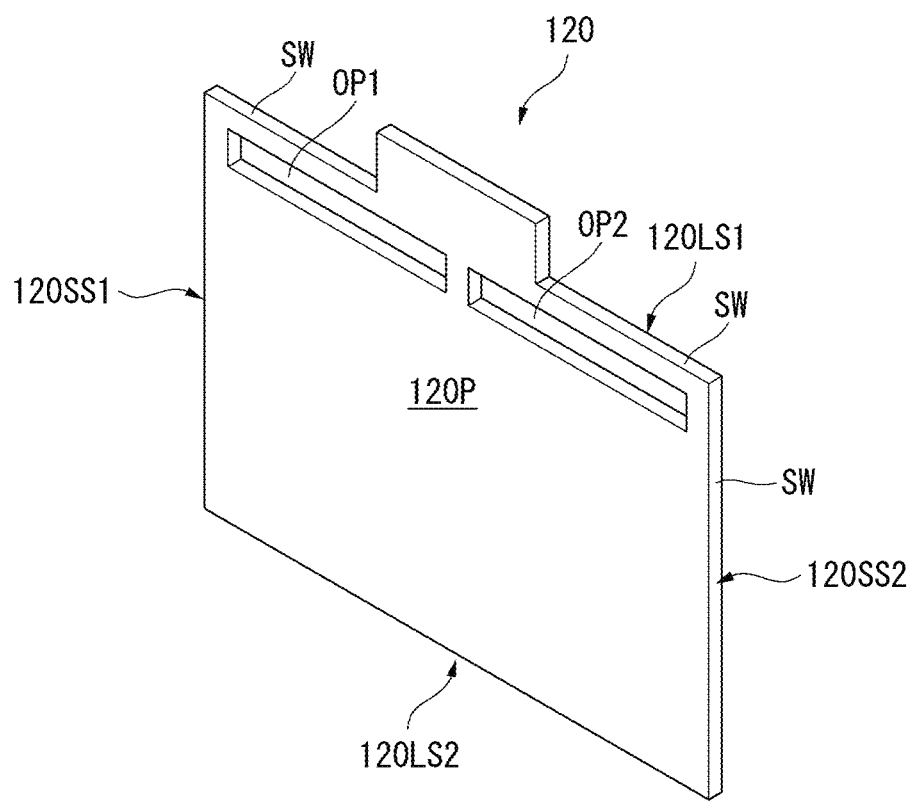

Referring to FIG. 13, the opening OP may include a plurality of openings OP. The plurality of openings OP may include a first opening OP1 and a second opening OP2. The first opening OP1 may be formed on the upper part of the frame 120. The first opening OP1 may be positioned adjacent to the first long side 120LS1 of the frame 120. The first opening OP1 may be separated from the first long side 120LS1 by a predetermined distance. The first opening OP1 may be formed to elongate along the first long side 120LS1.

The second opening OP2 may be formed in series to the first opening OP1. In other words, the second opening OP2 may be formed adjacent to the first opening OP1 and subsequent to the first opening OP1 while being adjacent to the first long side 120LS1 at the upper part of the frame 120. The second opening OP2 may be formed adjacent to the first long side 120LS1 and the first opening OP1. The first opening OP1 and the second opening OP2 may be sequentially formed while elongating along the first long side 120LS1 adjacently to the first long side 120LS1.

Figure 14:
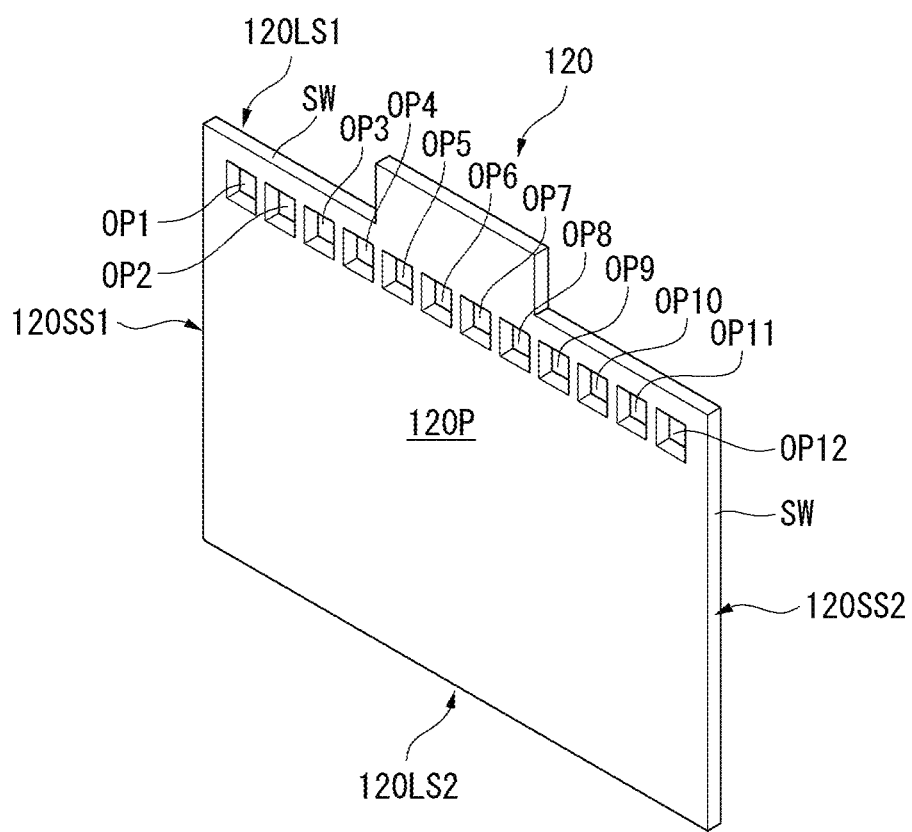

Referring to FIG. 14, the opening OP may include a plurality of openings OP. For example, the plurality of openings OP may include first to twelfth openings OP1 to OP12. The number of openings OP may correspond to the number of FPCBs FP described above. When the plurality of PCBs SP is electrically connected to the plurality of FPCBs FP, respectively, the number of openings OP may correspond to the number of PCBs SP.

Figure 15:
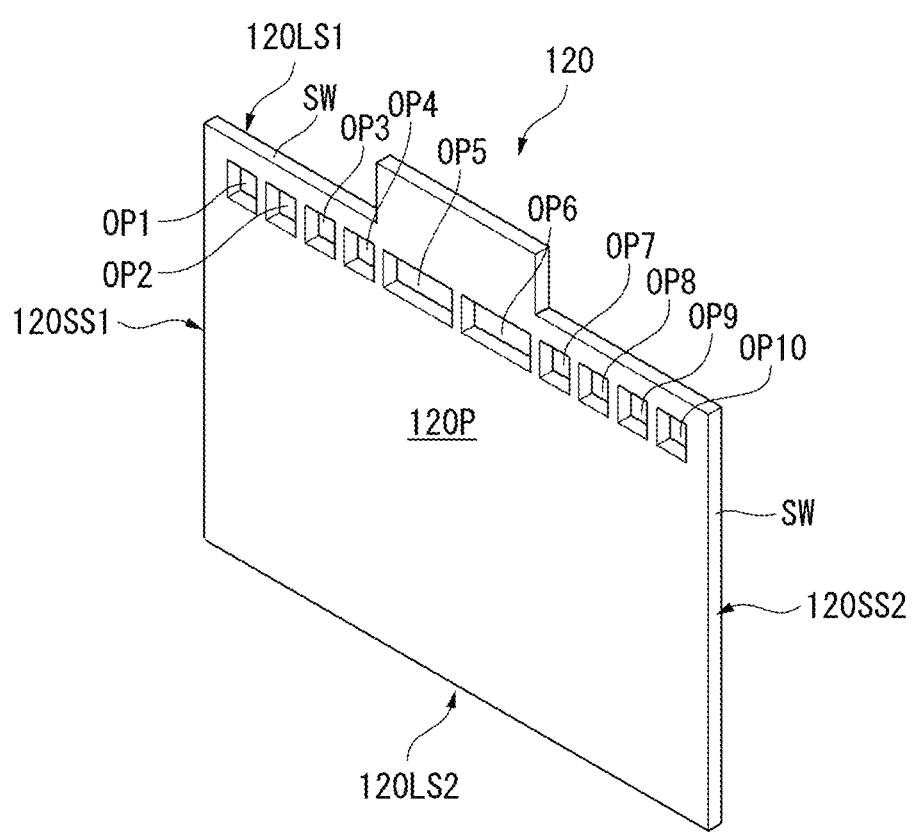

Referring to FIG. 15, the opening OP may include a plurality of openings OP. For example, the plurality of openings OP may include first to tenth openings OP1 to OP10. The number of openings OP may correspond to the number of FPCBs FP described above. When the plurality of PCBs SP is electrically connected to the plurality of FPCBs FP, respectively, the number of openings OP may correspond to the number of PCBs SP.

Some of the plurality of openings OP may be formed as extended openings OP5 and OP6. The extension of the openings OP5 and OP6 may depend on the number or a connecting method of the FPCBs FP and the number or a connecting method of the PCBs SP disclosed above. For example, the extended openings OP5 and OP6 may have a combined size of two openings OP1 and OP2.

Figure 16:
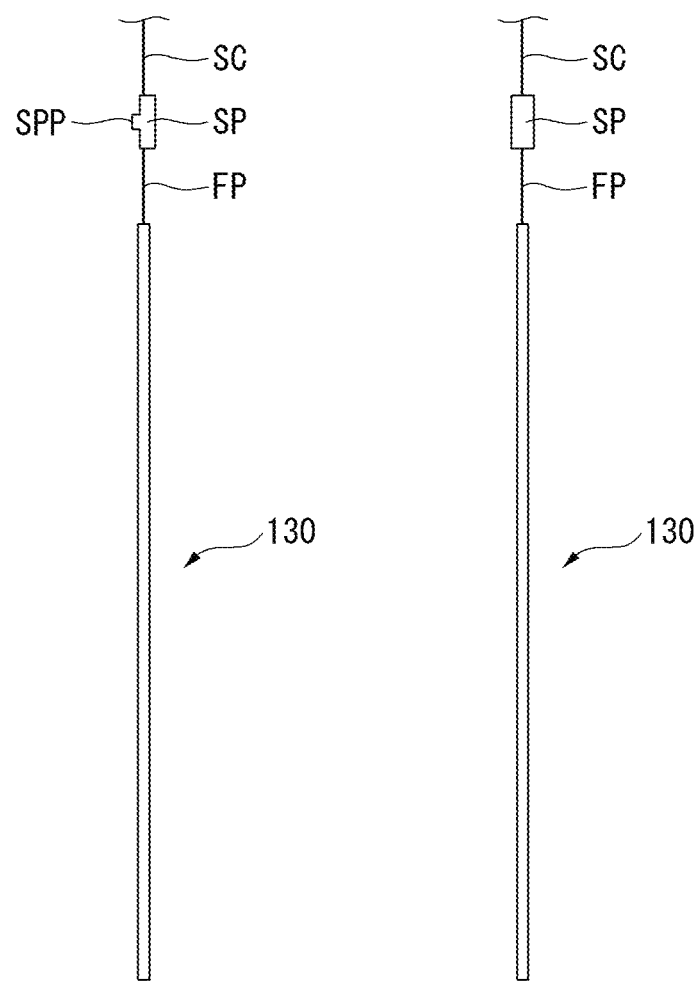
FIGS. 16 to 20 illustrate examples of a cross section of a display panel and a frame according to an embodiment.

Referring to FIG. 16, the second display panel 130 may be connected to the FPCB FP. One side of the FPCB FP may be connected to the second display panel 130, and the other side may be connected to the PCB SP. One side of the PCB SP may be connected to the FPCB FP, and the other side may be connected to the cable SC. The PCB SP may be thicker than the second display panel 130. The PCB SP may have the largest thickness among the components described above. The PCB SP may include a protrusion SPP depending on configuration of an electronic element. Namely, the thickness of the PCB SP may vary depending on a type, an arrangement, or a shape of the electronic element mounted on the PCB SP.

When the PCB SP, which can be connected to the second display panel 130, is positioned on one side or one side surface of the second display panel 130, the size of the bezel of the display device 100 may increase due to the thickness of the PCB SP. When the PCB SP, which can be connected to the second display panel 130, is positioned on the back surface or in the rear of the second display panel 130, the entire thickness of the display device 100 may increase due to the thickness of the PCB SP.

Figure 17:
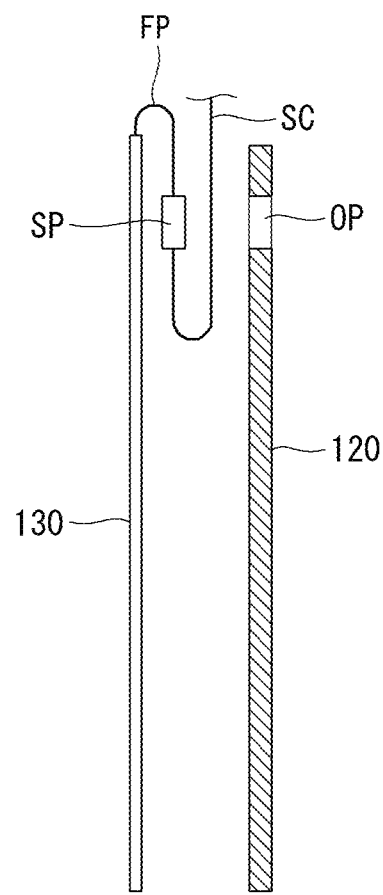

Referring to FIG. 17, the second display panel 130 may be positioned in the rear or on the back surface of the frame 120. The FPCB FP may bend from one side of the second display panel 130 to the back surface or the rear of the second display panel 130. The FPCB FP may bend from one side of the second display panel 130 and enter between the second display panel 130 and the frame 120.

The PCB SP may be positioned between the second display panel 130 and the frame 120. The PCB SP may be connected to the FPCB FP and positioned on the back surface or in the rear of the second display panel 130. The PCB SP may be positioned on the front surface or in front of the frame 120. The PCB SP may be positioned in the opening OP of the frame 120. The PCB SP may be inserted into the opening OP of the frame 120. As the PCB SP is positioned in the opening OP, the entire thickness of the second display panel 130 and the frame 120 may not be changed or may be only very slightly changed.

The cable SC may be positioned between the second display panel 130 and the frame 120. The cable SC may extend from the PCB SP toward an upper part or an upper side of the frame 120. Namely, the cable SC may be inserted between the second display panel 130 and the frame 120. For example, the cable SC may be a flat cable or a low voltage differential signaling (LVDS) cable.

Figure 18:
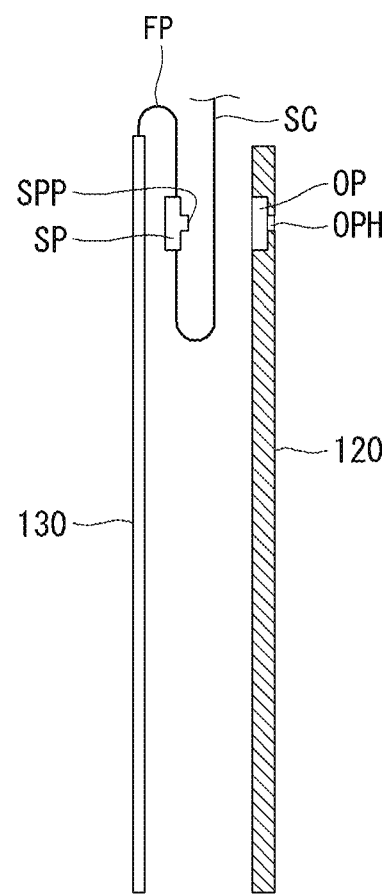

Referring to FIG. 18, the PCB SP may include the protrusion SPP. The opening OP of the frame 120 may include a groove OPH, into which the protrusion SPP can be inserted. Namely, the opening OP may have various shapes based on a shape of the PCB SP without exceeding the thickness of the frame 120. The opening OP may be formed by penetrating the frame 120. Further, the opening OP may be formed as a groove by depressing the frame 120. When the opening OP is formed as the groove, the opening OP of the frame 120 may be formed in an intaglio shape of the PCB SP.

Figure 19:
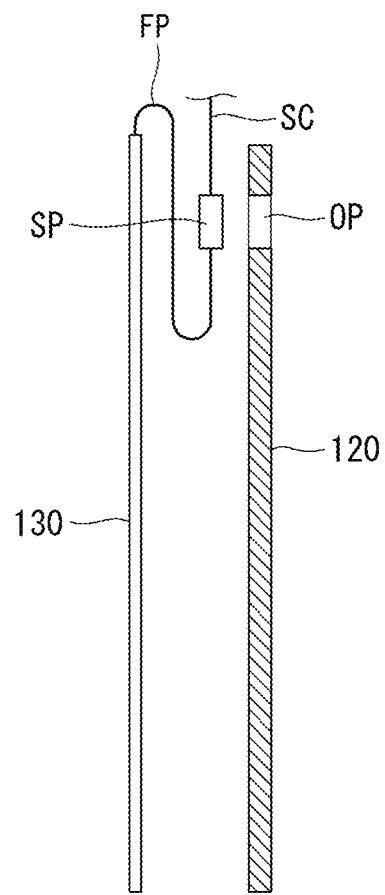
Figure 20:
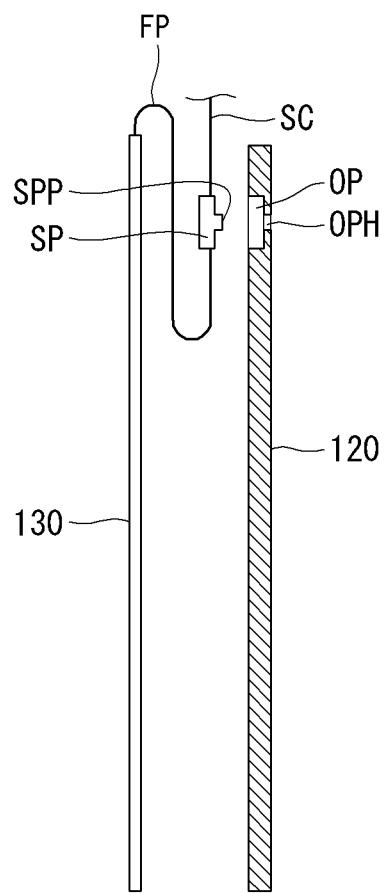

Referring to FIGS. 17 and 18, the cable SC may be placed between the frame 120 and the PCB SP. On the other hand, referring to FIGS. 19 and 20, the FPCB FP may be placed between the second display panel 130 and the PCB SP. The position of the FPCB FP or the cable SC may be changed depending on the convenience of the manufacturing process of the display device 100.

Figure 21:
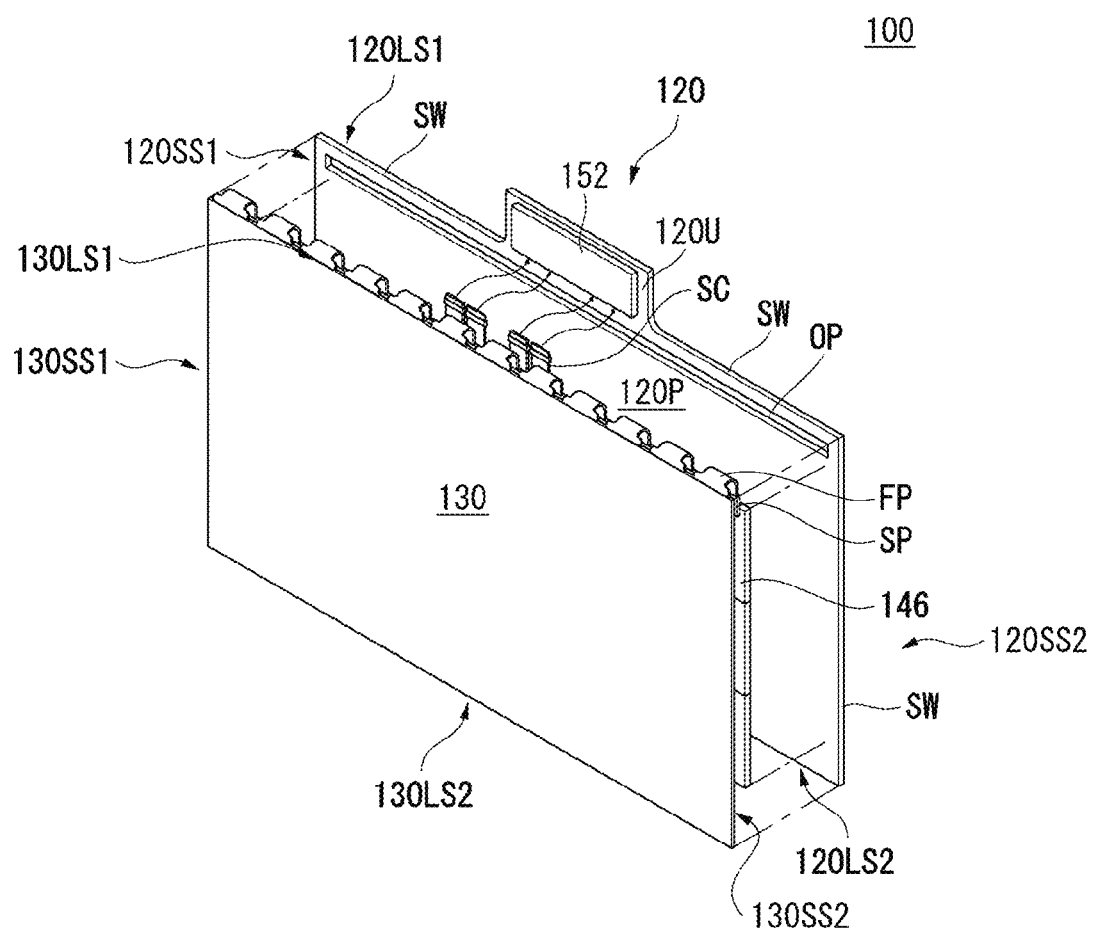
FIG. 21 illustrates an example of configuration of another surface of a display device according to an embodiment.

Referring to FIG. 21, a coupling member 146 may be positioned on the back surface of the frame 120. For example, the coupling member 146 may be an adhesive tape or a magnetic body. The coupling member 146 may cover the entire back surface of the frame 120 or a portion of the back surface of the frame 120. A first surface of the coupling member 146 may be fixed to the frame 120.

The second display panel 130 may be positioned on a second surface of the coupling member 146. The second surface of the coupling member 146 may contact the second display panel 130, and the first surface of the coupling member 146 may contact the frame 120. In other words, the second display panel 130 may be fixed to the frame 120 through the coupling member 146. The FPCB FP may be positioned on the upper part of the second display panel 130. The PCB SP may be connected to the FPCB FP and positioned in the opening OP of the frame 120. The PCB SP may be inserted into the inside of the opening OP of the frame 120.

The cable SC may be positioned on the back surface of the frame 120. The cable SC may be positioned between the coupling member 146 and the second display panel 130. The cable SC may be positioned between the frame 120 and the second display panel 130.

When the side of the second display panel 130 and the side of the coupling member 146 are covered by the side wall SW of the frame 120, the thickness of the display device 100 may be partially determined by a thickness of the side wall SW. The thickness of the display device 100 may not be affected by the FPCB FP, the PCB SP, or the cable SC, or may be only slightly affected by them.

The frame 120 may include an upper frame 120U. The upper frame 120U may protrude from the upper side of the frame 120 to the outside. A second controller 152 may be installed on the upper frame 120U. For example, the second controller 152 may be a timing control unit (or a timing control board) or a bridge unit (or a bridge board). The cable SC may be electrically connected to the second controller 152. The second controller 152 may control the second display panel 130.

Figure 22:
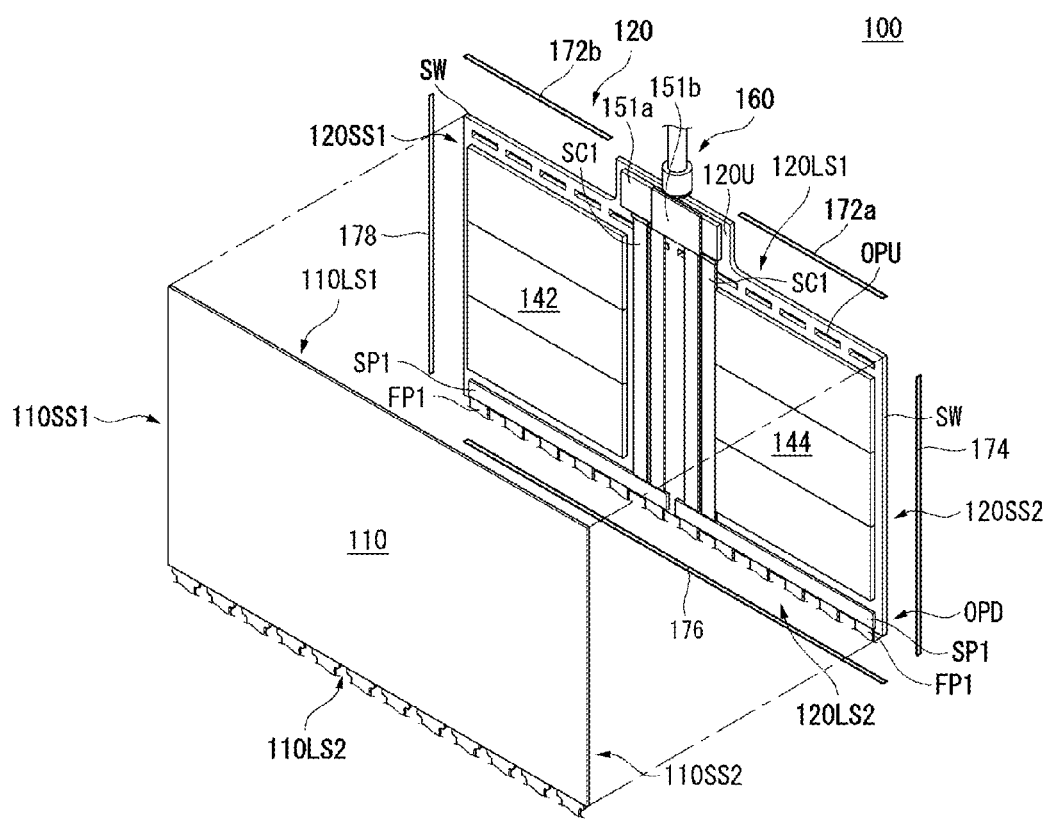
FIGS. 22 and 23 illustrate examples of both surfaces of a display device according to an embodiment.

Referring to FIG. 22, the frame 120 may be an entirely rectangular plate. The frame 120 may be formed of metal material so as to have predetermined rigidity. The frame 120 may include an upper frame 120U and an opening OP. The upper frame 120U may protrude from the upper side of the frame 120 to the outside. The upper frame 120U may be formed in the middle of the upper side of the frame 120.

The frame 120 may include an upper opening OPU. The upper opening OPU may be formed along the first long side 120LS1 of the frame 120. The upper opening OPU may be adjacent to the first long side 120LS1 of the frame 120. The upper opening OPU may include a plurality of upper openings OPU. The plurality of upper openings OPU may be sequentially formed along the first long side 120LS1 of the frame 120.

Figure 23:
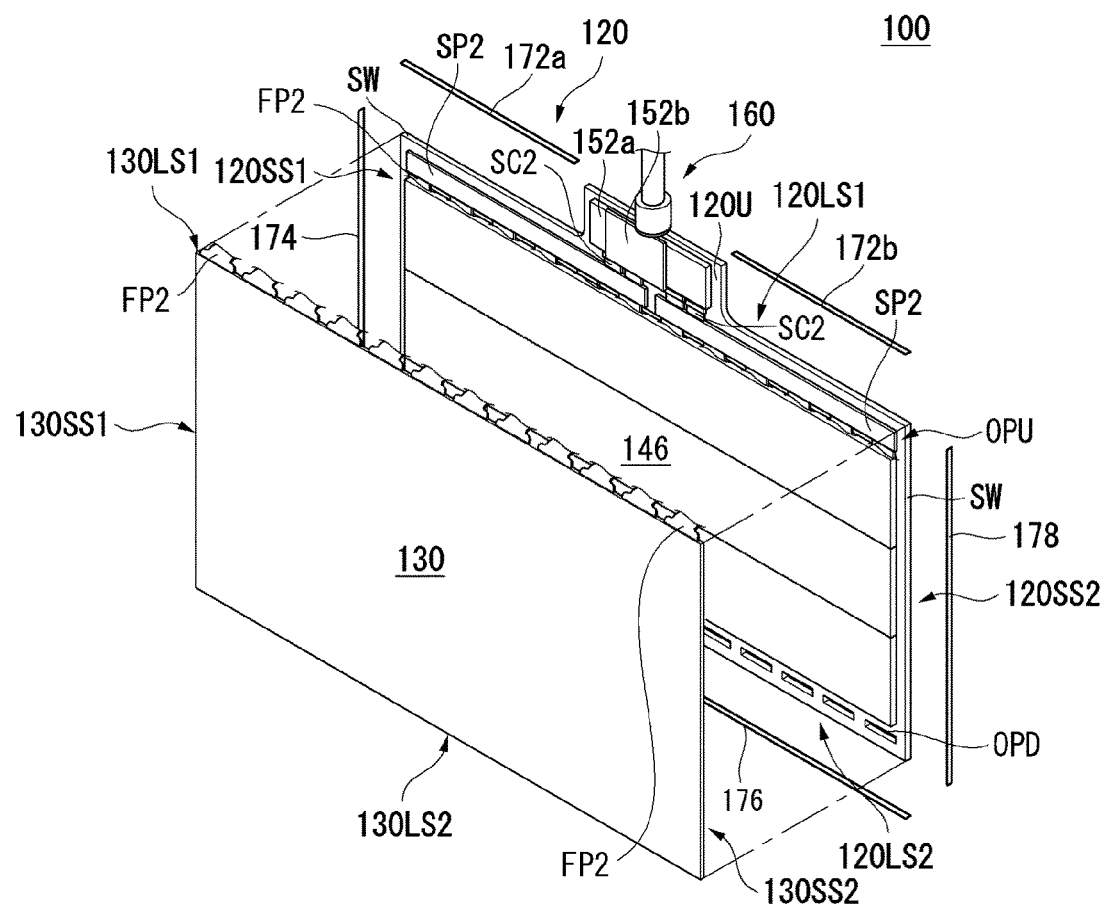

Referring to FIG. 23, the frame 120 may include a lower opening OPD. The lower opening OPD may be formed along the second long side 120LS2 of the frame 120. The lower opening OPD may be adjacent to the second long side 120LS2 of the frame 120. The lower opening OPD may include a plurality of lower openings OPD. The plurality of lower openings OPD may be sequentially provided along the second long side 120LS2 of the frame 120.

Referring to FIG. 22, adhesive members 142 and 144 may be fixed to one surface of the frame 120. The adhesive members 142 and 144 may be fixed to the front surface of the frame 120. For example, each of the adhesive members 142 and 144 may be a double-sided tape, in which one surface of each of the adhesive members 142 and 144 is attached to the front surface of the frame 120, and the other surface is attached to the back surface of the first display panel 110. Each of the adhesive members 142 and 144 may be a magnetic body, in which one surface of each of the adhesive members 142 and 144 is fixed to the front surface of the frame 120 through a magnetic force, and the other surface is fixed to the back surface of the first display panel 110 through a magnetic force.

The adhesive members 142 and 144 may be provided on the left and right sides of the front surface of the frame 120, respectively. The first adhesive member 142 may be provided on the left side of the front surface of the frame 120, and the second coupling member 144 may be provided on the right side of the front surface of the frame 120. The first adhesive member 142 may be separated from the second coupling member 144. A first cable SC1 may be placed between the first adhesive member 142 and the second coupling member 144. Namely, the first adhesive member 142, the first cable SC1, and the second coupling member 144 may be sequentially arranged on the front surface of the frame 120 in the left-right direction.

The first display panel 110 may be positioned in front of the frame 120. The first display panel 110 may contact the adhesive members 142 and 144 in front of the frame 120. The first display panel 110 may be fixed to the front surface of the frame 120 through the adhesive members 142 and 144. The first display panel 110 may form the front surface of the display device 100.

A first FPCB FP1 may be electrically connected to the first display panel 110. The first FPCB FP1 may control an image display of the first display panel 110. A first PCB SP1 may be positioned in the lower opening OPD of the frame 120. The first PCB SP1 may be inserted into the lower opening OPD of the frame 120. The first PCB SP1 may be placed in the lower opening OPD of the frame 120 by bending or folding the first FPCB FP1.

A first cable SC1 may electrically connect the first PCB SP1 to the first controller 151. The first cable SC1 may elongate from the upper frame 120U of the frame 120 toward the lower opening OPD of the frame 120. The surface of the frame 120 shown in FIG. 23 may be the back surface of the frame 120 shown in FIG. 22.

Referring to FIG. 23, an adhesive member 146 may be fixed to one surface of the frame 120. The adhesive member 146 may be fixed to the back surface of the frame 120. The adhesive member 146 may be a double-sided tape, in which one surface of the adhesive member 146 is attached to the back surface of the frame 120, and the other surface is attached to the back surface of the second display panel 130. The adhesive member 146 may also be a magnetic body, in which one surface of the adhesive member 146 is fixed to the back surface of the frame 120 through a magnetic force, and the other surface is fixed to the back surface of the second display panel 130 through a magnetic force. The adhesive member 146 may cover most of the back surface of the frame 120.

The second display panel 130 may be positioned in the rear of the frame 120. The second display panel 130 may contact the adhesive member 146 in the rear of the frame 120. The second display panel 130 may be fixed to the back surface of the frame 120 through the adhesive member 146. The second display panel 130 may form the back surface of the display device 100.

A second FPCB FP2 may be electrically connected to the second display panel 130. The second FPCB FP2 may control an image display of the second display panel 130. A second PCB SP2 may be positioned in the upper opening OPU of the frame 120. The second PCB SP2 may be inserted into the upper opening OPU of the frame 120. The second PCB SP2 may be placed in the upper opening OPU of the frame 120 by bending or folding the second FPCB FP2.

A second cable SC2 may electrically connect the second PCB SP2 to the second controller 152. The second cable SC2 may be placed toward the upper frame 120U of the frame 120.

Referring to FIGS. 22 and 23, side covers 172, 174, 176, and 178 may be positioned on one side of the display device 100. The side covers 172, 174, 176, and 178 may form the side of the display device 100. The side covers 172, 174, 176, and 178 may be coupled with the first long side 120LS1, the second long side 120LS2, the first short side 120SS1, and the second short side 120SS2 of the frame 120. First side covers 172a and 72b may be coupled with the first long side 120LS1 of the frame 120. The second side cover 174 may be coupled with the second short side 120SS2 of the frame 120. The third side cover 176 may be coupled with the second long side 120LS2 of the frame 120. The fourth side cover 178 may be coupled with the first short side 120SS1 of the frame 120. The first to fourth side covers 172, 174, 176, and 178 may be individually coupled with the frame 120. The first to fourth side covers 172, 174, 176, and 178 may be one body and coupled with the frame 120 through the bending. The side covers 172, 174, 176, and 178 may cover the sides of the frame 120, the first display panel 110, and the second display panel 130. Hence, the sides of the display panels 110 and 130 may be protected.

Figure 24:
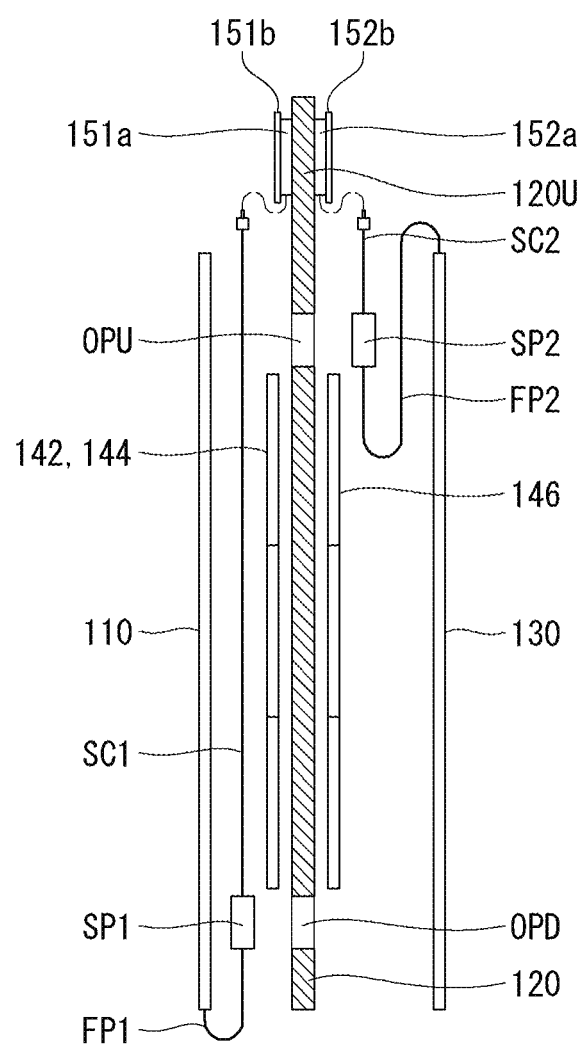
FIG. 24 illustrates an example of a cross section of a display device according to an embodiment.

Referring to FIG. 24, the first display panel 110 may be positioned on one surface of the frame 120, and the second display panel 130 may be positioned on the other surface of the frame 120. The frame 120 may be positioned between the first display panel 110 and the second display panel 130.

The adhesive members 142 and 144 may be positioned between the first display panel 110 and the frame 120. The adhesive members 142 and 144 may fix the first display panel 110 to the frame 120. The adhesive members 142 and 144 may be fixed to the front surface of the frame 120. The first display panel 110 may be fixed to the adhesive members 142 and 144.

The adhesive member 146 may be positioned between the second display panel 130 and the frame 120. The adhesive member 146 may fix the second display panel 130 to the frame 120. The adhesive member 146 may be fixed to the back surface of the frame 120. The second display panel 130 may be fixed to the adhesive member 146.

The frame 120 may include the upper opening OPU and the lower opening OPD. The upper opening OPU may be formed at the upper part of the frame 120, and the lower opening OPD may be formed at the lower part of the frame 120. The upper opening OPU and the lower opening OPD may be formed by penetrating the frame 120 and may be formed as a groove of the frame 120. When the upper opening OPU and the lower opening OPD are formed as a groove of the frame 120, the lower opening OPD may face the first display panel 110, and the upper opening OPU may face the second display panel 130.

The first PCB SP1 may be electrically connected to the first display panel 110 through the first FPCB FP1. The first PCB SP1 may be positioned in the lower opening OPD. The first PCB SP1 may be inserted into the lower opening OPD. The first cable SC1 may be electrically connected to the first PCB SP1 and may extend from the lower opening OPD toward the upper opening OPU. The first cable SC1 may be positioned between the first display panel 110 and the frame 120 or between the first display panel 110 and the adhesive members 142 and 144. The first cable SC1 may extend to the upper frame 120U of the frame 120.

The second PCB SP2 may be electrically connected to the second display panel 130 through the second FPCB FP2. The second PCB SP2 may be positioned in the upper opening OPU. The second PCB SP2 may be inserted into the upper opening OPU. The second cable SC2 may be electrically connected to the second PCB SP2 and may extend toward the upper frame 120U of the frame 120. The second cable SC2 may be positioned between the second display panel 130 and the frame 120 or between the second display panel 130 and the adhesive member 146.

The display device 100 may thus provide an image on its both surfaces. Further, the display device 100 may have a slim thickness.

Figure 25:
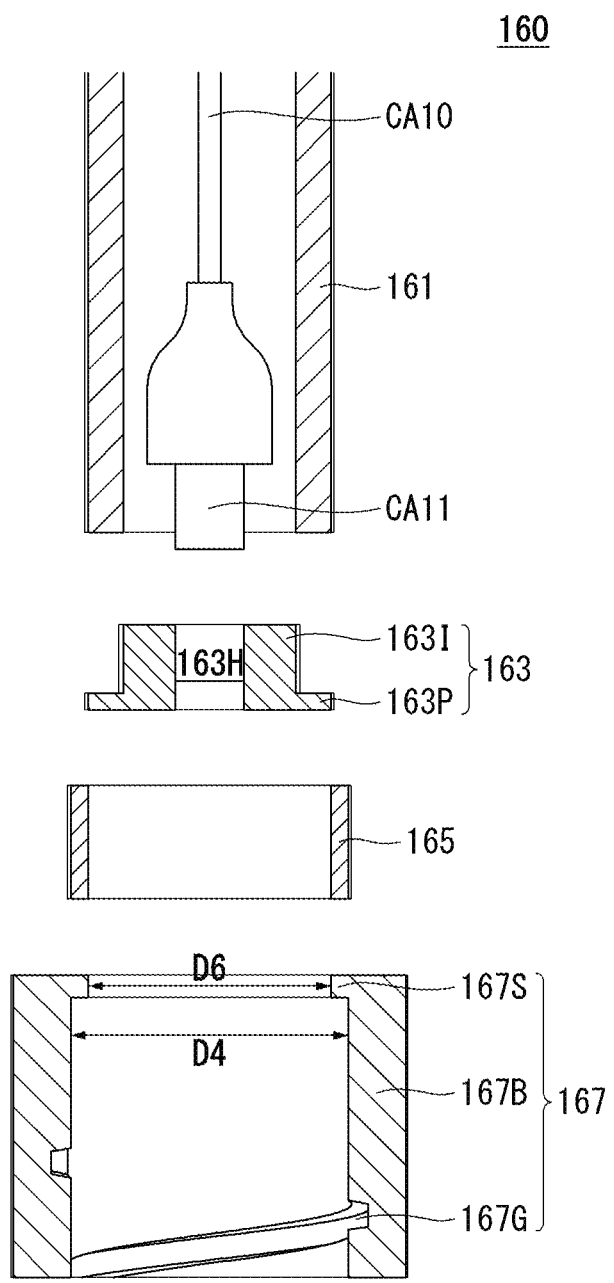
FIGS. 25 and 26 illustrate examples of a connector of a display device according to an embodiment.
Figure 26:
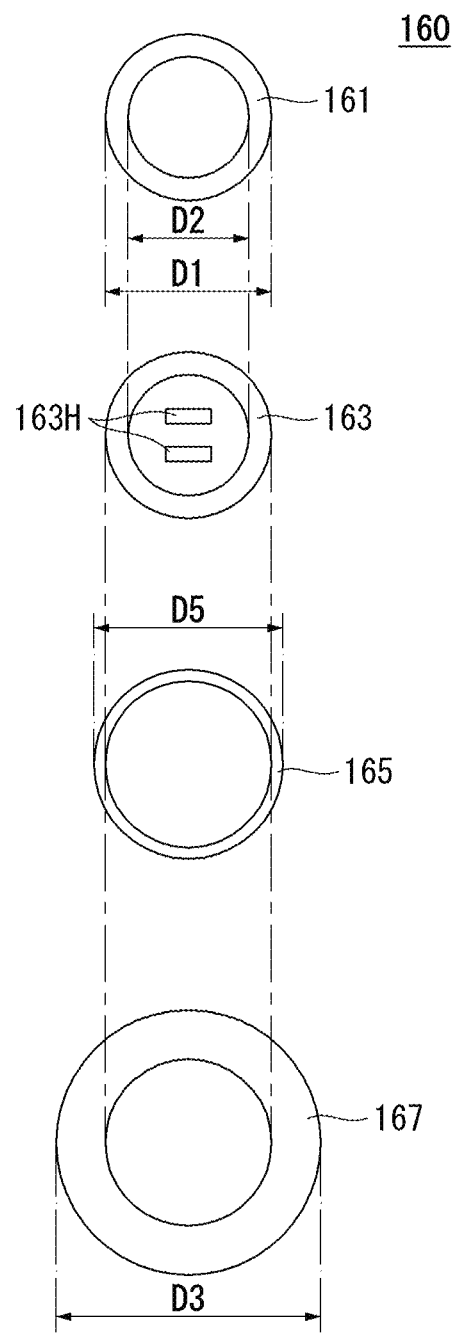

Referring to FIGS. 25 and 26, a connector 160 may include a pipe 161. The pipe 161 may have a cylindrical shape, in which an inside is hollow. A cable CA10 may be positioned inside the pipe 161. The cable CA10 may transmit a video signal to the display panels 110 and 130. A first end CA11 of the cable CA10 may be positioned adjacent to one end of the pipe 161.

The connector 160 may include a holder 163. The holder 163 may be inserted into the inside of one end of the pipe 161. The first end CA11 of the cable CA10 may be inserted into the holder 163. The holder 163 may include an insertion portion 163I and a flange 163P. The insertion portion 163I may be positioned inside the pipe 161, and the flange 163P may be positioned outside one end of the pipe 161. An external diameter D2 of the insertion portion 163I may be equal to or slightly greater than an internal diameter D2 of the pipe 161. An external diameter D1 of the flange 163P may be equal to or slightly less than an external diameter D1 of the pipe 161.

The holder 163 may prevent the first end CA11 of the cable CA10 from moving at one end of the pipe 161. In other words, the holder 163 may cause a position of the first end CA11 of the cable CA10 to be fixed to one end of the pipe 161. To this end, the holder 163 may include a hole 163H. When the first end CA11 of the cable CA10 has a rectangular shape, the hole 163H may be formed by penetrating the holder 163 while being intaglioed so that the one end CA11 of the cable CA10 is inserted into the hole 163H. The hole 163H may be changed depending on the number of the cables CA10. Namely, when the plurality of cables CA10 is positioned inside the pipe 161, the holder 163 may include the plurality of holes 163H corresponding to the plurality of cables CA10.

The connector 160 may include a fixing ring 165. The fixing ring 165 may be worn on the outside of the pipe 161. The fixing ring 165 may be fixed to the outside of the pipe 161. The fixing ring 165 may be worn on the outside of the pipe 161 while being pressed by the outside of the pipe 161. Unlike this, the fixing ring 165 may be fixed to the outside of the pipe 161 using an adhesive while being worn on the outside of the pipe 161. When the fixing ring 165 is pressed by the pipe 161, an internal diameter D1 of the fixing ring 165 may be equal to or slightly less than the external diameter D1 of the pipe 161. When the fixing ring 165 is attached to the pipe 161, the internal diameter D1 of the fixing ring 165 may be equal to or slightly greater than the external diameter D1 of the pipe 161.

A connector 160 may include a coupling ring 167. The coupling ring 167 may include a ring body 167B, a stopper 167S, and a female screw 167G. The ring body 167B may have a cylindrical shape, in which an inside is entirely hollow. The ring body 167B may be worn on the outside of the pipe 161 and may move up and down with respect to the pipe 161. Further, the ring body 167B may be worn on the outside of the fixing ring 165 and may move up and down with respect to the fixing ring 165. An internal diameter D4 of the ring body 167B may be greater than the external diameter D1 of the pipe 161. Further, the internal diameter D4 of the ring body 167B may be slightly greater than an external diameter D5 of the fixing ring 165.

The stopper 167S may be positioned at one end of the ring body 167B. The stopper 167S may be formed at upper end of the ring body 167B. The stopper 167S may have a diameter less than the internal diameter D4 of the ring body 167B. An internal diameter D6 of the stopper 167S may be almost equal to or slightly greater than the external diameter D1 of the pipe 161. The internal diameter D6 of the stopper 167S may be less than the external diameter D5 of the fixing ring 165. Hence, the stopper 167S may be worn on the outside of the pipe 161 and may freely move up and down with respect to the pipe 161. The stopper 167S may be caught on the fixing ring 165. The female screw 167G may be formed inside the ring body 167B. The female screw 167G may form a height difference by successively rotating a groove having a predetermined size.

Figure 27:
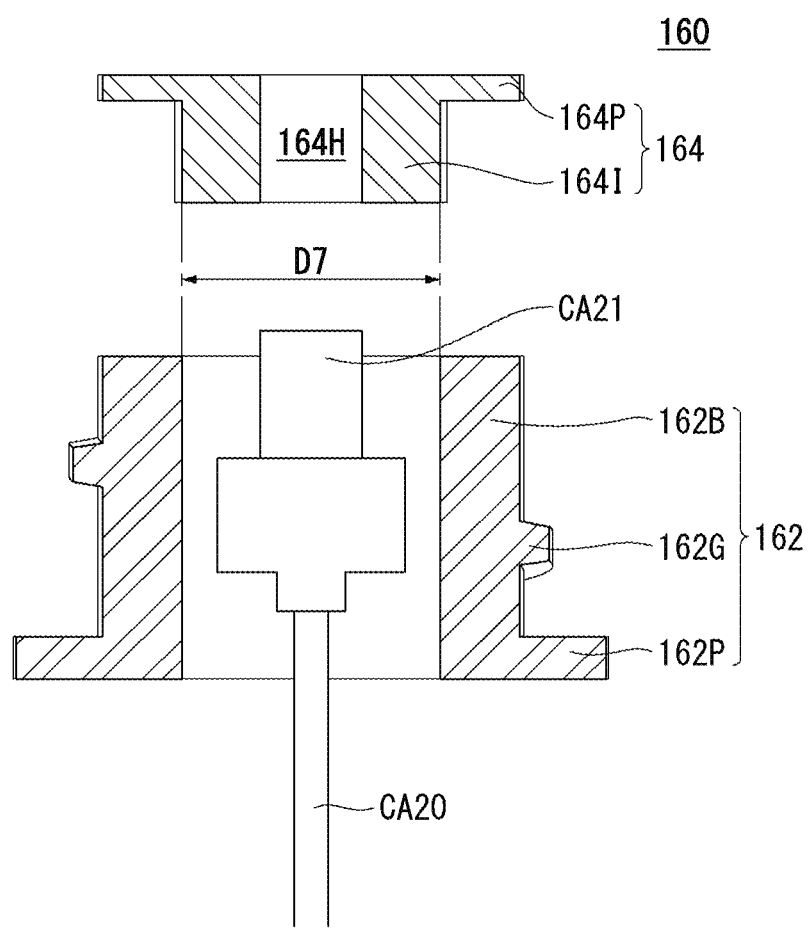
FIGS. 27 and 28 illustrate other examples of a connector of a display device according to an embodiment.
Figure 28:
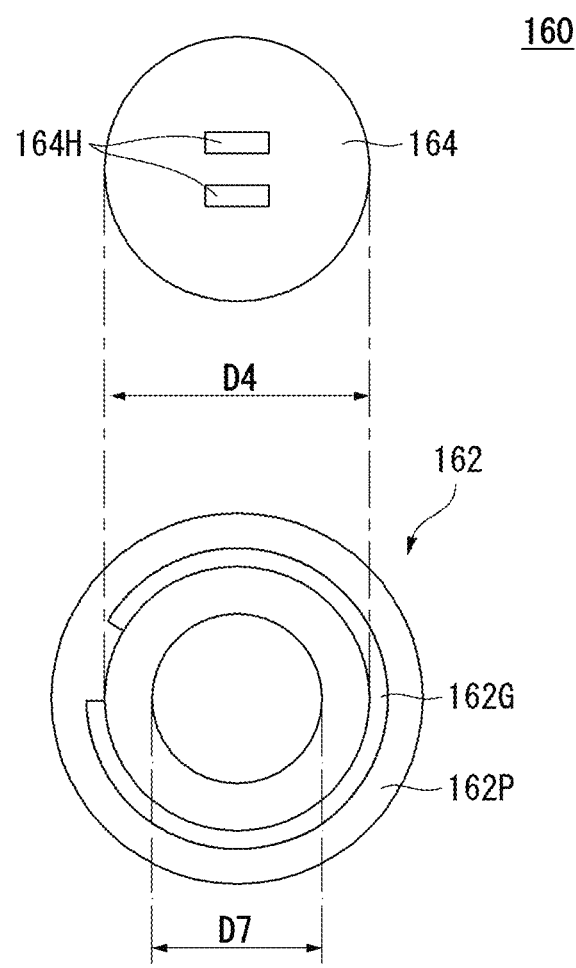
Figure 29:
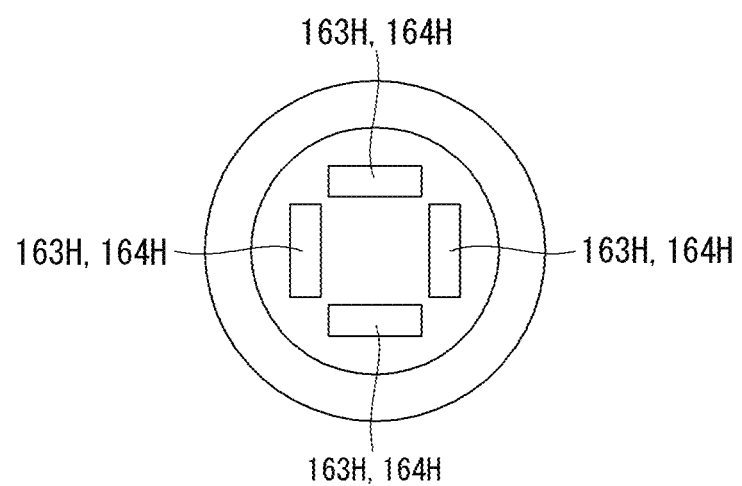
FIG. 29 illustrates other example of a holder of a display device according to an embodiment.
Figure 29:
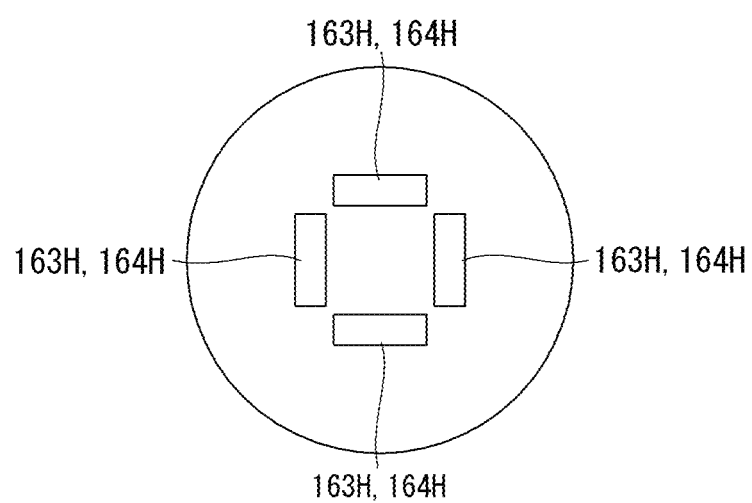

Referring to FIGS. 27-29, the connector 160 may include a coupling body 162. The coupling body 162 may have a cylindrical shape, in which an inside is hollow. A cable CA20 may be positioned inside the coupling body 162. The cable CA20 may transmit a video signal to the display panels 110 and 130. A first end CA21 of the cable CA20 may be positioned adjacent to one end of the coupling body 162.

The coupling body 162 may include a flange 162P on a lower part. The flange 162P of the coupling body 162 may be fixed to the upper frame 120U of the frame 120. The coupling body 162 may include a male screw 162G. The male screw 162G may be formed on an external surface of a cylindrical portion 162B of the coupling body 162. The male screw 162G may protrude from the external surface of the cylindrical portion 162B of the coupling body 162. The male screw 162G may be coupled with the female screw 167G of the coupling ring 167. An external diameter D4 of the cylindrical portion 162B may be equal to or slightly less than the internal diameter D4 of the ring body 167B. Hence, the coupling body 162 may be screw-inserted into the coupling ring 167.

The connector 160 may include a holder 164. The holder 164 may be inserted into the inside of one end of the cylindrical portion 162B of the coupling body 162. The first end CA21 of the cable CA20 may be inserted into the holder 164. The holder 164 may include an insertion portion 164I and a flange 164P. The insertion portion 164I may be positioned inside the coupling body 162, and the flange 164P may be positioned outside one end of the coupling body 162. An external diameter D7 of the insertion portion 164I may be equal to or slightly greater than an internal diameter D7 of the coupling body 162. An external diameter D4 of the flange 164P may be equal to or less than the external diameter D4 of the cylindrical portion 162B.

The holder 164 may prevent the first end CA21 of the cable CA20 from moving at one end of the coupling body 162. The holder 164 may cause a position of the first end CA21 of the cable CA20 to be fixed to one end of the coupling body 162. The holder 164 may include a hole 164H. When the first end CA21 of the cable CA20 has a rectangular shape, the hole 164H may be formed by penetrating the holder 164 while being intaglioed so that the first end CA21 of the cable CA20 is inserted into the hole 164H. The hole 164H may be changed depending on the number of the cables CA20. When the plurality of cables CA20 is positioned inside the coupling body 162, the holder 164 may include the plurality of holes 164H corresponding to the plurality of cables CA20.

Referring to FIGS. 26 and 28, for example, the holder 163 may include two holes 163H, and the holder 164 may include two holes 164H. The two holes 163H may face each other, and the two holes 164H may face each other. Respective ends of two cables CA may be respectively inserted into the two holes 163H and 164H. Referring to FIG. 29, for example, the holder 163 may include four holes 163H, and the holder 164 may include four holes 164H. Respective ends of four cables CA may be respectively inserted into the four holes 163H and 164H. In each of the four holes 163H and 164H, two holes may face each other, and two other holes may face each other. The four holes 163H and 164H may be sequentially formed along a circumference direction of the holders 163 and 164.

Figure 30:
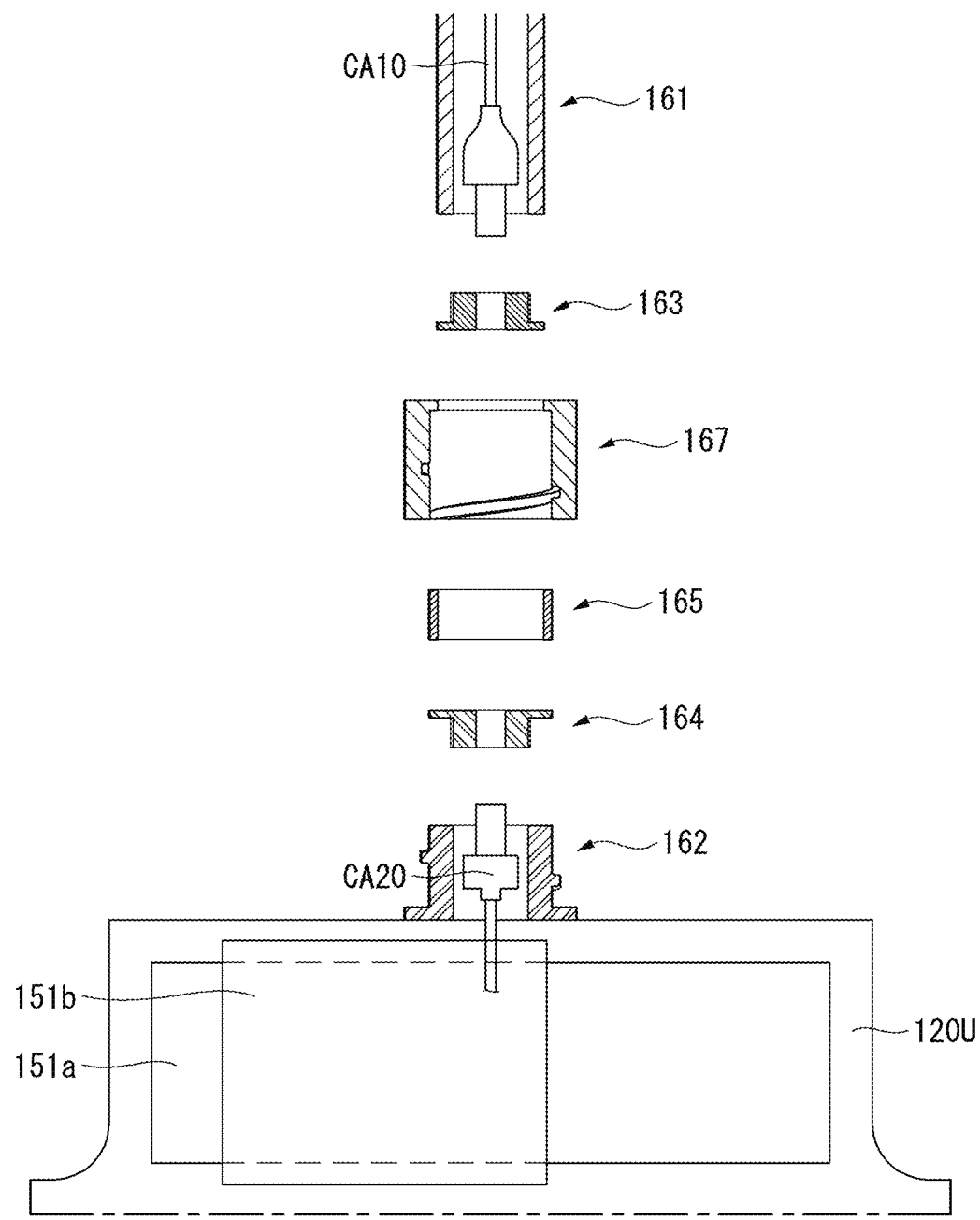
FIGS. 30 to 35 illustrate examples of connecting components of a display device according to an embodiment.
Figure 31:
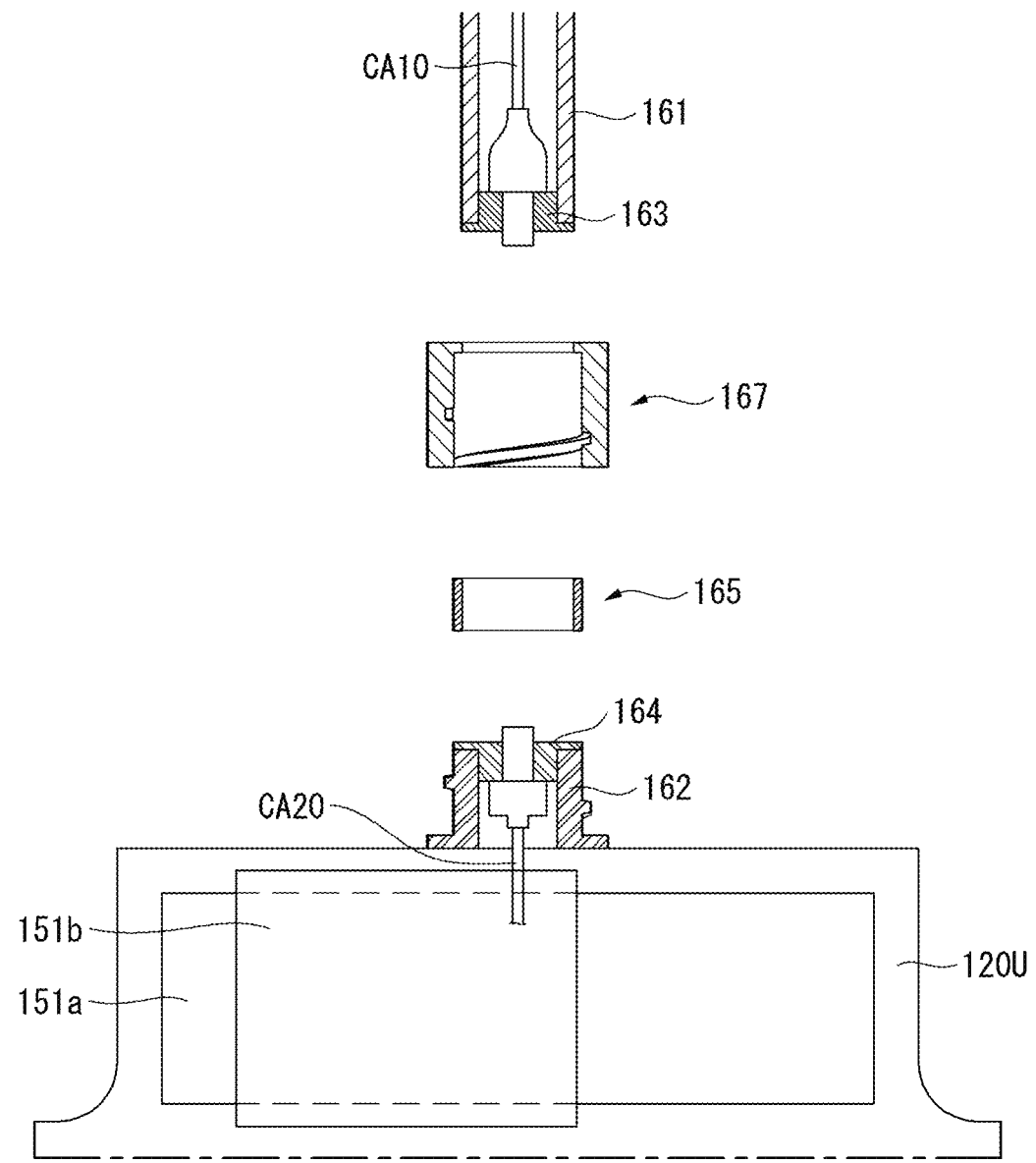

Referring to FIGS. 30 and 31, the holder 163 may be inserted into the pipe 161. The cable CA10 may be positioned inside the pipe 161. The cable CA10 may be inserted into the holder 163, and a position of the cable CA10 may be fixed. One end of the cable CA10 may protrude to the outside of the holder 163. The coupling body 162 may be fixed to the upper frame 120U of the frame 120. The cable CA10 may be electrically connected to the controller 151 installed on the upper frame 120U of the frame 120. For example, the controller 151 may include a bridge unit or device 151b and a timing control unit or device 151a. The bridge unit 151b may divide a signal transmitted from the cable CA10 through the cable CA20. The timing control unit 151a may control a video signal of the display panel 110. The above description with respect to the controller 151 may be equally applied to the controller 152. The controller 152 may control a video signal of the display panel 130. Namely, the controllers 151 and 152 may perform the same function, but may individually operate when performing the same function.

The coupling body 162 may be inserted into the holder 164. In this instance, the cable CA20 may be positioned inside the coupling body 162. The cable CA20 may be inserted into the holder 164, and a position of the cable CA20 may be fixed. One end of the cable CA20 may protrude to the outside of the holder 164.

Figure 32:
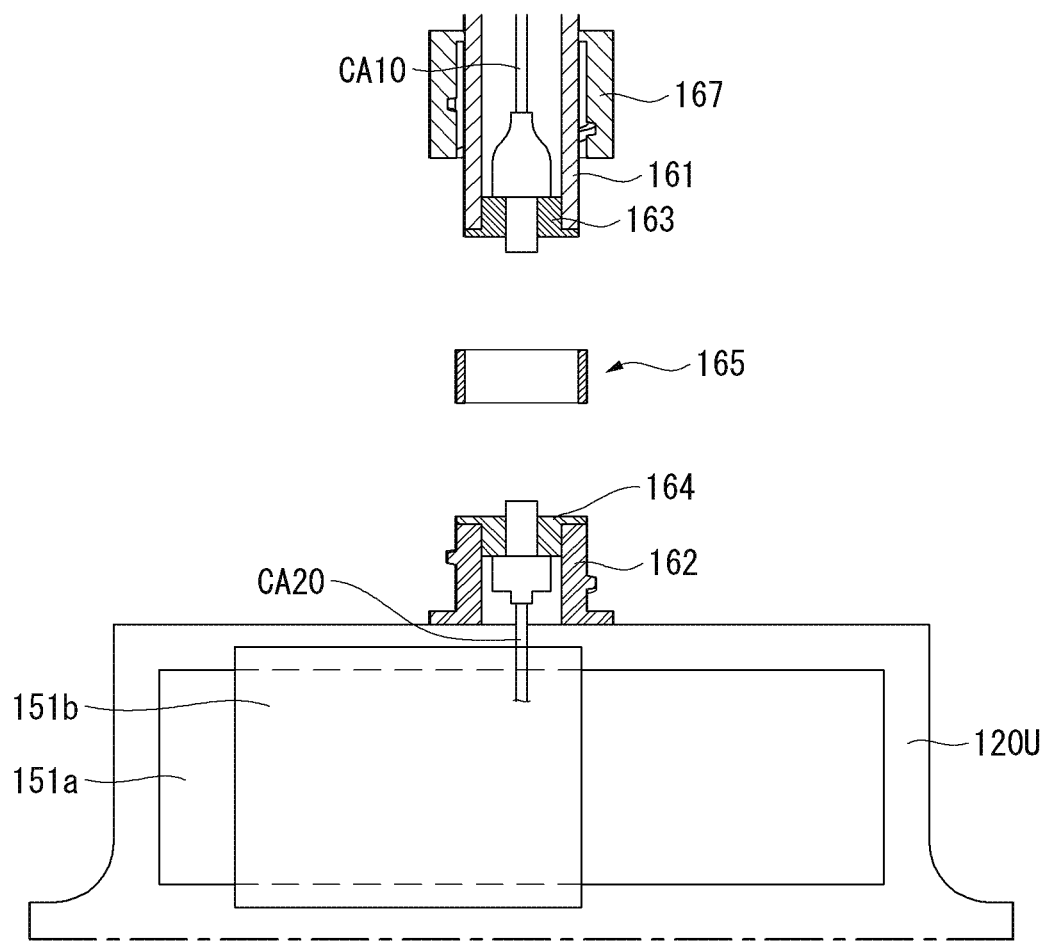

Referring to FIG. 32, the ring body 167B may be attached to the pipe 161 and may move up and down with respect to the pipe 161. The coupling ring 167 may be positioned on the pipe 161 so that the fixing ring 165 is coupled with one end of the pipe 161.

Figure 33:
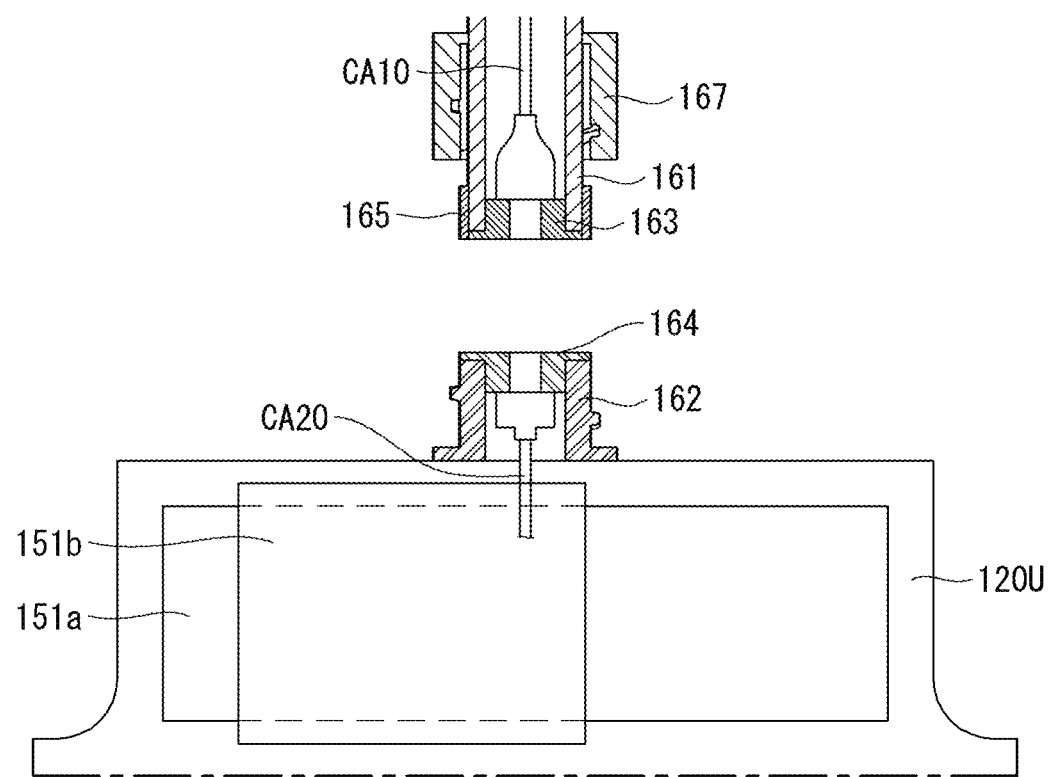

Referring to FIG. 33, the fixing ring 165 may be attached to the external diameter of the pipe 161. The fixing ring 165 may be pressed by the external diameter of the pipe 161 and fixed to the pipe 161. Conversely, the fixing ring 165 may be attached to the external diameter of the pipe 161 and fixed to the pipe 161 using an adhesive. The fixing ring 165 may be formed separately from the pipe 161 and coupled with the pipe 161 as described above. Further, the fixing ring 165 and the pipe 161 may be formed as one body. When the fixing ring 165 is formed separately from the pipe 161, the assembly convenience of the display device 100 may increase. When the fixing ring 165 and the pipe 161 are formed as one body, connection rigidity of the display device 100 may increase.

Figure 34:
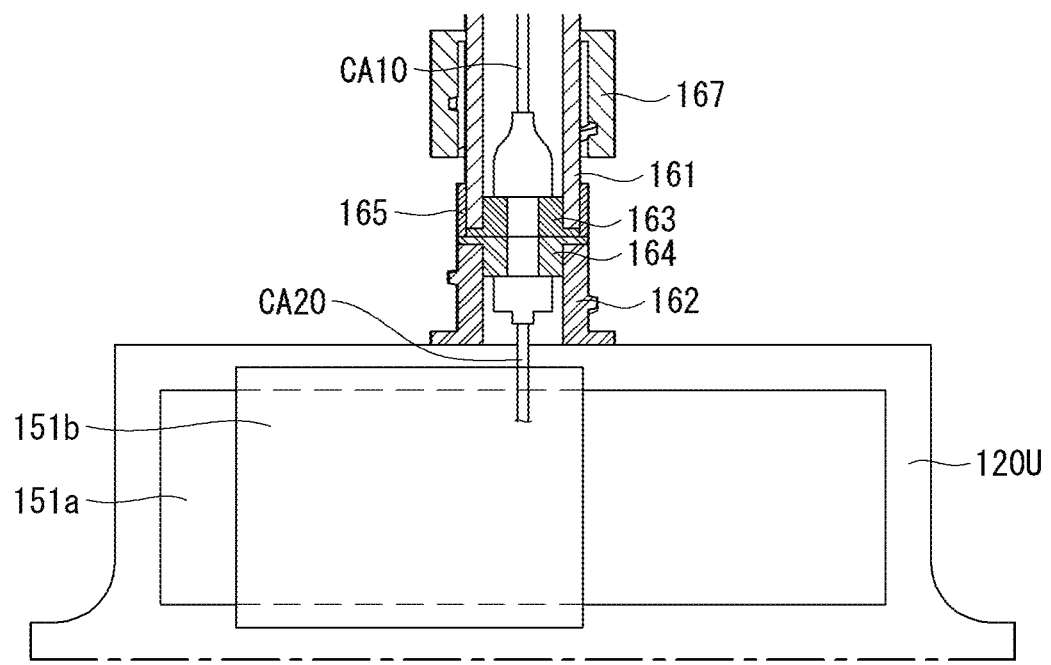

Referring to FIG. 34, the coupling body 162 may be coupled with the pipe 161. In this instance, the holder 163 may face the holder 164. Hence, the cable CA10 may be coupled with the cable CA20. The coupling body 162 may be coupled with the pipe 161, and at the same time, the cable CA10 may be electrically connected to the cable CA20.

Figure 35:
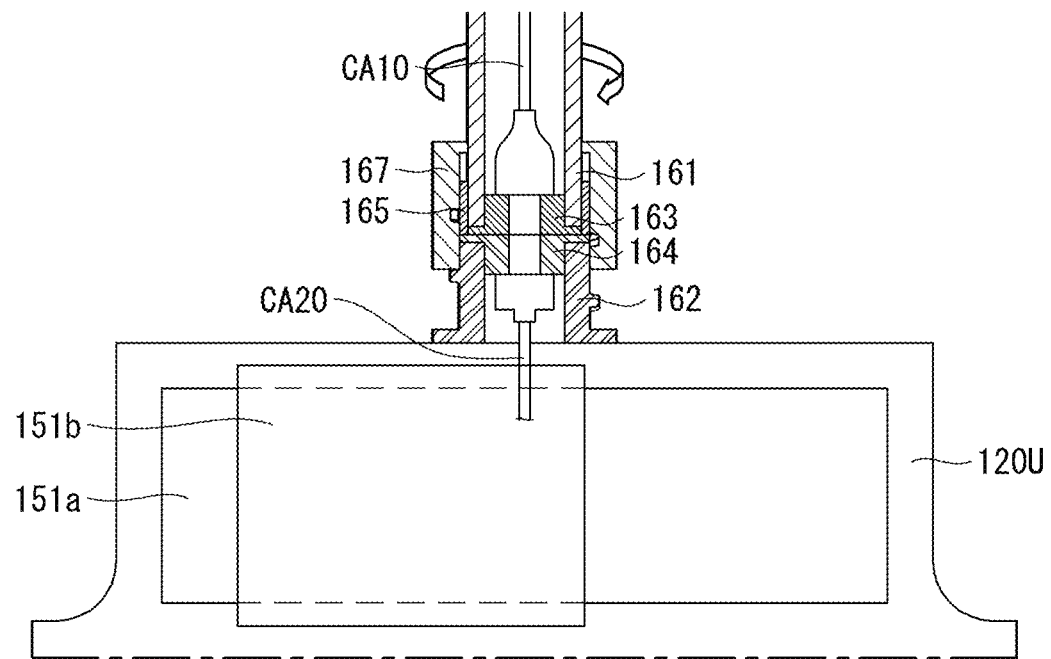

Referring to FIG. 35, the coupling ring 167 may rotate and may be attached to the coupling body 162. In this instance, as the coupling ring 167 rotates, the female screw 167G of the coupling ring 167 may rotate along the male screw 162G of the coupling body 162. The coupling ring 167 may be screw-coupled with the coupling body 162. When the rotation of the coupling ring 167 is completed, the coupling body 162 may be fixed to the pipe 161.

Figure 36:
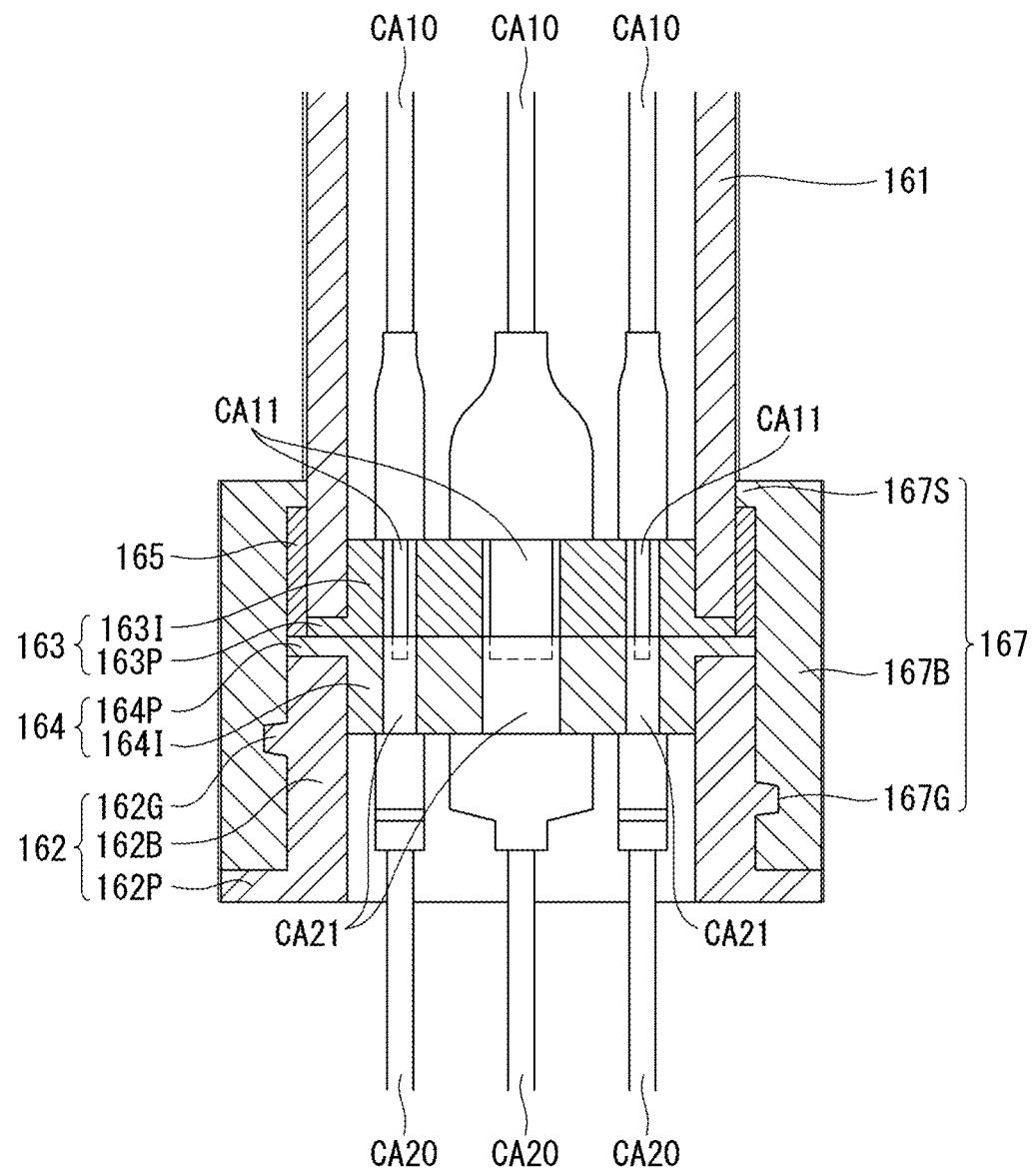
FIG. 36 illustrates an example of a connection cross section of a display device according to an embodiment.

As can be seen from FIG. 36, as the rotation of the coupling ring 167 is completed, the coupling ring 167 may be screw-coupled with the coupling body 162. In this instance, the holder 163 may face the holder 164. The first ends of the plurality of cables CA10 may be respectively inserted into the plurality of cables CA20 and electrically connected to the plurality of cables CA20. The fixing ring 165 may be fixed to the pipe 161, a first end of the coupling ring 167 may be caught on the fixing ring 165, and a second end of the coupling ring 167 may engage with the coupling body 162 through the screw coupling. Hence, the display device 100 may be physically coupled with the pipe 161 and fixed to the pipe 161, and also the cables CA10 and CA20 may be electrically and easily fastened to each other.

Figure 37:
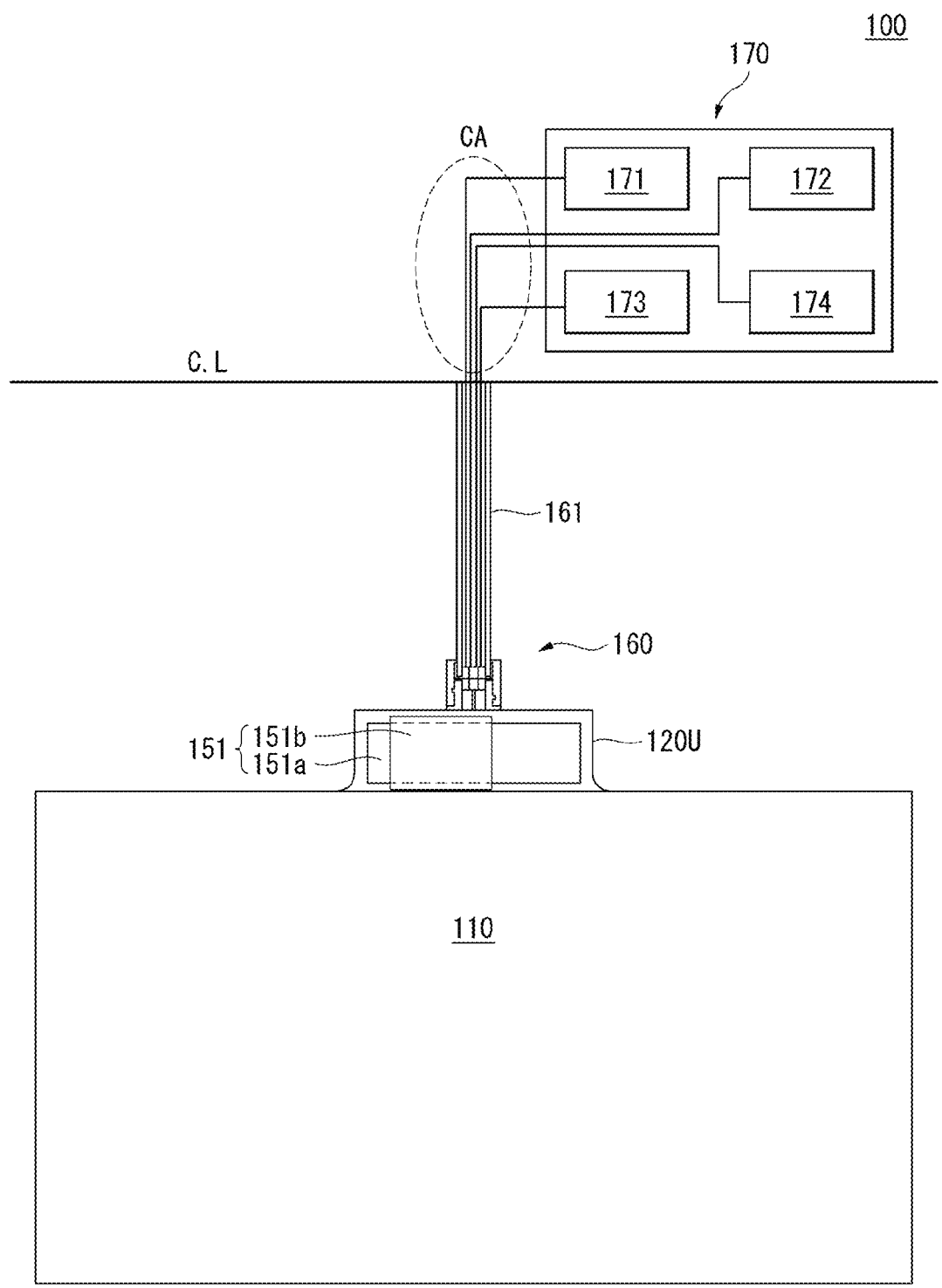
FIG. 37 illustrates an example of connecting components of a display device according to an embodiment.

Referring to FIG. 37, the display device 100 may be fixed. For example, the display device 100 may be fixed to a ceiling or a wall. The display panels 110 and 130 and portions 151 and 152 of the controllers may be exposed to the outside of the ceiling or the wall. Remaining portions 170 of the controllers may be installed inside the ceiling or the wall.

The display device 100 may include a main controller 170 and sub-controllers 151 and 152. The main controller 170 may include power supply units (or power supplies) 172 and 174 and communication modules 171 and 173. The sub-controllers 151 and 152 may include a first controller 151 and a second controller 152. The sub-controllers 151 and 152 may include bridge units 151b and 152b and timing control units 151a and 152a. The first controller 151 may include a first bridge unit 151b and a first timing control unit 151a. The second controller 152 may include a second bridge unit 152b and a second timing control unit 152a.

The power supply units 172 and 174 may supply power required in the display device 100. The power supply units 172 and 174 may be a plurality of power supply units and may individually supply the power to the first and second display panels 110 and 130. The power supply units 172 and 174 may be installed inside the ceiling or the wall. For example, the power supply units 172 and 174 may include a first power supply unit 172 and a second power supply unit 174. The first power supply unit 172 may supply the power to the first display panel 110, and the second power supply unit 174 may supply the power to the second display panel 130.

The communication modules 171 and 173 may receive a signal required in an image display of the display device 100 and supply the signal to the display panels 110 and 130. The communication modules 171 and 173 may be a plurality of communication modules and may individually supply a video signal to the first and second display panels 110 and 130. The communication modules 171 and 173 may include a first communication module 171 and a second communication module 173. The first communication module 171 may supply the video signal to the first display panel 110, and the second communication module 173 may supply the video signal to the second display panel 130.

The pipe 161 may be fixed to a ceiling line CL or a wall line. The first controller 151 may be formed on a first surface of the upper frame 120U of the frame 120, and the second controller 152 may be formed on a second surface of the upper frame 120U of the frame 120. The main controller 170 may be separated from the sub-controllers 151 and 152 based on the ceiling line CL or the wall line. The sub-controllers 151 and 152 may be formed on the frame 120 and may be electrically connected to the main controller 170 through a cable CA embedded in the pipe 161.

The first controller 151 may be installed on the upper frame 120U of the frame 120, to which the first display panel 110 belongs. The first controller 151 may include the first bridge unit 151b and the first timing control unit 151a. The first bridge unit 151b may distribute the power and/or the video signal provided by the main controller 170 to the first timing control unit 151a and/or the first display panel 110. The first timing control unit 151a may control an image displayed on the first display panel 110.

The second controller 152 may be installed on the upper frame 120U of the frame 120, to which the second display panel 130 belongs. The second controller 152 may include the second bridge unit 152b and the second timing control unit 152a. The second bridge unit 152b may distribute the power and/or the video signal provided by the main controller 170 to the second timing control unit 152a and/or the second display panel 130. The second timing control unit 152a may control an image displayed on the second display panel 130.

The first display panel 110 may display the same image as the second display panel 130 or a different image from the second display panel 130 independently of the second display panel 130. On the contrary, the second display panel 130 may display the same image as the first display panel 110 or a different image from the first display panel 110 independently of the first display panel 110.

Figure 38:
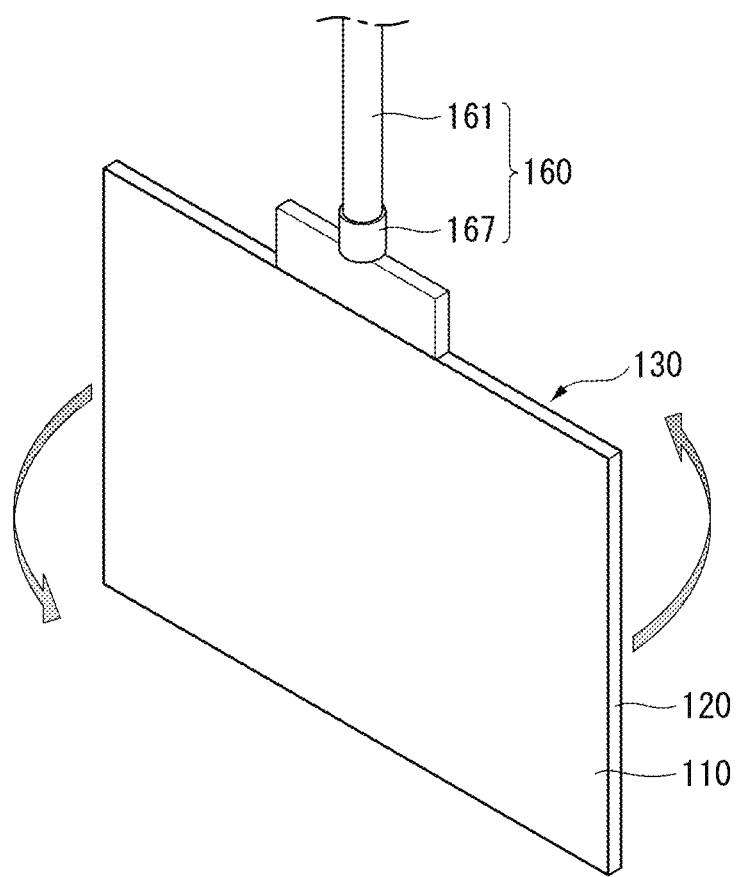
FIGS. 38 to 44 illustrate examples of a rotation mechanism of a display device according to an embodiment.

Referring to FIG. 38, the display panels 110 and 130 may rotate. A rotation angle of the display panels 110 and 130 may be limited. For example, a rotation angle of the first display panel 110 may be 0° to 180°. As another example, a rotation angle of the second display panel 130 may be 180° to 360°.

Figure 39:
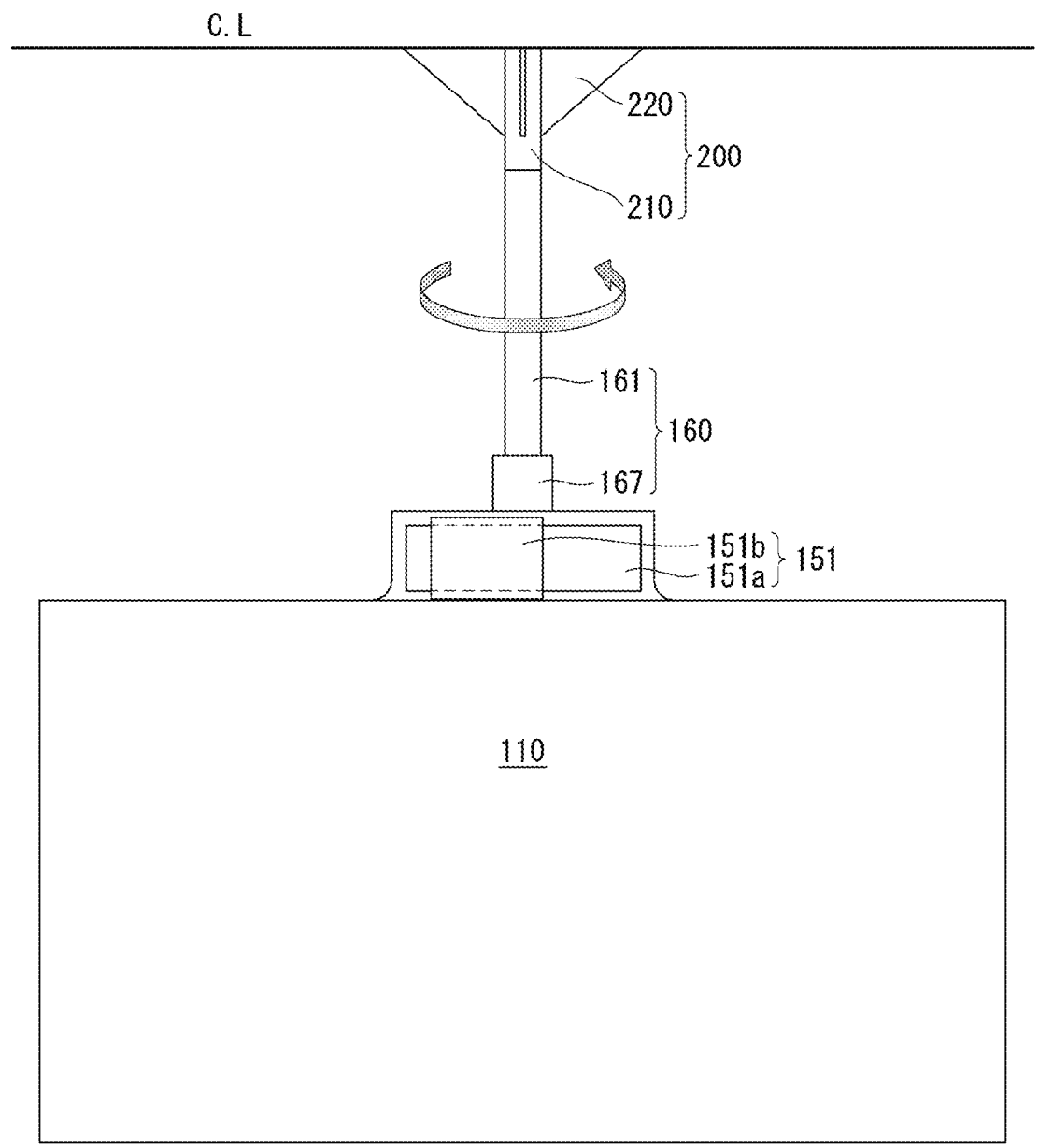

Referring to FIG. 39, a fixture 200 may be fixed. For example, the fixture 200 may be fixed to the ceiling line CL. The fixture 200 may include a pipe 210 and a supporter 220. The supporter 220 may be fixed to a portion of a building. For example, the supporter 220 may be fixed to an indoor ceiling of the building. As another example, the supporter 220 may be fixed by a hanger in the outdoors. The supporter 220 may be fixed using a coupling member including a bolt, a nut, a rivet, etc.

The supporter 220 may be a plurality of supporters. For example, three or four supporters 220 may be used. The three supporters 220 may be provided at intervals of 120°. The four supporters 220 may be provided at intervals of 90°. The plurality of supporters 220 may improve structural stability.

The pipe 210 may be coupled with the supporter 220. The pipe 210 may be fixed to the ceiling CL through the supporter 220. The connector 160 may relatively rotate with respect to the pipe 210. The connector 160 may rotate in a state where the pipe 210 is fixed to the supporter 220, and the connector 160 is connected to the pipe 210. The above-described rotation of the display panels 110 and 130 may be performed by the rotation of the connector 160.

Figure 40:
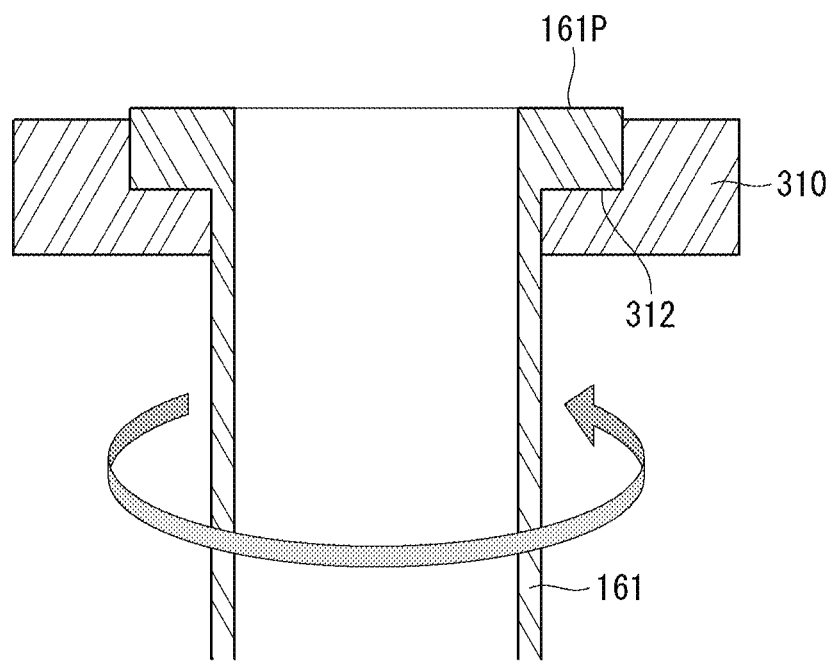

Referring to FIG. 40, the pipe 161 of the connector 160 may include a flange 161P at an upper end. The flange 161P may be formed on an outer circumference surface at the upper end of the pipe 161. The flange 161P and the pipe 161 may be formed as one body. The pipe 161 may rotate on a base 310. The base 310 may include a rotation groove 312, into which the flange 161P is inserted. The pipe 161 may rotate in a state where the pipe 161 is inserted into the rotation groove 312 of the base 310. In this instance, a friction may be generated between the pipe 161 and the rotation groove 312.

Figure 41:
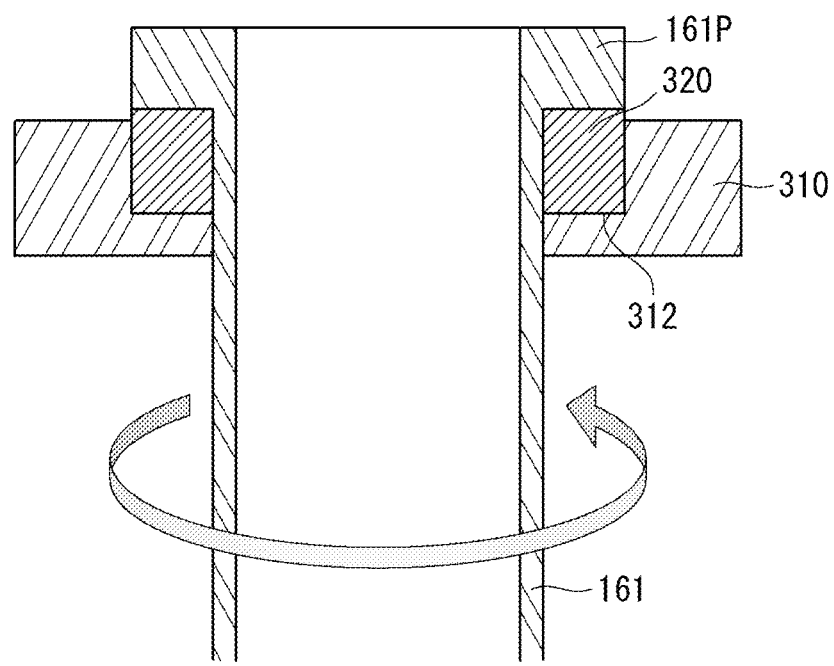

Referring to FIG. 41, a bearing 320 may be positioned between the pipe 161 and the base 310. The bearing 320 may be positioned between the flange 161P and the base 310. The bearing 320 may be positioned between the pipe 161 and the rotation groove 312. The bearing 320 may be positioned between the flange 161P and the rotation groove 312. The bearing 320 may reduce a friction generated by rotating the pipe 161 on the base 310. In this instance, the bearing 320 may be a thrust bearing. Hence, the bearing 320 may bear weight applied to the pipe 161 by the display panels 110 and 130 and the frame 120. The bearing 320 may reduce the friction between the pipe 161 and the base 310, and at the same time may bear the weight while transferring the weight applied to the pipe 161 to the base 310.

Figure 42:
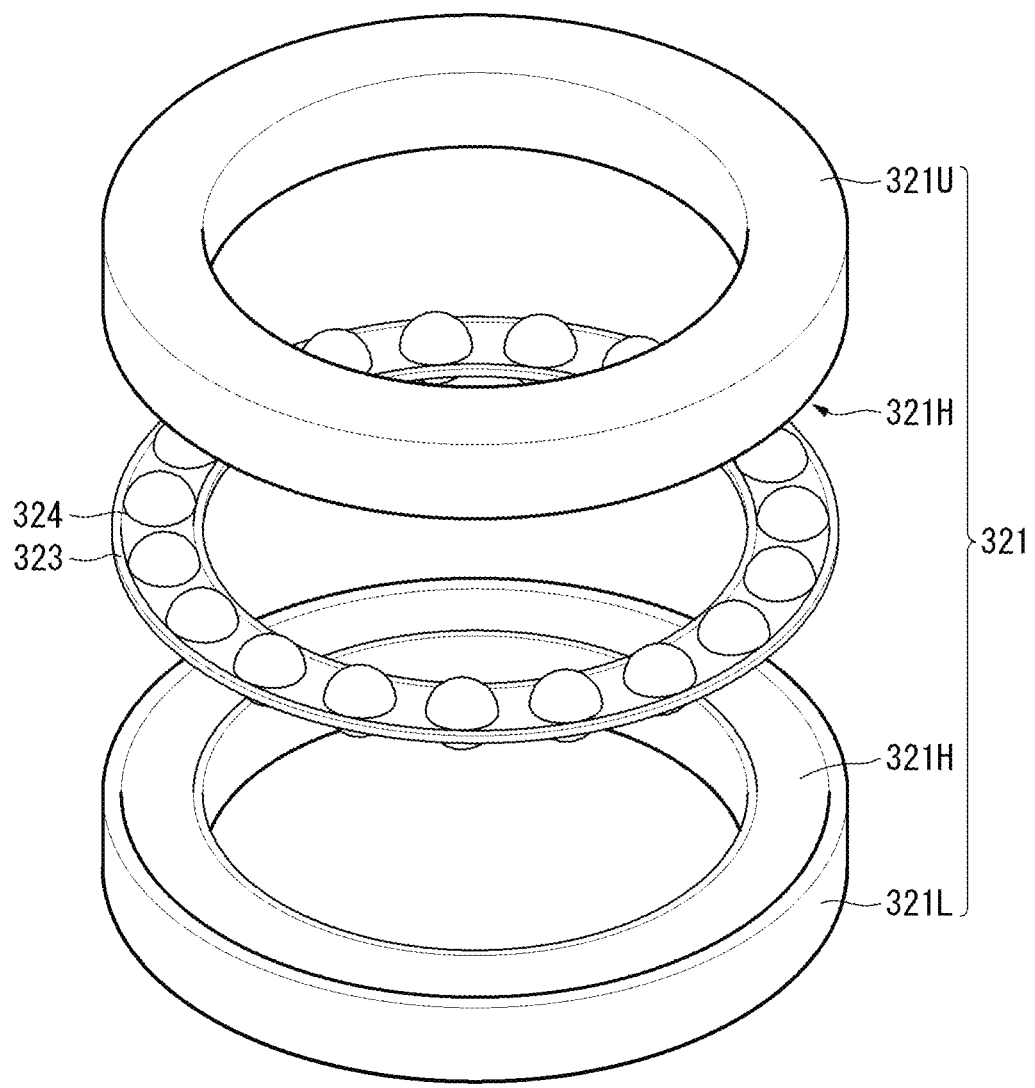

Referring to FIG. 42, the bearing 320 may include a housing 321, a rail 323, and a ball 324. The housing 321 may include an upper housing 321U and a lower housing 321L. The housing 321 may have an entirely circular shape. The housing 321 may have a donut shape.

The rail 323 may have a shape entirely corresponding to the shape of the housing 321. In this instance, a diameter of the rail 323 may be less than a diameter of the housing 321. In other words, an internal diameter of the rail 323 may be greater than an internal diameter of the housing 321, and an external diameter of the rail 323 may be less than an external diameter of the housing 321.

The ball 324 may be formed on the rail 323. The ball 324 may be inserted into a groove formed on the rail 323. A plurality of balls 324 may be provided on the rail 323. The rail 323 may hold a distance between the plurality of balls 324, an arrangement and a position of the plurality of balls 324, and the like.

The lower housing 321L of the housing 321 may include a rolling groove 321H. The rolling groove 321H may be formed between an internal diameter and an external diameter of the lower housing 321L. The rolling groove 321H may be formed on an upper surface of the lower housing 321L. The upper housing 321U may include a rolling groove 321H on its lower surface.

The rail 323 and the plurality of balls 324 may be positioned between the rolling groove 321H of the upper housing 321U and the rolling groove 321H of the lower housing 321L. The rail 323 and the plurality of balls 324 may be interposed between the upper housing 321U and the lower housing 321L. Hence, the upper housing 321U may relatively rotate with respect to the lower housing 321L, or the lower housing 321L may relatively rotate with respect to the upper housing 321U.

The bearing 320 may be able to rotate at a relatively high speed. When the display panels 110 and 130 need to rotate at a high speed, the bearing 320 having the above-described configuration may be advantageous to the display panels 110 and 130.

Figure 43:
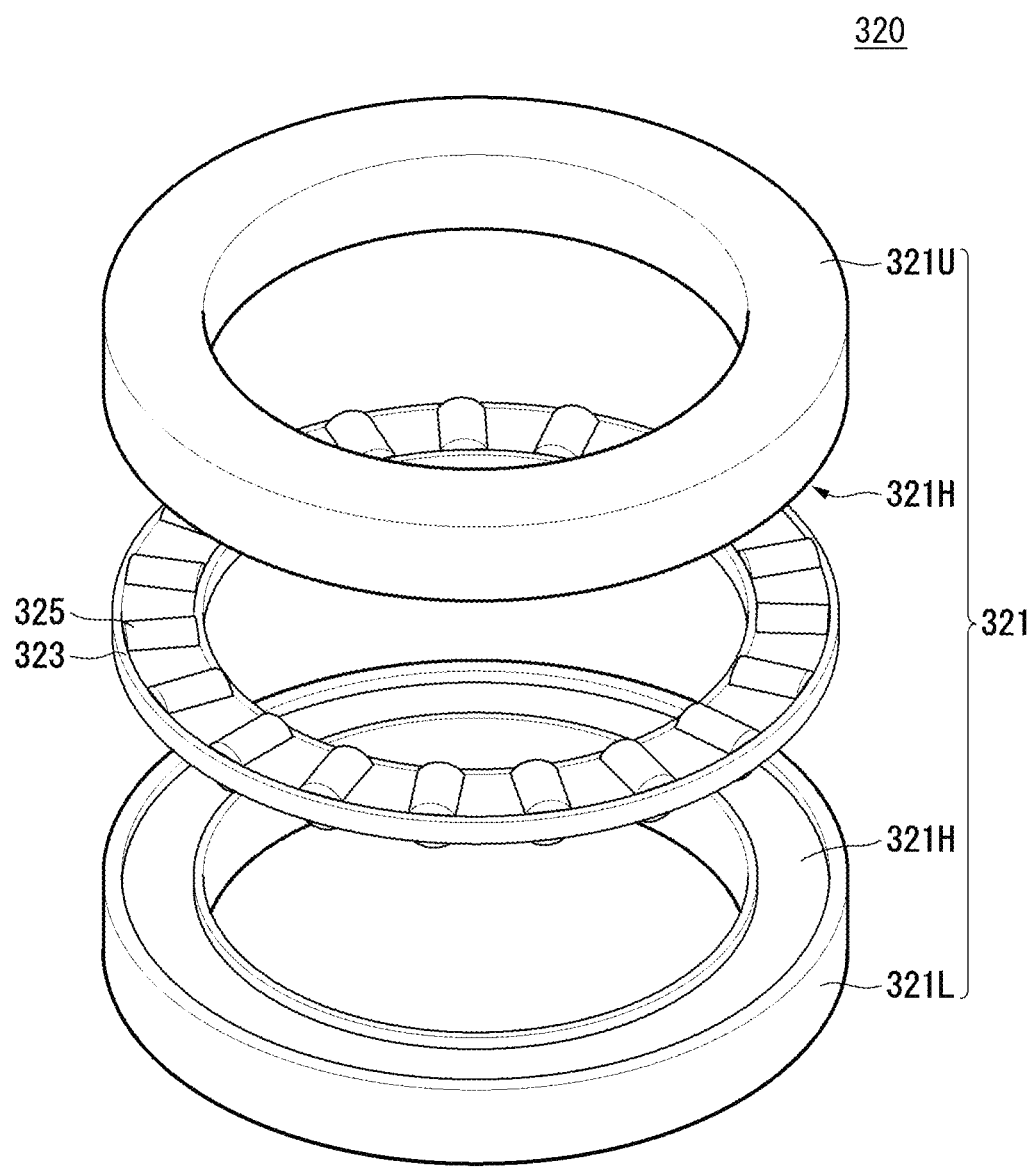

Referring to FIG. 43, the bearing 320 may include a housing 321, a rail 323, and a roller 325. The housing 321 may include an upper housing 321U and a lower housing 321L. The housing 321 may have an entirely circular shape. The housing 321 may have a donut shape.

The rail 323 may have a shape entirely corresponding to the shape of the housing 321. In this instance, a diameter of the rail 323 may be less than a diameter of the housing 321. An internal diameter of the rail 323 may be greater than an internal diameter of the housing 321, and an external diameter of the rail 323 may be less than an external diameter of the housing 321.

The roller 325 may be formed on the rail 323. The roller 325 may be inserted into a groove formed on the rail 323. A plurality of rollers 325 may be provided on the rail 323. The rail 323 may hold a distance between the plurality of rollers 325, an arrangement and a position of the plurality of rollers 325, and the like.

The lower housing 321L of the housing 321 may include a rolling groove 321H. The rolling groove 321H may be formed between an internal diameter and an external diameter of the lower housing 321L. The rolling groove 321H may be formed on an upper surface of the lower housing 321L. The upper housing 321U may include a rolling groove 321H on its lower surface.

The rail 323 and the plurality of rollers 325 may be positioned between the rolling groove 321H of the upper housing 321U and the rolling groove 321H of the lower housing 321L. The rail 323 and the plurality of rollers 325 may be interposed between the upper housing 321U and the lower housing 321L. The upper housing 321U may relatively rotate with respect to the lower housing 321L, or the lower housing 321L may relatively rotate with respect to the upper housing 321U.

The bearing 320 may be able to bear a relatively high weight. When the high weight is applied to the lower part of the connector 160 due to the display panels 110 and 130 and the frame 120, the bearing 320 having the above-described configuration may be advantageous.

Figure 44:
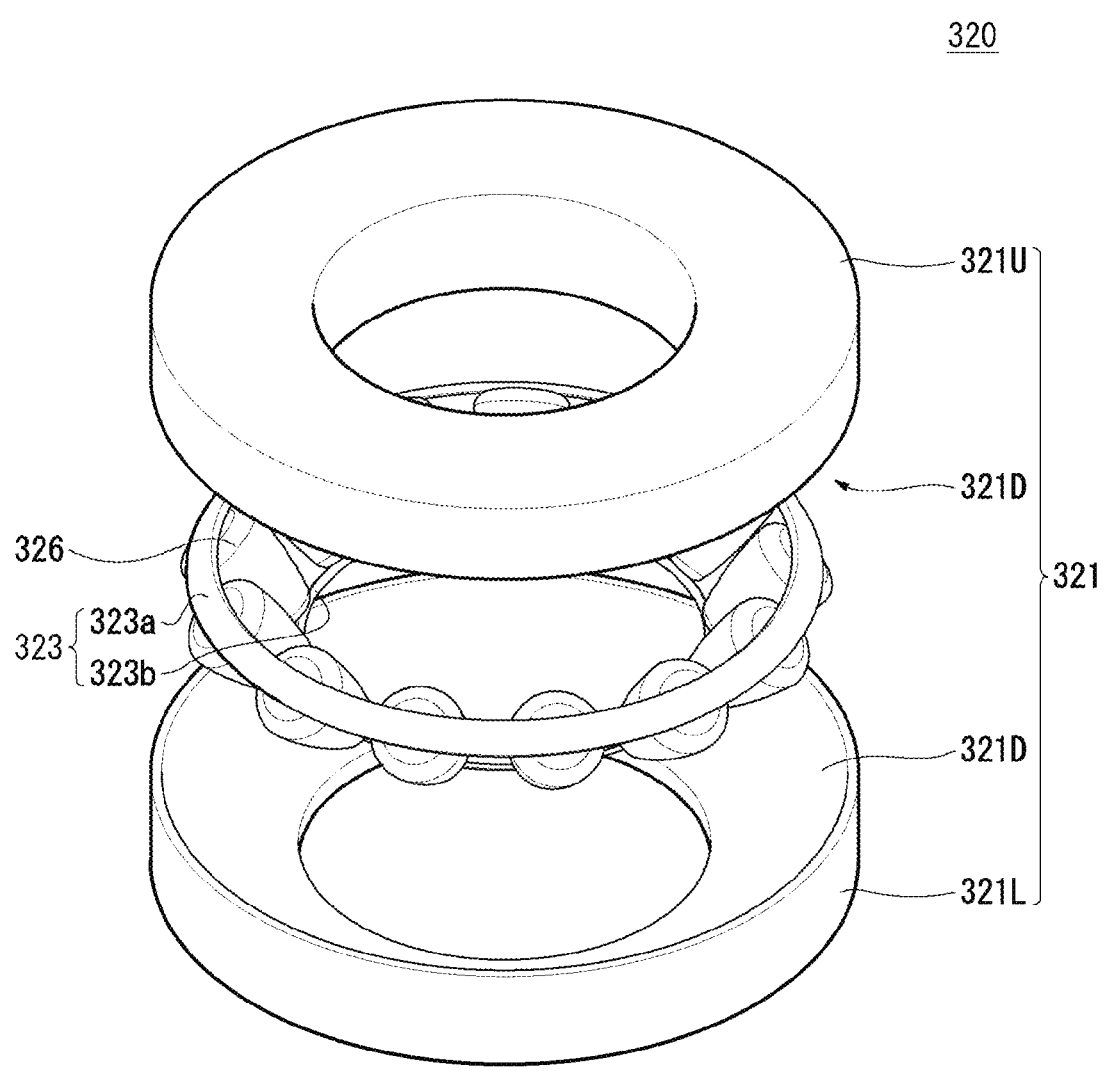

Referring to FIG. 44, the bearing 320 may include a housing 321, a rail 323, and a roller 326. The housing 321 may include an upper housing 321U and a lower housing 321L. The housing 321 may have an entirely circular shape. The housing 321 may have a donut shape.

The rail 323 may have a shape entirely corresponding to the shape of the housing 321. In this instance, a diameter of the rail 323 may be less than a diameter of the housing 321. In other words, an internal diameter of the rail 323 may be greater than an internal diameter of the housing 321, and an external diameter of the rail 323 may be less than an external diameter of the housing 321.

The rail 323 may include a first rail 323a and a second rail 323b. The first rail 323a and the second rail 323b may have different diameters. The first rail 323a and the second rail 323b may also be provided at different heights. A diameter of the second rail 323b may be less than a diameter of the first rail 323a. The second rail 323b may be positioned inside the first rail 323a. The second rail 323b may also be positioned under the first rail 323a. The first rail 323a and the second rail 323b may be placed on different planes. Hence, the first rail 323a and the second rail 323b may provide a slope for the roller 326.

The roller 326 may be inserted into a groove formed on the rail 323. A plurality of rollers 326 may be provided on the rail 323. The plurality of grooves formed on the rail 323 may hold a distance between the plurality of rollers 326, an arrangement and a position of the plurality of rollers 326, and the like. The roller 326 may be provided on an incline because of structural characteristics of the first rail 323a and the second rail 323b. The plurality of rollers 326 may be disposed to form entirely a funnel shape.

The lower housing 321L of the housing 321 may include a rolling groove 321D. The rolling groove 321D may be formed between an internal diameter and an external diameter of the lower housing 321L. The rolling groove 321D may be formed on an upper surface of the lower housing 321L. The rolling groove 321D may provide a slope for the upper surface of the lower housing 321L. The rolling groove 321D may entirely have a shape of an inner surface of a funnel. A diameter of the rolling groove 321D may increase as the rolling groove 321D goes from the internal diameter to the external diameter of the lower housing 321L.

The upper housing 321U of the housing 321 may include a rolling groove 321D. The rolling groove 321D may be formed between an internal diameter and an external diameter of the upper housing 321U. The rolling groove 321D may be formed on a lower surface of the upper housing 321U. The rolling groove 321D may provide a slope for the lower surface of the upper housing 321U. The rolling groove 321D may entirely have a shape of an outer surface of a funnel. A diameter of the rolling groove 321D may increase as the rolling groove 321D goes from the internal diameter to the external diameter of the upper housing 321U.

The rail 323 and the plurality of rollers 326 may be positioned between the rolling groove 321D of the upper housing 321U and the rolling groove 321D of the lower housing 321L. The rail 323 and the plurality of rollers 326 may be interposed between the upper housing 321U and the lower housing 321L. The upper housing 321U may relatively rotate with respect to the lower housing 321L, or the lower housing 321L may relatively rotate with respect to the upper housing 321U.

The bearing 320 may be able to bear a relatively high speed and a relatively high weight. When the connector 160 rotates at a high speed while the high weight is applied to the lower part of the connector 160 due to the display panels 110 and 130 and the frame 120, the bearing 320 having the above-described configuration may be advantageous.

Figure 45:
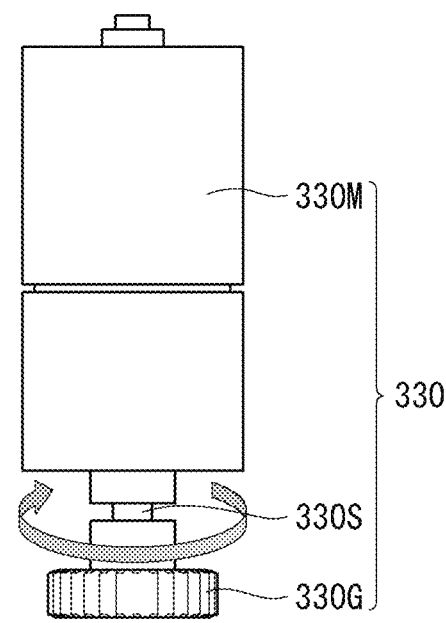
FIGS. 45 to 54 illustrate examples of an automatic rotation mechanism of a display device according to an embodiment.
Figure 45:
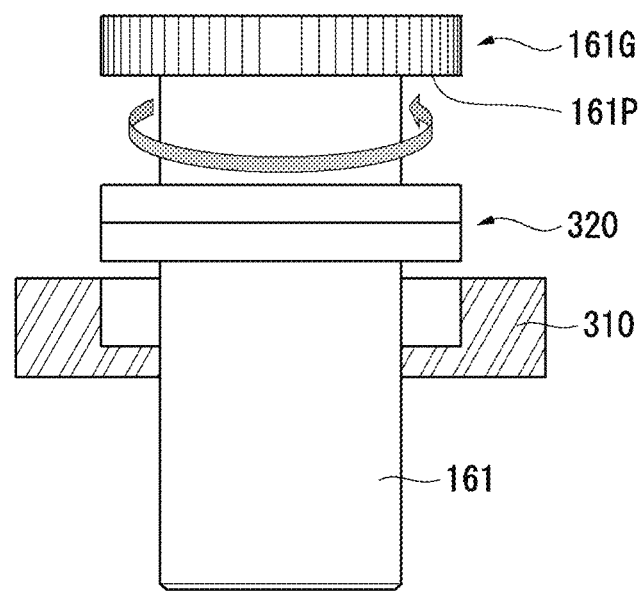

Referring to FIG. 45, a gear 161G may be formed on an outer circumference surface of the flange 161P of the pipe 161. The gear 161G may rotate the pipe 161 by a force transferred from the outside. The pipe 161 may rotate at the base 310 and may smoothly rotate as the bearing 320 is positioned between the pipe 161 and the base 310.

A driving unit (or drive) 330 may provide torque for the pipe 161. The driving unit 330 may rotate the pipe 161. The driving unit 330 may be positioned on one side of the pipe 161. The driving unit 330 may include a motor 330M, a shaft 330S, and a gear 330G. The gear 330G of the driving unit 330 may engage with the gear 161G of the pipe 161. When the motor 330M provides the torque for the shaft 330S and the gear 330G of the driving unit 330, the torque may be transferred to the gear 161G of the pipe 161 engaging with the gear 330G of the driving unit 330. Hence, the pipe 161 may rotate on the base 310. The driving unit 330 and the pipe 161 may be vertical, or may be parallel with each other.

The motor 330M may continuously provide the torque in a clockwise direction or a counterclockwise direction. Further, the motor 330M may alternately provide torque of the clockwise direction and torque of the counterclockwise direction. The direction of the torque may be changed by an external signal.

Figure 46:
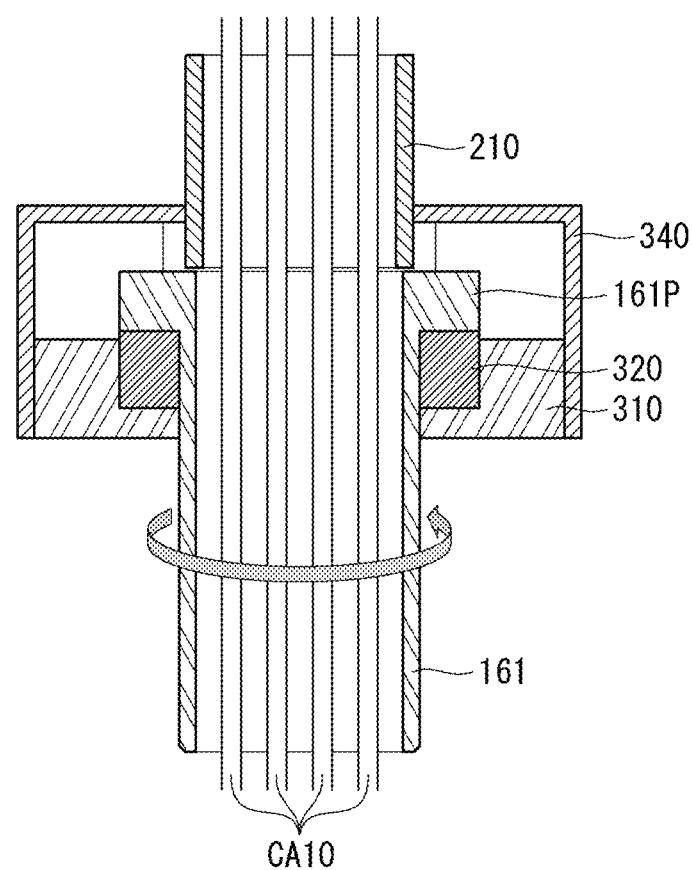

Referring to FIG. 46, the base 310 may be coupled with a housing 340. The base 310 may be fixed to the housing 340. The housing 340 may be coupled with the pipe 210 of the fixture 200. The housing 340 may be fixed to the pipe 210 of the fixture 200. Namely, the housing 340 may hang from the pipe 210 of the fixture 200, and the base 310 may hang from the housing 340. Further, the pipe 161 of the connector 160 may hang from the base 310. In this instance, the pipe 161 of the connector 160 may rotate on the base 310 or on the bearing 320.

The pipe 161 of the connector 160 may rotate on the base 310. In this instance, the pipe 210 of the fixture 200 may be fixed to the supporter 220 of the fixture 200 and may not rotate. Further, the cable CA10 may be embedded in the pipes 161 and 210. As the pipes 161 and 210 rotate, the cable CA10 may rotate. This is because one end of the cable CA10 may be fixed to the display panels 110 and 130 or the ceiling CL. A twist phenomenon of the cable CA10 may be solved by alternately providing the torque of the clockwise direction and the torque of the counterclockwise direction through the motor 330M.

Figure 47:
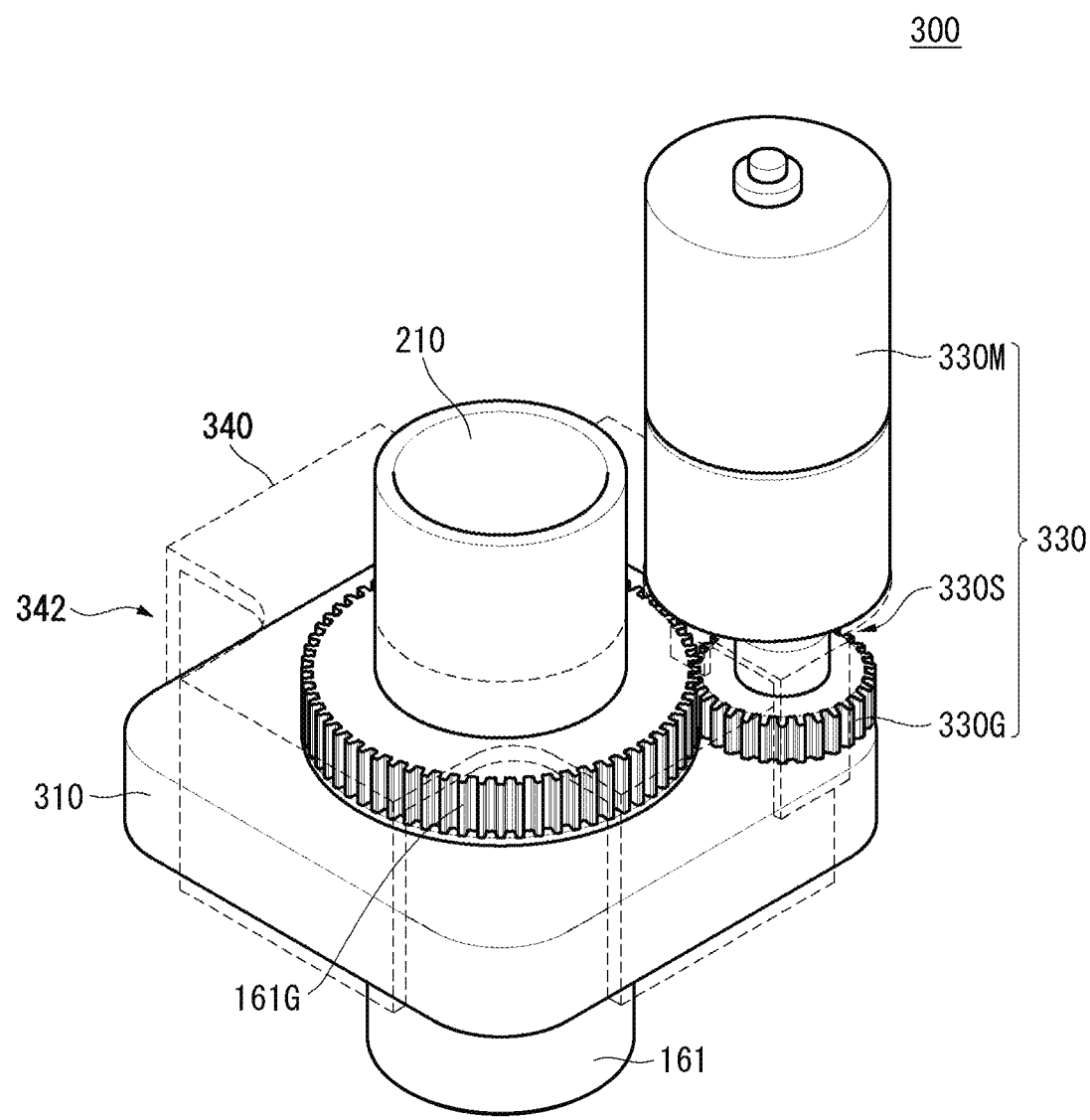

Referring to FIG. 47, a corner of the housing 340 may be opened. All or some of corners of the housing 340 may be opened. This may be referred to as an opening 342. The driving unit 330 may be positioned in the corner of the housing 340. A first portion of the driving unit 330 may be positioned outside the housing 340, and a second portion of the driving unit 330 may be positioned inside the housing 340. The driving unit 330 outside the housing 340 may provide a driving force for the gear 161G of the pipe 161 of the connector 160 positioned inside the housing 340. Hence, the motor 330M of the driving unit 330 may be easily repaired if the driving unit 330 malfunctions.

More specifically, the motor 330M may be installed outside the housing 340. The motor 330M outside the housing 340 may be fixed to the housing 340. In this instance, the shaft 330S may extend toward the inside of the housing 340. The shaft 330S of the motor 330M installed outside the housing 340 may extend toward the inside of the housing 340 or may be positioned inside the housing 342 through the opening 342. The gear 330G may be coupled with one end of the shaft 330S. The gear 330G of the driving unit 330 may engage with the gear 161G of the pipe 161.

The gear 161G of the connector 160 may be referred to as a first gear, and the gear 330G of the driving unit 330 may be referred to as a second gear. The first gear 161G may engage with the second gear 330G. The first gear 161G may receive torque through a rotation of the second gear 330G. A transfer of torque of the driving unit 330 based on a rotation of the first gear 161G is described below.

Figure 48:
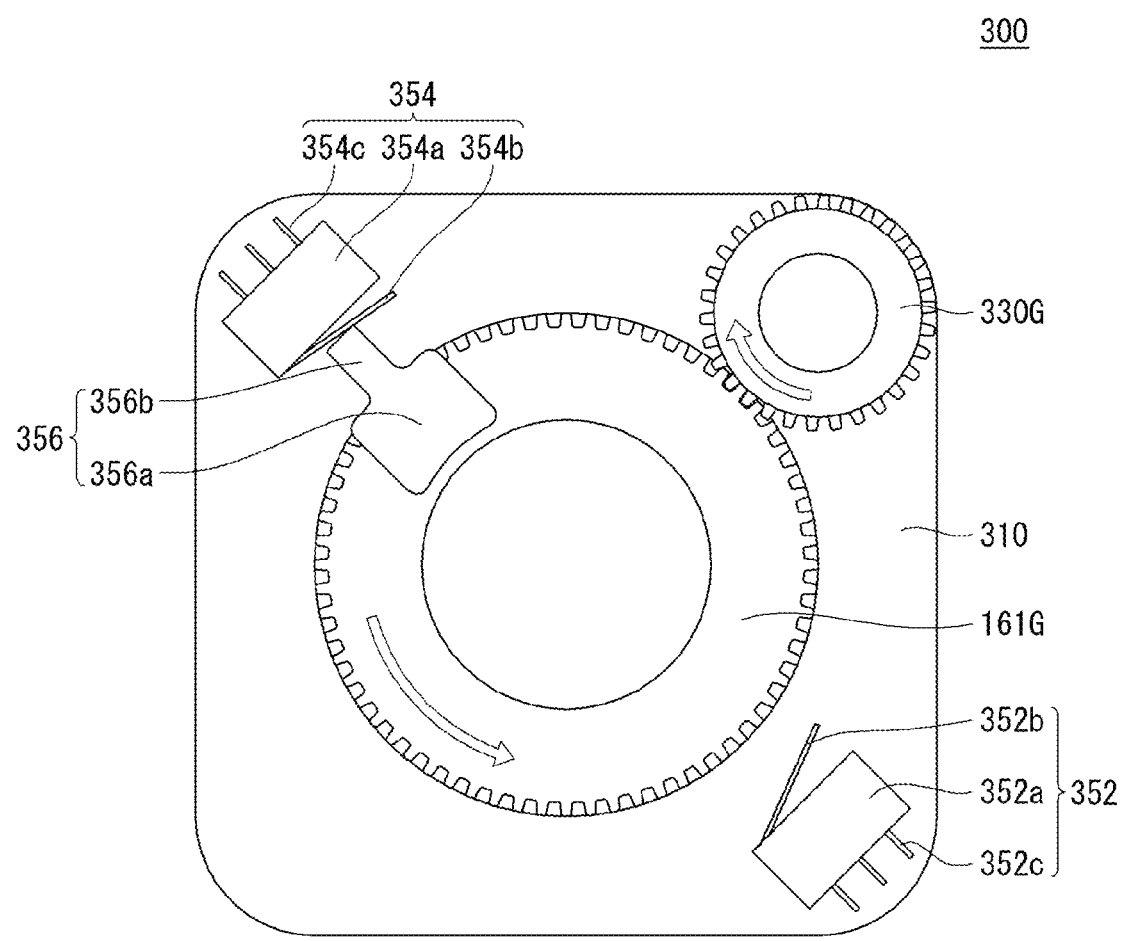

Referring to FIG. 48, switches 352 and 354 may be installed on the base 310. The plurality of switches 352 and 354 may be installed on the base 310. For example, the two switches 352 and 354 may be installed. The first switch 352 may face the second switch 354. The first switch 352 may be positioned opposite the second switch 354 with the first gear 161G interposed therebetween. The first gear 161G may be positioned between the first switch 352 and the second switch 354.

For example, the first switch 352 may make an angle of 180° with the second switch 354 with respect to the first gear 161G. In this instance, the angle made by the first switch 352 and the second switch 354 may be in a range of 180°. Alternatively, the angle made by the first switch 352 and the second switch 354 may be in a range of 180° or more. Namely, the angle made by the first switch 352 and the second switch 354 may be changed depending on a rotation degree of the display panels 110 and 130.

The first switch 352 may include a body 352a, an electrode 352c, and a lever 352b. The second switch 354 may include a body 354a, an electrode 354c, and a lever 354b. A description of the second switch 354 may be briefly made or may be entirely omitted. The lever 352b may be installed in the body 352a. The lever 352b may control a turn-on and a turn-off of the first switch 352. The electrode 352c may be electrically connected to a controller of the motor 330M or a power source of the motor 330M.

A rotor arm 356 may be fixed to the first gear 161G. The rotor arm 356 may be fixed to an upper surface of the first gear 161G and may rotate along with the first gear 161G. The rotor arm 356 may include a fixing portion 356a and a contact portion 356b. The fixing portion 356a may be coupled with or fixed to the upper surface of the first gear 161G. The contact portion 356b may extend from the fixing portion 356a. The contact portion 356b may extend toward the outside of an outer circumference surface of the first gear 161G. A length of the contact portion 356b may vary depending on a distance between the switches 352 and 354 and the fixing portion 356a.

Figure 49:
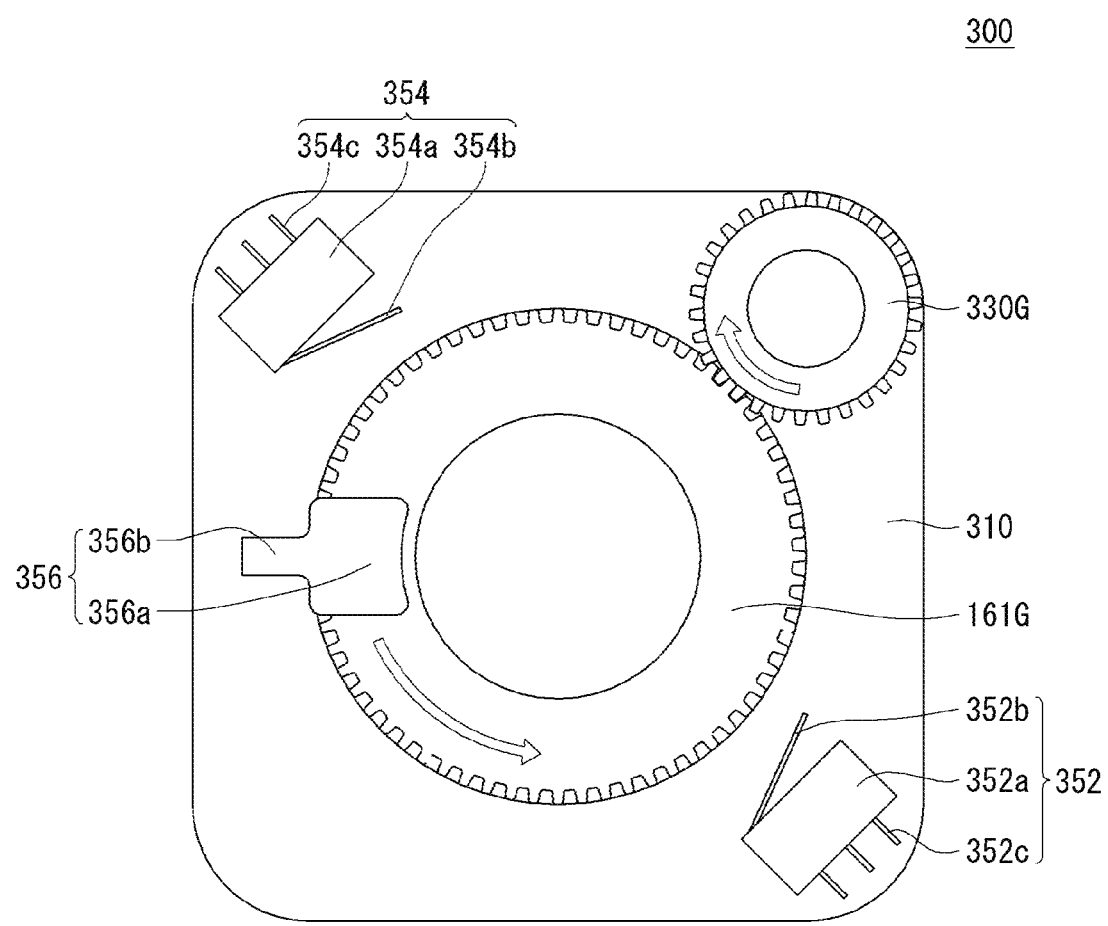
Figure 50:
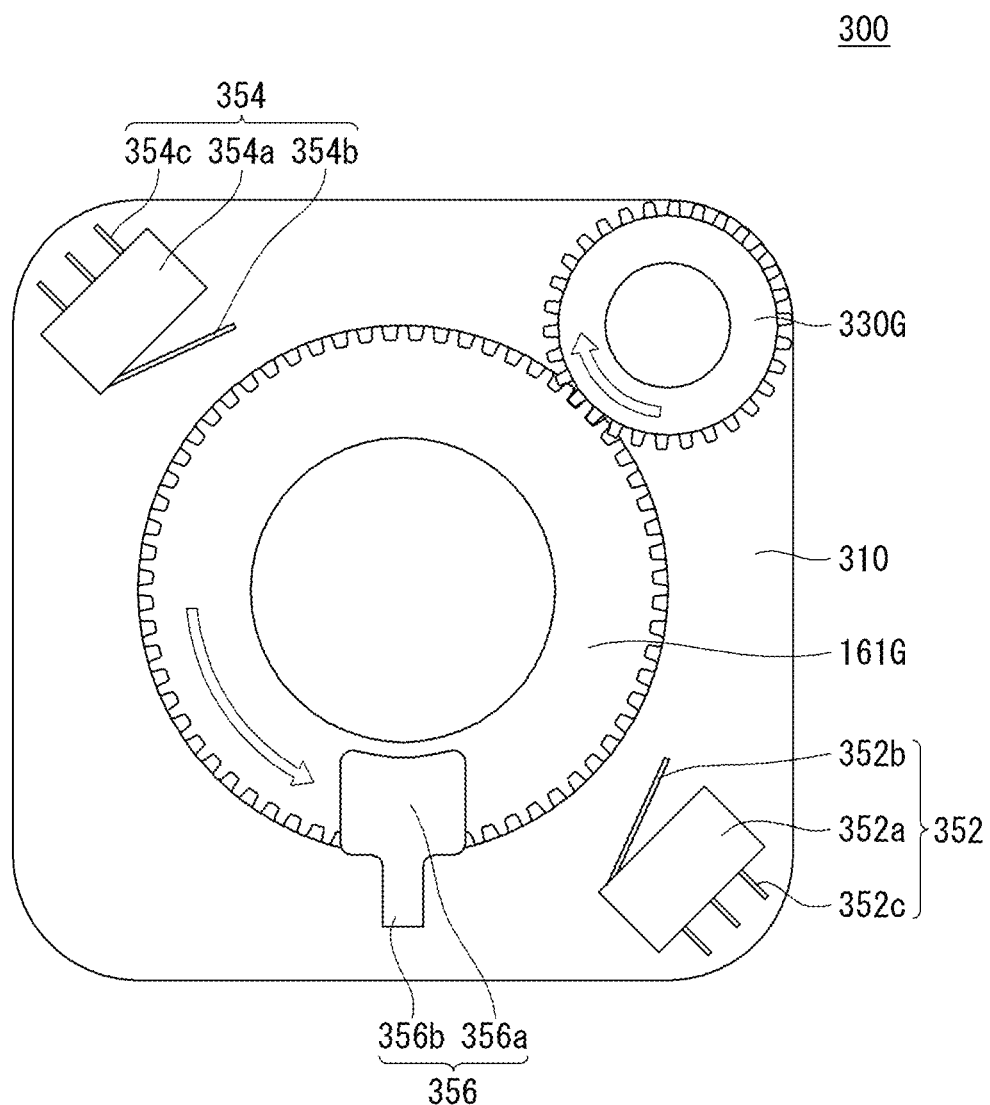

In FIG. 48, when the rotor arm 356 contacts the second switch 354, the second gear 330G may transfer torque of the clockwise direction to the first gear 161G. Hence, the first gear 161G may rotate in the counterclockwise direction. In FIG. 49, even after the first gear 161G is separated from the second switch 354, the second gear 330G may continuously maintain a rotation of the clockwise direction. Hence, the first gear 161G may continuously rotate in the counterclockwise direction. In FIG. 50, although the first gear 161G is away from the second switch 354 and is close to the first switch 352, the rotation of the second gear 330G in the clockwise direction and the rotation of the first gear 161G in the counterclockwise direction may be continuously performed.

Figure 51:
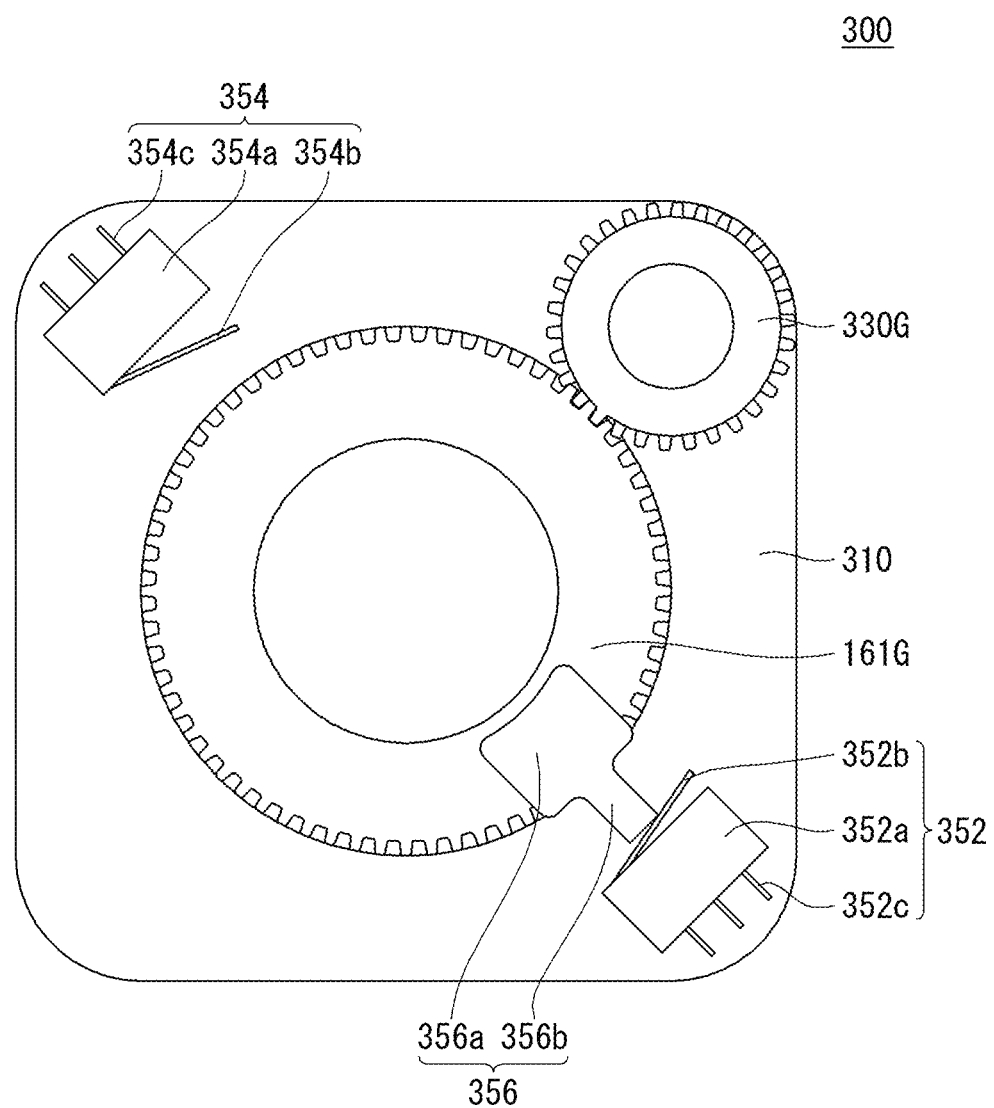

In FIG. 51, when the rotor arm 356 contacts the first switch 352, the second gear 330G may stop rotating in the clockwise direction. Hence, the first gear 161G may stop rotating in the counterclockwise direction. When the rotor arm 356 contacts the first switch 352, the second gear 330G may start to change from the rotation of the clockwise direction to the rotation of the counterclockwise direction. Thus, the first gear 161G may start to change from the rotation of the counterclockwise direction to the rotation of the clockwise direction. The rotor arm 356 may contact the first switch 352 or the second switch 354, and in that very same moment, the first gear 161G or the second gear 330G may stop a rotation which has been continuously performed, or may start to rotate in the opposite direction of the rotation which has been continuously performed.

Figure 52:
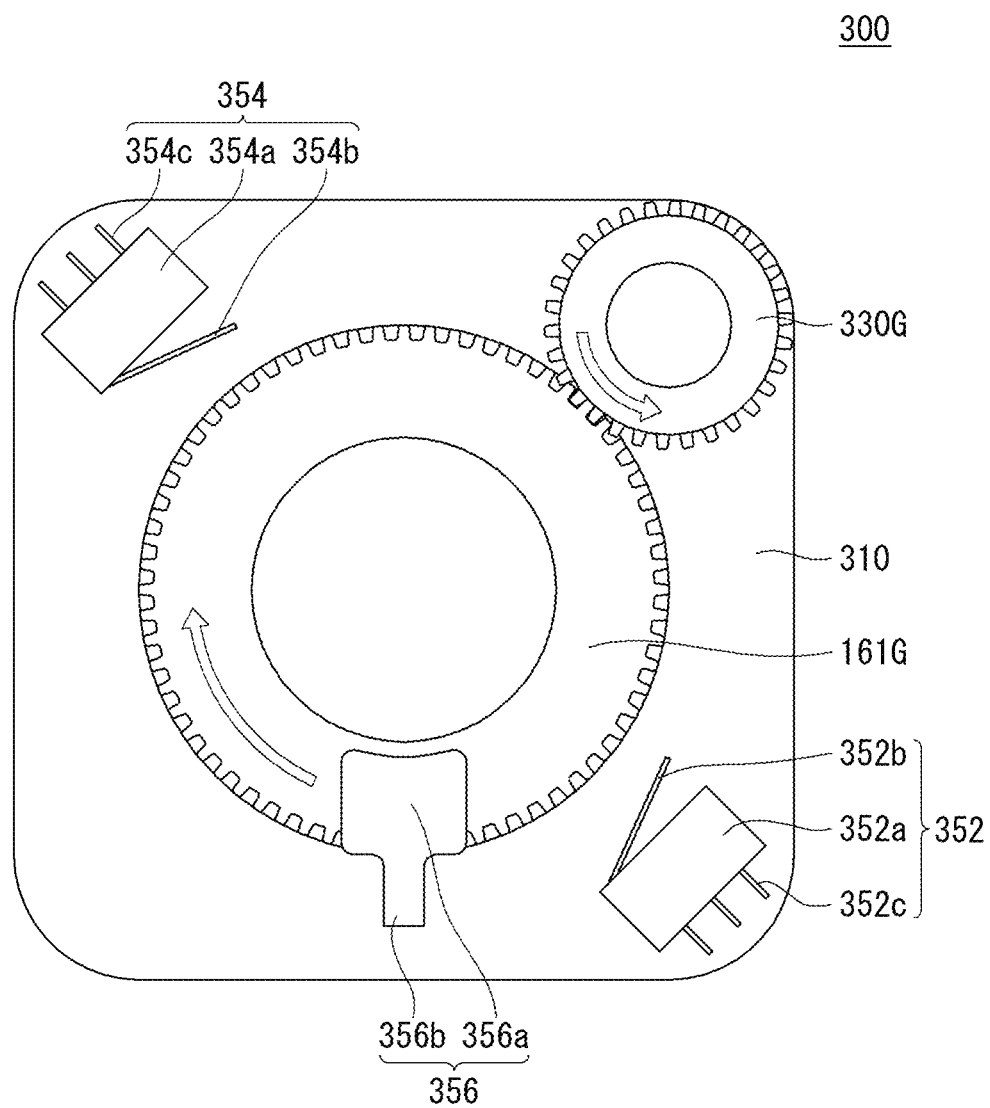
Figure 53:
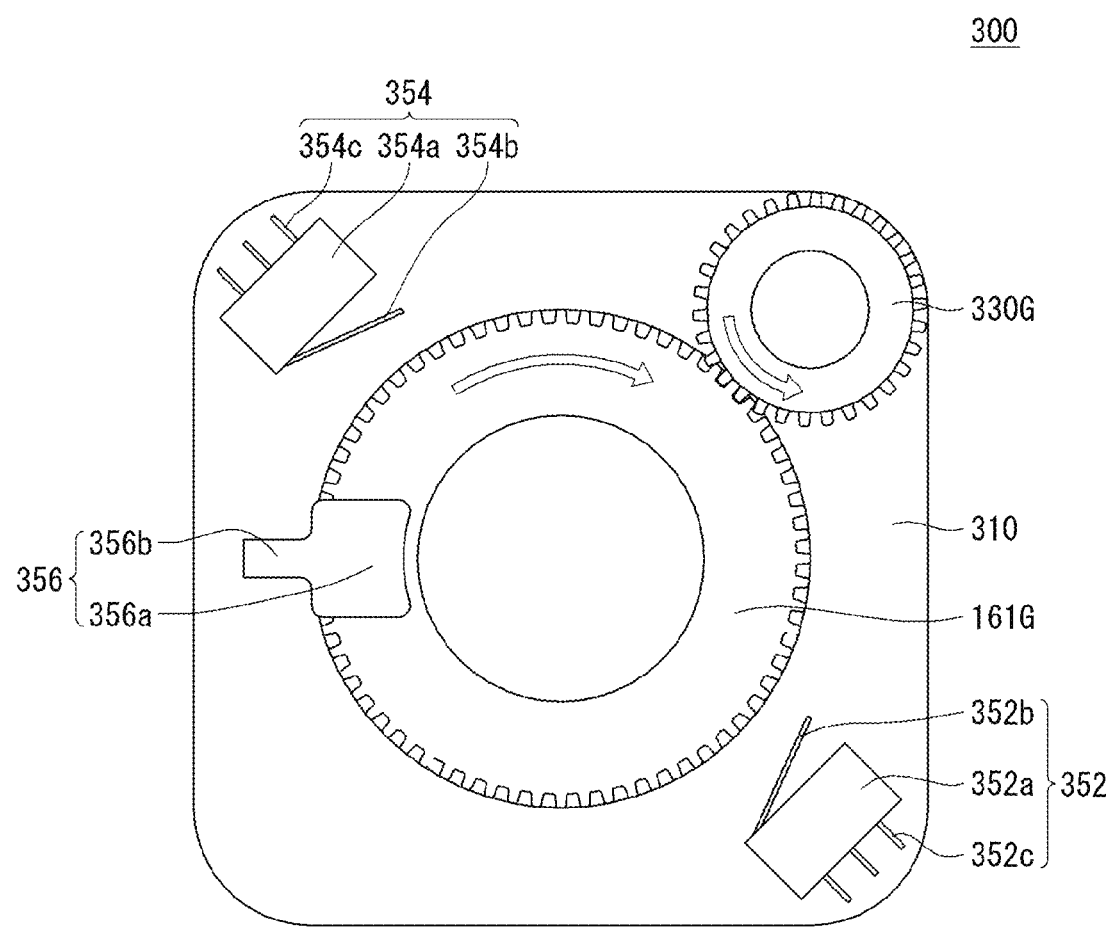

In FIG. 52, the second gear 330G may rotate in the counterclockwise direction, and the first gear 161G may rotate in the clockwise direction. In FIG. 53, a rotation of the first gear 161G in the clockwise direction may be continuously performed until the rotor arm 356 contacts the second switch 354.

Figure 54:
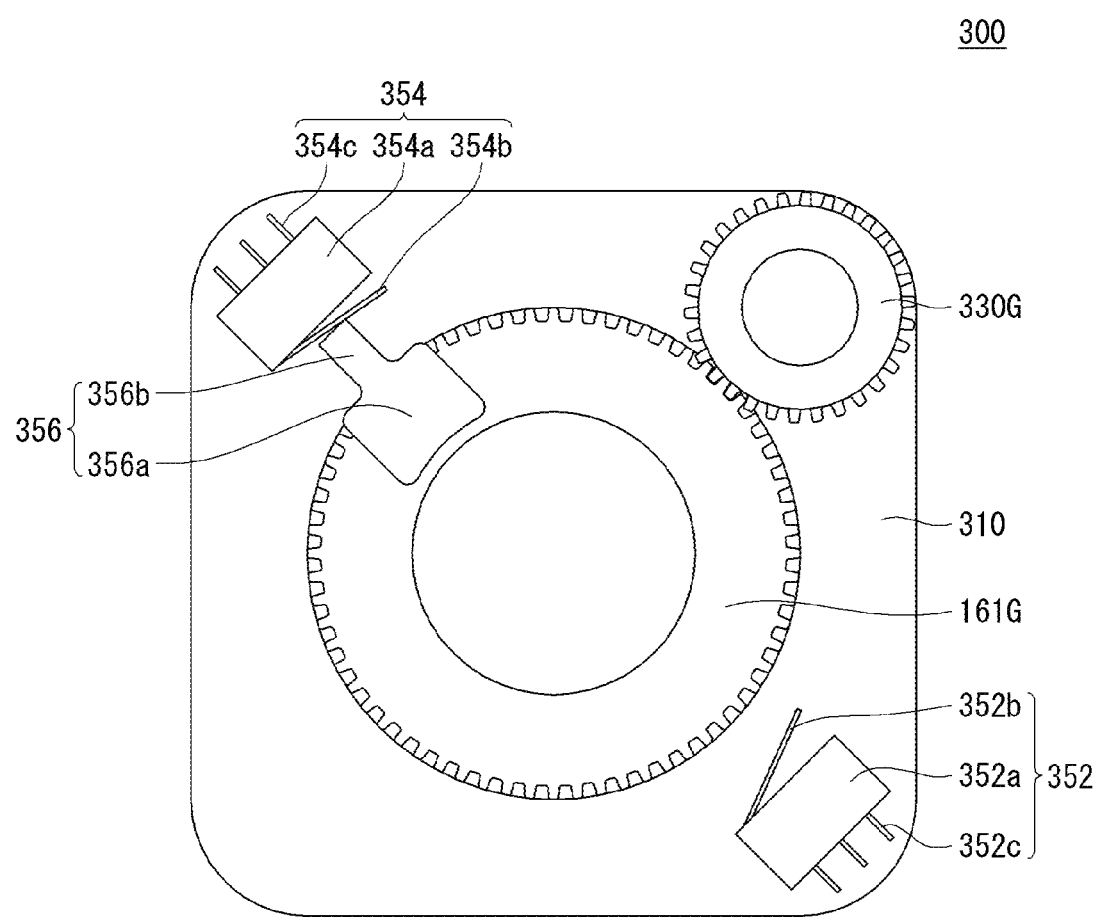

In FIG. 54, when the rotor arm 356 contacts the second switch 354, the second gear 330G may stop rotating in the counterclockwise direction, and the first gear 161G may stop rotating in the clockwise direction. When the rotor arm 356 contacts the second switch 354, the second gear 330G may start to change from the rotation of the counterclockwise direction to the rotation of the clockwise direction. Hence, the first gear 161G may start to change from the rotation of the clockwise direction to the rotation of the counterclockwise direction. The rotor arm 356 may contact the first switch 352 or the second switch 354, and in that very same moment, the first gear 161G or the second gear 330G may stop a rotation which has been continuously performed, or may start to rotate in the opposite direction of the rotation which has been continuously performed.

A rotation module 300 may be separated from the display device 100. The rotation module 300 may be coupled with and separated from the display device 100. A lower pipe 370 may be connected to the pipe 161 of the connector 160, and an upper pipe 380 may be connected to the pipe 210 of the fixture 200.

The upper pipe 380 may be separated in a state where the upper pipe 380 is screw-connected to the pipe 210 of the fixture 200. Also, the lower pipe 370 may be separated in a state where the lower pipe 370 is screw-connected to the pipe 161 of the connector 160.

Hereinafter, the lower pipe 370 may be referred to as a first pipe, and the upper pipe 380 may be referred to as a second pipe. The lower pipe 370 and the upper pipe 380 may be distinguished from the first pipe 161 or the second pipe 210.

Figure 55:
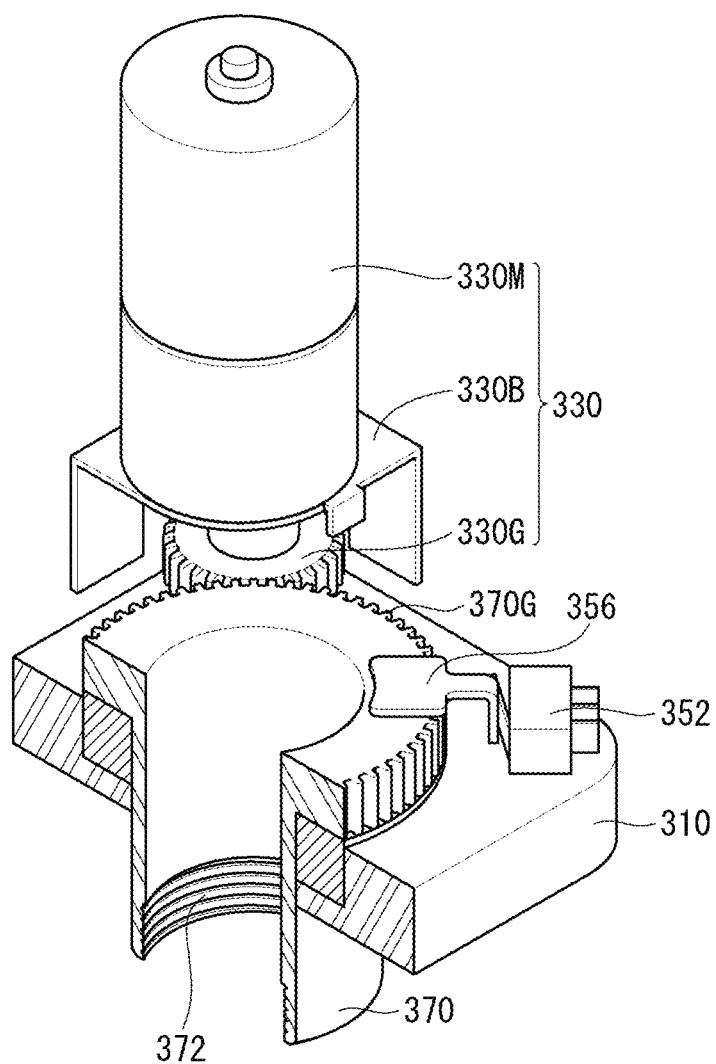
FIGS. 55 and 56 illustrate examples of a rotation module of a display device according to an embodiment.

Referring to FIG. 55, the lower pipe 370 may include a thread 372 on an inner circumference surface of the lower pipe 370. The pipe 161 of the connector 160 may include a thread 161n (refer to FIG. 59) on an outer circumference surface of the pipe 161 and thus may be coupled with the lower pipe 370.

Figure 56:
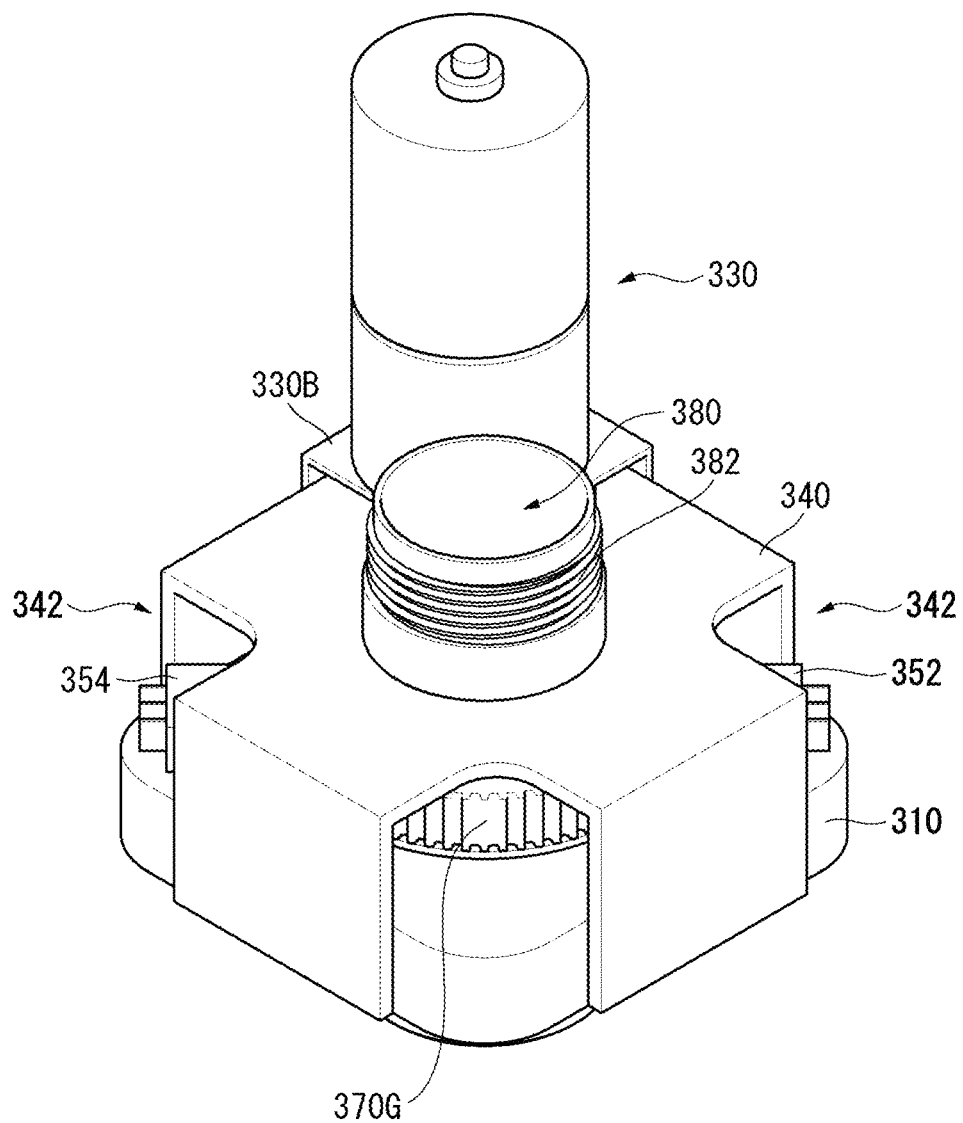

Referring to FIG. 56, the upper pipe 380 may include a thread 382 on an outer circumference surface of the upper pipe 380. The pipe 210 of the fixture 200 may include a thread 210n (refer to FIG. 59) on an inner circumference surface of the pipe 210 and thus may be coupled with the upper pipe 380.

Referring to FIGS. 55 and 56, the driving unit 330 may be coupled with a bracket 330B. The bracket 330B may be coupled with the housing 340. The bracket 330B may be interposed between the motor 330M and the gear 330G of the driving unit 330. The driving unit 330 may be positioned on one side of a corner of the housing 340. The bracket 330B may be fixed adjacent to the opening 342 of the housing 340.

The first switch 352 may be exposed to the outside through the opening 342 in one corner of the housing 340. The second switch 354 may be exposed to the outside through the opening 342 in one corner of the housing 340. The display device 100 may rotate in a range of 180° or rotate 360° depending on the electrical connection of the first switch 352 or the second switch 354. For example, when the first switch 352 is connected to the controller of the motor 330M, the display device 100 may rotate 360°. When the first and second switches 352 and 354 are connected to the controller of the motor 330M, the display device 100 may rotate in a range of 180°.

Figure 57:
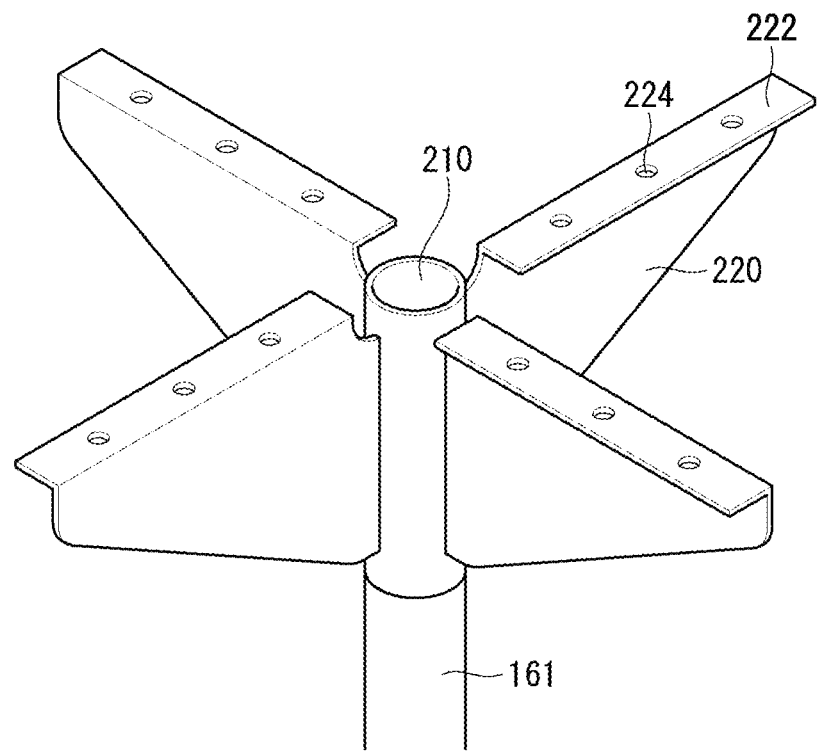
FIGS. 57 to 60 illustrate examples of connecting a rotation module to a display device according to an embodiment.

Referring to FIG. 57, the fixture 200 may include a fixing plate 222, so that the fixture 200 may be fixed to a portion of a building, a ceiling, etc. The fixing plate 222 may be connected to the supporter 220. The fixing plate 222 may include a coupling hole 224 and may be fixed to a portion of the building, the ceiling, etc. through the coupling hole 224 and a coupling member.

The fixture 200 may include four supporters 220, and the four supporters 220 may be coupled with the pipe 210 in four directions. The fixing plates 222 may be respectively formed on the tops of the supporters 220. The fixing plates 222 may provide a flat surface for the fixture 200. The flat surface provided by the fixing plates 222 may contact the ceiling, etc.

The pipe 161 of the connector 160 may be connected to the lower end of the pipe 210 of the fixture 200. The pipes 161 and 210 may be screw-coupled with each other. Namely, the screw-coupling may indicate that the pipe 161 of the connector 160 may be separated from the pipe 210 of the fixture 200.

Figure 58:
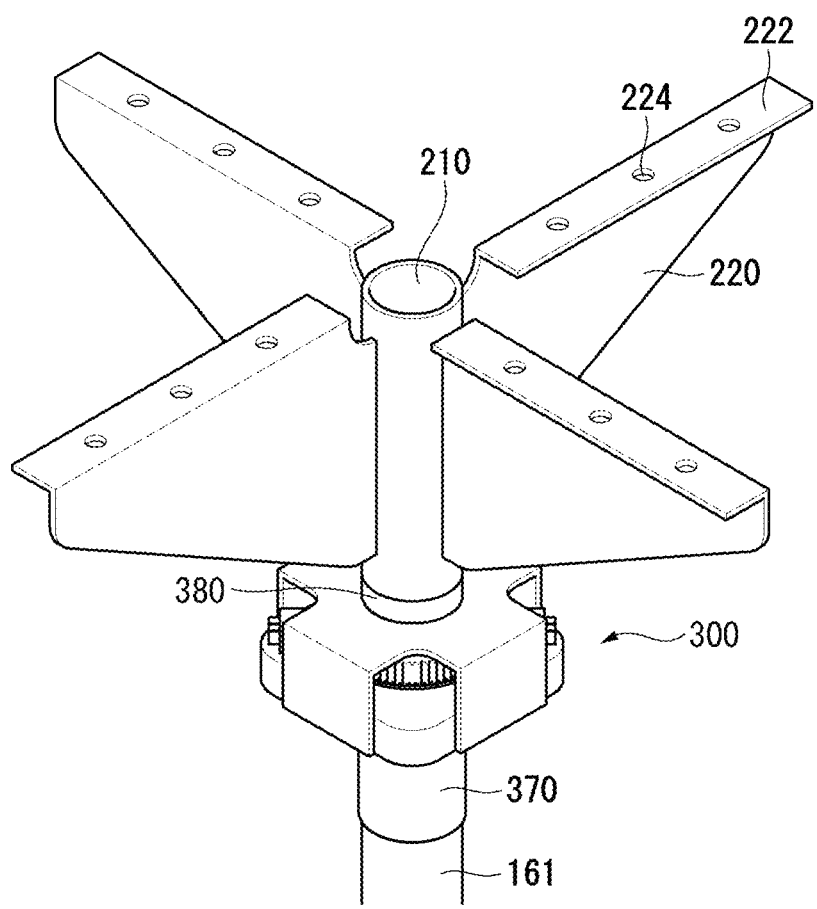

Referring to FIG. 58, the rotation module 300 may be interposed between the pipe 210 of the fixture 200 and the pipe 161 of the connector 160. The rotation module 300 may be coupled with the pipe 210 of the fixture 200, and the pipe 161 of the connector 160 may be coupled with the rotation module 300.

Figure 59:
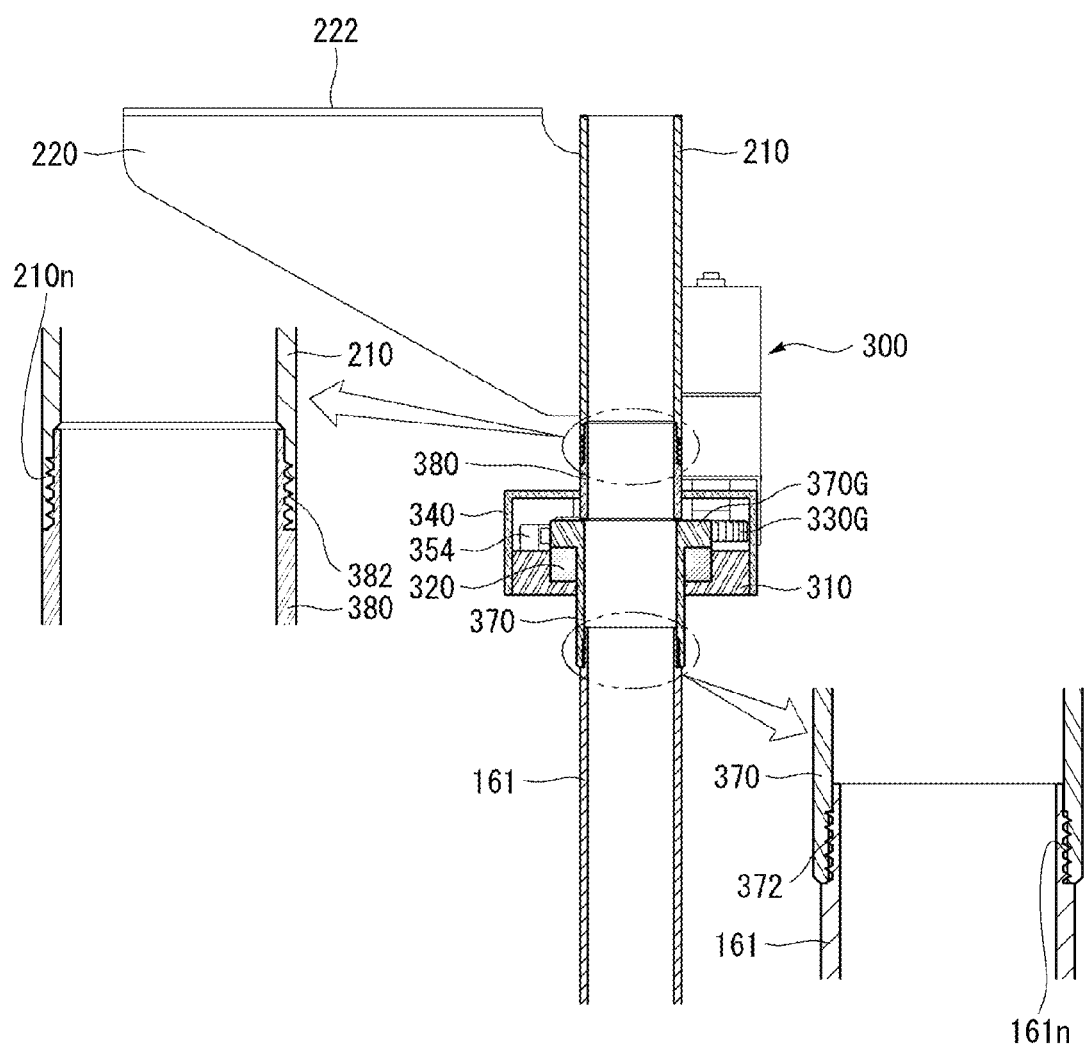

Referring to FIG. 59, the pipe 210 of the fixture 200 may include a female thread 210n. The female thread 210n may be formed on an inner circumference surface of the pipe 210 of the fixture 200. The upper pipe 380 may include a male thread 382. The male thread 382 may be formed on an outer circumference surface of the upper pipe 380.

The lower pipe 370 may include a female thread 372. The female thread 372 may be formed on an inner circumference surface of the lower pipe 370. The pipe 161 of the connector 160 may include a male thread 161n. The male thread 161n may be formed on an outer circumference surface of the pipe 161 of the connector 160.

In other words, the upper pipe 380 of the rotation module 300 may be screw-coupled with the pipe 210 of the fixture 200, and the pipe 161 of the connector 160 may be screw-coupled with the lower pipe 370 of the rotation module 300. Hence, when the rotation module 300 is removed, the pipe 161 of the connector 160 may be screw-coupled with the pipe 210 of the fixture 200. Namely, the rotation module 300 may be coupled with or separated from the display device 100, if necessary or desired.

Figure 60:
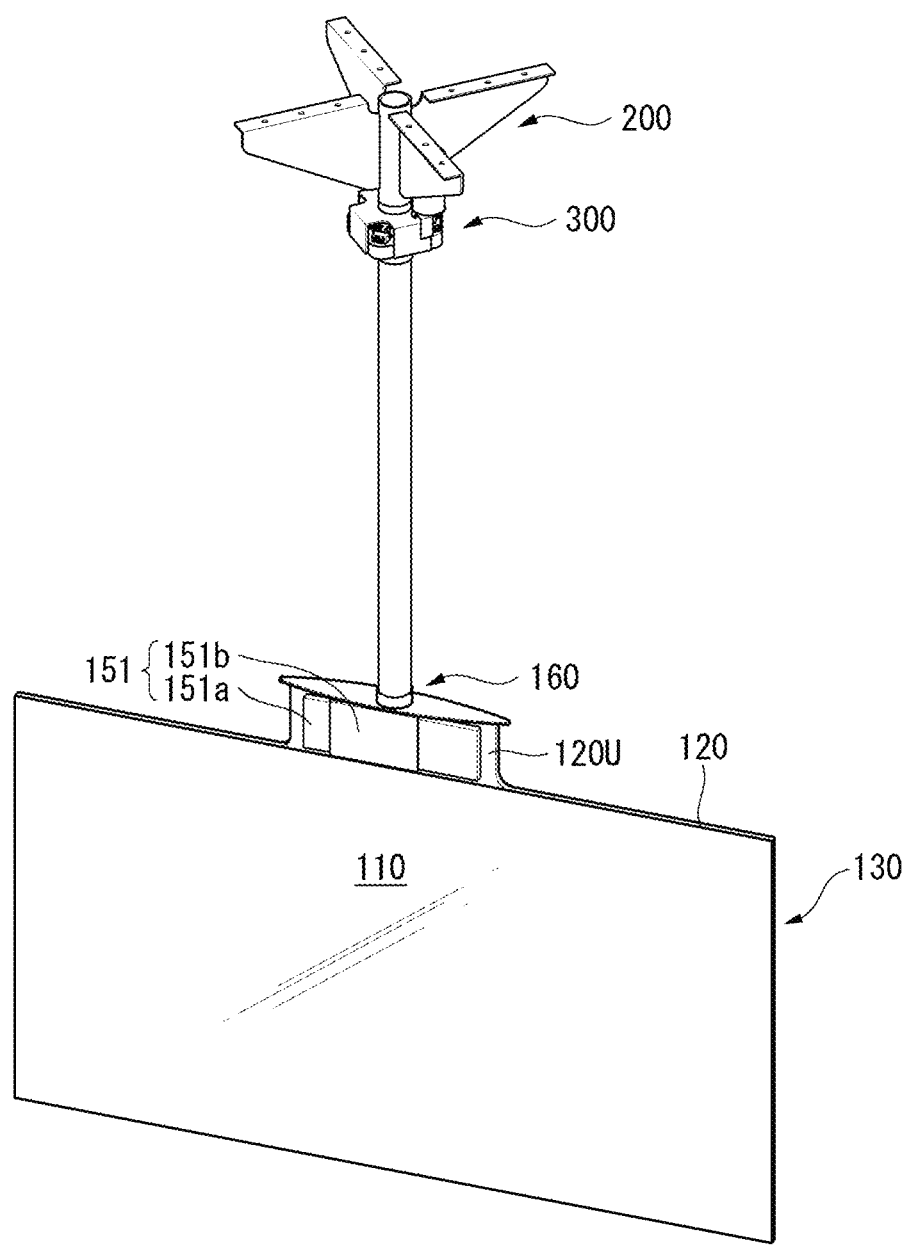

FIG. 60 illustrates that the rotation module 300 is coupled with the display device 100. The display device 100 may display an image in a fixed state and may display an image while rotating. The display device 100 has an advantage in simultaneously providing information for many viewers in a public place where many people can be gathered.

A display device may include a first long side LS1, a second long side LS2 opposite the first long side LS1, a first short side SS1 adjacent to one end of the first long side LS1 and one end of the second long side LS2, and a second short side SS2 opposite the first short side SS1. The first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

Lengths of the first and second long sides LS1 and LS2 may be longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

A first direction DR1 may be a direction parallel to the long sides LS1 and LS2 of the display device, and a second direction DR2 may be a direction parallel to the short sides SS1 and SS2 of the display device. A third direction DR3 may be a direction vertical to the first direction DR1 and/or the second direction DR2. The first direction DR1 and the second direction DR2 may be commonly referred to as a horizontal direction. Further, the third direction DR3 may be referred to as a vertical direction.

A side or a surface on which the display device displays an image, may be referred to as a front side or a front surface. When the display device displays the image, a side or a surface at which the image cannot be observed, may be referred to as a back side or a back surface. When the display device is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

Further, when the display device displays an image in two directions, a first direction may be a direction from the front side or the front surface of the display device. In this instance, when the display device displays an image in a second direction, the second direction may be a direction from the back side or the back surface of the display device.

Further, the first long side LS1, the second long side LS2, the first short side SS1, and the second short side SS2 may be referred to as edges of the display device. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

A direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

A display device may comprise a display panel, a frame positioned in a rear of the display panel and including an upper frame extended from an upper part of the display panel to the outside, an opening formed on the frame and positioned between the display panel and the frame, a printed circuit board (PCB) electrically connected to the display panel and positioned in the opening, and a controller electrically connected to the PCB, installed on the upper frame of the frame, and exposed to the outside. The opening may be positioned adjacent to an edge of the display panel.

The display device may further include a wire electrically connected to the display panel and extended from a side of the display panel, a PCB electrically connected to the wire and positioned in the opening, and a cable electrically connected to the PCB, placed between the display panel and the frame, and extended and exposed to an outside of the display panel. The display device may further include a controller installed on the frame and positioned on a side of the display panel. The cable may be electrically connected to the controller.

The display device may further include a coupling member positioned between the display panel and the frame, fixed to the frame, and contacting the display panel. The coupling member may have a magnetic body or an adhesive strength.

The display device may further include a first coupling member positioned between the display panel and the frame, fixed to a portion of a left side of the frame, and contacting the display panel and a second coupling member positioned between the display panel and the frame, fixed to a portion of a right side of the frame, and contacting the display panel. The cable may pass between the first coupling member and the second coupling member and may be extended and exposed to an outside of the display panel.

A display device may comprise a first display panel, a second display panel opposite the first display panel, a frame positioned between the first display panel and the second display panel, a first opening formed on the frame and positioned on a lower back side of the first display panel, a second opening formed on the frame and positioned on an upper back side of the second display panel, a first printed circuit board (PCB) electrically connected to the first display panel and positioned in the first opening, and a second PCB electrically connected to the second display panel and positioned in the second opening. The first opening may be positioned adjacent to a second long side of the first display panel, and the second opening may be positioned adjacent to a first long side of the second display panel.

The display device may further include a first wire electrically connected to the first display panel and extended from a second long side of the first display panel, a first PCB electrically connected to the first wire and positioned in the first opening, a first cable electrically connected to the first PCB, placed between the first display panel and the frame, and extended and exposed to an outside of the first display panel, a second wire electrically connected to the second display panel and extended from a first long side of the second display panel, a second PCB electrically connected to the second wire and positioned in the second opening, and a second cable electrically connected to the second PCB, placed between the second display panel and the frame, and extended and exposed to an outside of the second display panel.

The display device may further include a first controller installed on the frame, exposed to the outside, and positioned adjacent to an upper side of the first display panel and a second controller installed on the frame, exposed to the outside, and positioned adjacent to an upper side of the second display panel. The first cable may be electrically connected to the first controller, and the second cable may be electrically connected to the second controller.

The display device may further include a first coupling member positioned between the first display panel and the frame, fixed to the frame, and contacting the first display panel and a second coupling member positioned between the second display panel and the frame, fixed to the frame, and contacting the second display panel.

The display device may further include a first coupling member positioned between the first display panel and the frame, fixed to the frame, and contacting the first display panel and a second coupling member positioned between the second display panel and the frame, fixed to the frame, and contacting the second display panel. The first coupling member may be formed in a portion of a left side of the frame and a portion of a right side of the frame. The first cable may pass between the first coupling member and the second coupling member and may be exposed to an outside of the first display panel.

The frame may include an upper frame extended from an upper part of each of the first display panel and the second display panel to the outside. The first controller may be positioned on one surface of the upper frame, and the second controller may be positioned on the other surface of the upper frame. An area of the frame may be substantially equal to an area of the first display panel or an area of the second display panel.

A display device may comprise a first display panel, a second display panel opposite the first display panel, a frame positioned between the first display panel and the second display panel, a coupling body in which an inside is hollow, the coupling body being connected to an upper end of the frame, a first cable electrically connected to the first display panel or the second display panel and positioned inside the coupling body, a pipe in which an inside is hollow, a second cable positioned inside the pipe, a stopper fixed to an outside of the pipe, and a coupling ring caught on the stopper and coupled with the coupling body.

The first cable may be electrically connected to the second cable.

The display device may further include a first holder worn on an end of the coupling body and fixing the first cable and a second holder worn on an end of the pipe and fixing the second cable. The first cable or the second cable may be a plurality of first cables or a plurality of second cables, and the first holder or the second holder may be a plurality of first holders or a plurality of second holders.

The display device may further include a main controller positioned to be separated from the pipe and a sub-controller installed on the frame. The first cable may be electrically connected to the sub-controller, and the second cable may be electrically connected to the main controller.

The sub-controller may include a bridge unit distributing power or a signal provided by the main controller and a timing control unit controlling the first display panel or the second display panel depending on the power or the signal distributed by the bridge unit.

The display device may further include a first main controller positioned to be separated from the pipe, a first sub-controller installed on the frame and controlling an image displayed on the first display panel, a second main controller positioned to be separated from the pipe, and a second sub-controller installed on the frame and controlling an image displayed on the second display panel.

The frame may include an upper frame protruding and extending from an upper part of the first display panel or the second display panel. The first sub-controller may be positioned on one surface of the upper frame, and the second sub-controller may be positioned on the other surface of the upper frame.

When the coupling ring is worn on the coupling body, the first holder may face the second holder. The first cable may be electrically connected to the second cable while the first holder faces the second holder. The coupling ring may be screw-coupled with the coupling body.

A display device may comprise a first display panel, a second display panel opposite the first display panel, a frame positioned between the first display panel and the second display panel, a first pipe connected to an upper side of the frame, a second pipe positioned on an upper side of the first pipe, and a rotation module fixed to the second pipe, connected to the first pipe, and providing a torque for the first pipe. The first pipe may include a first gear formed on an outer surface of the upper side of the first pipe. The rotation module may include a second gear engaged with the first gear and a motor connected to the second gear.

The rotation module may include a base on which the first pipe rotates, a thrust bearing positioned between the first pipe and the base, and a housing coupled with the second pipe and the base and including an opening on a side of the housing. The motor may be installed outside the housing, the second gear may be positioned inside the housing, and the motor and the second gear may be connected through the opening.

The rotation module may include an upper pipe coupled with the second pipe, a lower pipe coupled with the first pipe, and a driving unit providing a torque for the lower pipe.

The rotation module may include a base on which the lower pipe rotates, a first gear formed on an outer surface of the lower pipe, a thrust bearing positioned between the lower pipe and the base, and a second gear engaged with the first gear. The driving unit may include a motor providing a torque for the second gear.

The rotation module may include a housing coupled with the upper pipe and the base and including an opening on a side of the housing, and the motor may be installed outside the housing and may rotate the second gear positioned inside the housing. The display device may further include a cable positioned inside the first and second pipes, in which the inside is hollow.

A display rotation module may comprise a base, a first pipe passing through the base and rotating on the base, a thrust bearing positioned between the base and the first pipe, a second pipe positioned on an upper side of the first pipe, a housing coupled with the second pipe and the base, and a driving unit providing a torque for the first pipe. The display rotation module may further include a first gear formed on an outer surface of the first pipe. The driving unit may include a second gear engaged with the first gear and a motor connected to the second gear.

The display rotation module may further include a switch formed outside the first pipe and positioned adjacent to the first pipe and a rotor arm fixed to the first pipe, extended to an outside of the first pipe, and contacting the switch depending on a rotation of the first pipe. The switch may be a plurality of switches, and the rotor arm may sequentially contact the plurality of switches depending on a rotation of the first pipe.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a frame having first and second sides, wherein a first recess is provided on the first side, and a second recess is provided on the second side;
   a first display panel provided on the first side;
   a second display panel provided on the second side;
   a first printed circuit board (PCB) electrically connected to the first display panel and positioned in the first recess;
   a second PCB electrically connected to the second display panel and positioned in the second recess;
   a first wire electrically connected to the first display panel and extending from a second long side of the first display panel, the first PCB electrically connected to the first wire;
   a first cable electrically connected to the first PCB, placed between the first display panel and the frame, and extending outside of the first display panel;
   a second wire electrically connected to the second display panel and extending from a first long side of the second display panel, the second PCB electrically connected to the second wire; and
   a second cable electrically connected to the second PCB, placed between the second display panel and the frame, and extending outside of the second display panel.

2. The display device of claim 1, wherein the first recess is positioned adjacent to a second long side of the first display panel, and wherein the second recess is positioned adjacent to a first long side of the second display panel.

3. The display device of claim 1, further including:
   a first controller installed on the frame, exposed to the outside, and positioned adjacent to an upper side of the first display panel; and
   a second controller installed on the frame, exposed to the outside, and positioned adjacent to an upper side of the second display panel, wherein the first cable is electrically connected to the first controller, and the second cable is electrically connected to the second controller.

4. The display device of claim 3, wherein the frame includes an upper frame extending from an upper part of each of the first display panel and the second display panel to the outside, wherein the first controller is positioned on one surface of the upper frame, and wherein the second controller is positioned on the other surface of the upper frame.

5. The display device of claim 1, further including:
   a first coupling member positioned between the first display panel and the frame, fixed to the frame, and contacting the first display panel; and
   a second coupling member positioned between the second display panel and the frame, fixed to the frame, and contacting the second display panel.

6. The display device of claim 1, further including:
   a first coupling member positioned between the first display panel and the frame, fixed to the frame, and contacting the first display panel; and
   a second coupling member positioned between the second display panel and the frame, fixed to the frame, and contacting the second display panel, wherein the first coupling member is formed in a portion of a left side of the frame and a portion of a right side of the frame, and wherein the first cable passes between the first coupling member and the second coupling member and is exposed to an outside of the first display panel.

7. The display device of claim 1, wherein an area of the frame is substantially equal to an area of the first display panel or an area of the second display panel.

8. The display device of claim 1, wherein the first and second recesses are formed as openings.

9. The display device of claim 1, wherein the first and second sides are opposite each other.

10. The display device of claim 1, wherein the first recess is positioned adjacent to a lower back side of the first display panel, and the second recess is positioned adjacent to an upper back side of the second display panel.

11. A display device comprising:
    a display panel;
    a frame positioned at a rear of the display panel and including an upper frame extending from an upper part of the display panel to an outside of the display panel;
    a recess formed in the frame and positioned between the display panel and the frame;
    a printed circuit board (PCB) electrically connected to the display panel and positioned in the recess;
    a controller electrically connected to the PCB, installed on the upper frame;
    a wire electrically connected to the display panel and extending from a side of the display panel, the PCB electrically connected to the wire; and a cable electrically connected to the PCB, placed between the display panel and the frame, and extending outside of the display panel.

12. The display device of claim 11, wherein the recess is positioned adjacent to an edge of the display panel.

13. The display device of claim 11, wherein the controller is exposed to the outside of the display panel.

14. The display device of claim 11, wherein the cable is electrically connected to the controller.

15. The display device of claim 11, further including a coupling member positioned between the display panel and the frame, fixed to the frame, and contacting the display panel.

16. The display device of claim 15, wherein the coupling member has a magnetic body or an adhesive strength.

17. The display device of claim 11, further including:
a first coupling member positioned between the display panel and the frame, fixed to a portion of a left side of the frame, and contacting the display panel; and
a second coupling member positioned between the display panel and the frame, fixed to a portion of a right side of the frame, and contacting the display panel,
wherein the cable passes between the first coupling member and the second coupling member and extends to an outside of the display panel.

18. The display device of claim 11, wherein the recess is formed as an opening.

* * * * *